US012751119B2

(12) United States Patent
Park et al.

(10) Patent No.: US 12,751,119 B2
(45) Date of Patent: Sep. 29, 2026

(54) DISPLAY DEVICE AND METHOD OF FABRICATING THE SAME

(71) Applicant: Samsung Display Co., LTD., Yongin-si (KR)

(72) Inventors: Sung Kook Park, Suwon-si (KR); Min Woo Kim, Hwaseong-si (KR); Sung Eun Baek, Suwon-si (KR); Jin Woo Choi, Seoul (KR); Hae Yun Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 646 days.

(21) Appl. No.: 17/661,885

(22) Filed: May 3, 2022

(65) Prior Publication Data

US 2023/0051074 A1 Feb. 16, 2023

(30) Foreign Application Priority Data

Aug. 10, 2021 (KR) ........................ 10-2021-0105685

(51) Int. Cl.
*H10H 20/857* (2025.01)
*H10H 20/01* (2025.01)
(Continued)

(52) U.S. Cl.
CPC .......... *H10H 20/857* (2025.01); *H10H 20/01* (2025.01); *H10H 20/8316* (2025.01);
(Continued)

(58) Field of Classification Search
None
See application file for complete search history.

(56) References Cited

U.S. PATENT DOCUMENTS

| | | | | |
|---|---|---|---|---|
| 11,723,238 | B2 | 8/2023 | Kim et al. | |
| 2014/0267683 | A1* | 9/2014 | Bibl ....................... | G09G 3/006 348/87 |

(Continued)

FOREIGN PATENT DOCUMENTS

| | | | |
|---|---|---|---|
| CN | 113054066 | A | 6/2021 |
| JP | 2021-082687 | A | 5/2021 |

(Continued)

*Primary Examiner* — Sue A Purvis
*Assistant Examiner* — Jordan M Klein
(74) *Attorney, Agent, or Firm* — Womble Bond Dickinson (US) LLP

(57) ABSTRACT

A display device and a method of fabricating the same is provided. A display device includes first and second pixel circuit units spaced apart from each other, a first pixel electrode on the first pixel circuit unit, a second pixel electrode on the second pixel circuit unit, a first light-emitting element electrically connected to the first pixel electrode, and for emitting first light, a second light-emitting element electrically connected to the second pixel electrode, and for emitting second light, a first pixel connecting electrode between the first pixel electrode and the first light-emitting element, and a second pixel connecting electrode between the second pixel electrode and the second light-emitting element, wherein the first pixel electrode overlaps with the first light-emitting element, and wherein the second pixel electrode does not overlap with the second light-emitting element.

19 Claims, 39 Drawing Sheets

(51) Int. Cl.
*H10H 20/831* (2025.01)
*H10H 29/14* (2025.01)

(52) U.S. Cl.
CPC ......... *H10H 29/142* (2025.01); *H10H 20/032* (2025.01); *H10H 20/0364* (2025.01)

(56) References Cited

U.S. PATENT DOCUMENTS

| | | | | |
|---|---|---|---|---|
| 2014/0367633 | A1* | 12/2014 | Bibl | H10H 20/851 257/13 |
| 2023/0337480 | A1 | 10/2023 | Kim et al. | |
| 2024/0206270 | A1* | 6/2024 | Wang | H10K 59/1201 |

FOREIGN PATENT DOCUMENTS

| | | | |
|---|---|---|---|
| KR | 2018-0118488 | A | 10/2018 |
| KR | 2020-0079817 | A | 7/2020 |
| KR | 20210010716 | A | 1/2021 |

* cited by examiner

DISPLAY DEVICE AND METHOD OF FABRICATING THE SAME

CROSS-REFERENCE TO RELATED APPLICATION

This application claims priority to, and the benefit of, Korean Patent Application No. 10-2021-0105685 filed on Aug. 10, 2021, in the Korean Intellectual Property Office (KIPO), the entire content of which is incorporated by reference herein.

BACKGROUND

1. Field

The present disclosure relates to a display device and a method of fabricating the same.

2. Description of the Related Art

As the information society has developed, the demand for display devices for displaying images has diversified. Here, the display devices may be flat panel display devices such as a liquid crystal display (LCD) device, a field emission display (FED) device, or a light-emitting display device, and the light-emitting display device may be one of an organic light-emitting display device including organic light-emitting diodes (OLEDs) as light-emitting elements, an inorganic light-emitting display device including inorganic semiconductor elements as light-emitting elements, and a microscopic light-emitting diode (microLED) display device including microLEDs as light-emitting elements.

Meanwhile, head-mounted displays (HMDs) equipped with light-emitting display devices have been developed. HMDs are devices that can be worn like glasses or a helmet and forms a focus at a close distance from the eyes of a user for providing virtual reality (VR) or augmented reality (AR). A high-resolution microLED display panel including microLEDs can be applied to an HMD.

SUMMARY

Aspects of embodiments of the present disclosure provide a display device in which light-emitting elements can be arranged without regard to the layout of pixel electrodes of a semiconductor circuit board, and provide a method of fabricating the display device.

However, embodiments of the present disclosure are not limited to those set forth herein. The above and other embodiments of the present disclosure will become more apparent to one of ordinary skill in the art to which the present disclosure pertains by referencing the detailed description of the present disclosure given below.

According to one or more embodiments of the present disclosure, there is provided a display device including first and second pixel circuit units spaced apart from each other, a first pixel electrode on the first pixel circuit unit, a second pixel electrode on the second pixel circuit unit, a first light-emitting element electrically connected to the first pixel electrode, and for emitting first light, a second light-emitting element electrically connected to the second pixel electrode, and for emitting second light, a first pixel connecting electrode between the first pixel electrode and the first light-emitting element, and a second pixel connecting electrode between the second pixel electrode and the second light-emitting element, wherein the first pixel electrode overlaps with the first light-emitting element, and wherein the second pixel electrode does not overlap with the second light-emitting element.

A length of the second pixel connecting electrode may be greater than a length of the first pixel connecting electrode.

The first pixel connecting electrode may include a first sub-pixel connecting electrode in a first contact hole penetrating a first insulating film, and connected to the first pixel electrode, and a second sub-pixel connecting electrode on the first sub-pixel connecting electrode, and in a second contact hole penetrating a second insulating film on the first insulating film.

The first sub-pixel connecting electrode and the second sub-pixel connecting electrode may overlap with the first light-emitting element.

The second pixel connecting electrode may include a first sub-pixel connecting electrode in a first contact hole penetrating a first insulating film, and connected to the second pixel electrode, and a second sub-pixel connecting electrode on the first sub-pixel connecting electrode, and in a second contact hole penetrating a second insulating film on the first insulating film.

A portion of the first sub-pixel connecting electrode might not overlap with the second light-emitting element, wherein a portion of the second sub-pixel connecting electrode overlaps with the second light-emitting element.

The display device may further include a step compensation layer on the second insulating film, and including a same material as the second sub-pixel connecting electrode.

The display device may further include a partition walls on the step compensation layer, and defining a first emission area in which the first light-emitting element is located, and a second emission area in which the second light-emitting element is located.

The display device may further include a connecting metal layer between the step compensation layer and the partition walls, an insulating film between the connecting metal layer and the partition walls, and a connecting electrode between the first light-emitting element and the second sub-pixel connecting electrode.

A thickness of the connecting electrode may be greater than a thickness of the connecting metal layer.

The display device may further include a common electrode on the first and second light-emitting elements, a common voltage electrode on at least one of the first and second pixel circuit units, and configured to receive a common voltage, and a common connecting electrode between the common voltage electrode and the common electrode.

The common connecting electrode may include a first sub-common connecting electrode in a first contact hole penetrating a first insulating film, and connected to the common voltage electrode, and a second sub-common connecting electrode on the first sub-common connecting electrode, and in a second contact hole penetrating a second insulating film on the first insulating film.

The common connecting electrode might not overlap with the first and second light-emitting elements.

The display device may further include a partition wall on the second sub-common connecting electrode, and at least partially defining a first emission area in which the first light-emitting element is located, and a second emission area in which the second light-emitting element is located, and a connecting metal layer between the partition wall and the second sub-common connecting electrode.

A horizontal width of the connecting metal layer may be less than a horizontal width of the second sub-common connecting electrode.

The common electrode may be in contact with part of a top surface of the second sub-common connecting electrode not covered by the connecting metal layer.

According to one or more embodiments of the present disclosure, there is provided a display device including first and second pixel circuit units spaced apart from each other, a first pixel electrode on the first pixel circuit unit, a second pixel electrode on the second pixel circuit unit, a first light-emitting element electrically connected to the first pixel electrode, and configured to emit first light, a second light-emitting element electrically connected to the second pixel electrode, and configured to emit second light, a common electrode on the first and second light-emitting elements, a common voltage electrode on at least one of the first and second pixel circuit units, and configured to receive a common voltage, and a common connecting electrode between the common voltage electrode and the common electrode.

The common connecting electrode may include a first sub-common connecting electrode in a first contact hole penetrating a first insulating film, and connected to the common voltage electrode, and a second sub-common connecting electrode on the first sub-common connecting electrode, and in a second contact hole penetrating a second insulating film on the first insulating film.

The common connecting electrode might not overlap with the first and second light-emitting elements.

According to one or more embodiments of the present disclosure, there is provided a method of fabricating a display device, the method including forming a first insulating film on pixel electrodes and common voltage electrodes of a semiconductor circuit board, forming first contact holes through the first insulating film to expose the pixel electrodes and the common voltage electrodes, forming first sub-connecting electrodes in the first contact holes, forming a second insulating film on the first sub-connecting electrodes, forming second contact holes through the second insulating film to expose the first sub-connecting electrodes, forming second sub-connecting electrodes in the second contact holes, forming first connecting electrode layers on light-emitting elements and partition walls of a light-emitting element substrate, forming second connecting electrode layers on the second sub-connecting electrodes, and bonding the first connecting electrode layers and the second connecting electrode layers by melting the first connecting electrode layers and the second connecting electrode layers.

According to the aforementioned and other embodiments of the present disclosure, pixel connecting electrodes are provided, and connect light-emitting elements and pixel electrodes. Accordingly, the light-emitting elements and the pixel electrodes can be properly connected by the pixel connecting electrodes, even if the light-emitting elements and the pixel electrodes do not overlap. Thus, the light-emitting elements can be arranged without regard to the layout of the pixel electrodes of a semiconductor circuit board.

BRIEF DESCRIPTION OF THE DRAWINGS

The above and other aspects of the present disclosure will become more apparent by describing embodiments thereof with reference to the attached drawings, in which.

DETAILED DESCRIPTION

Figure 1:
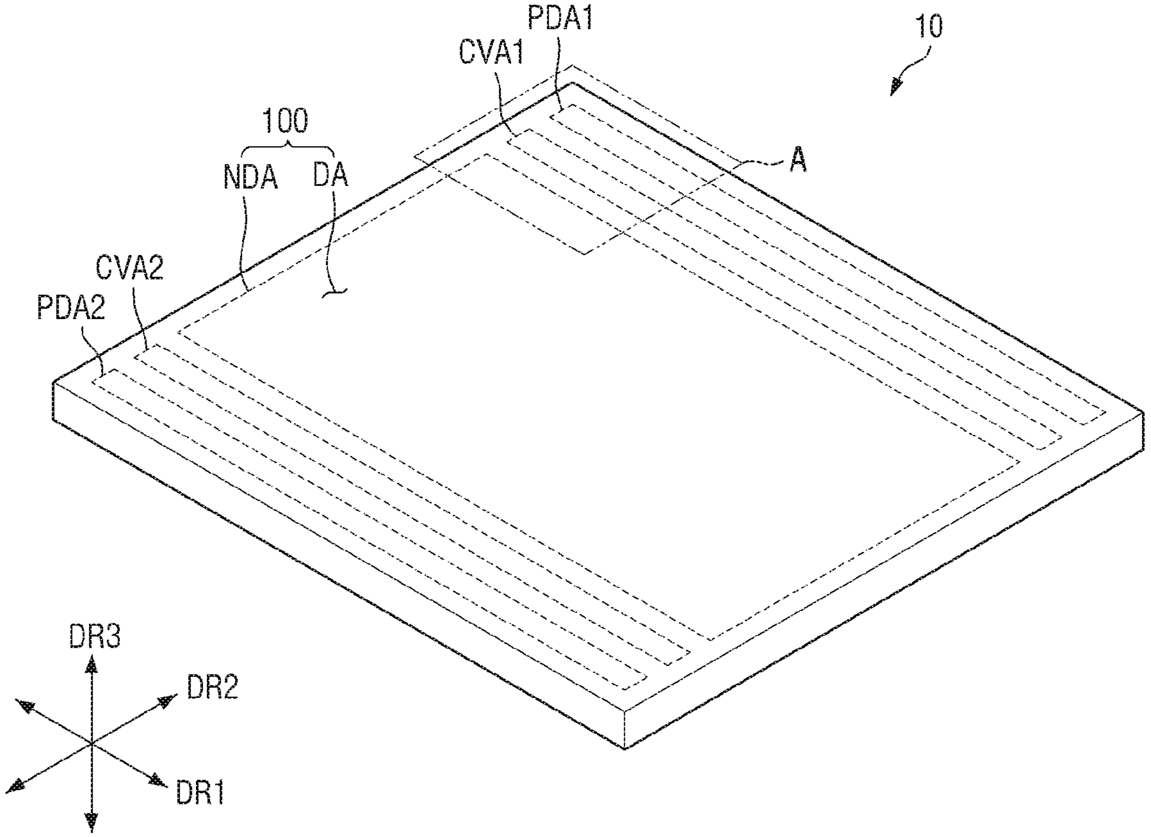
FIG. 1 is a perspective view of a display device according to some embodiments of the present disclosure.

Aspects and features of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of embodiments of the present disclosure to those skilled in the art. Accordingly, processes, elements, and techniques that are not necessary to those having ordinary skill in the art for a complete understanding of the aspects and features of embodiments of the present disclosure might not be described.

Unless otherwise noted, like reference numerals, characters, or combinations thereof denote like elements throughout the attached drawings and the written description, and thus, descriptions thereof will not be repeated. Further, parts not related to the description of some embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept as well as aspects and features of embodiments of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "a plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
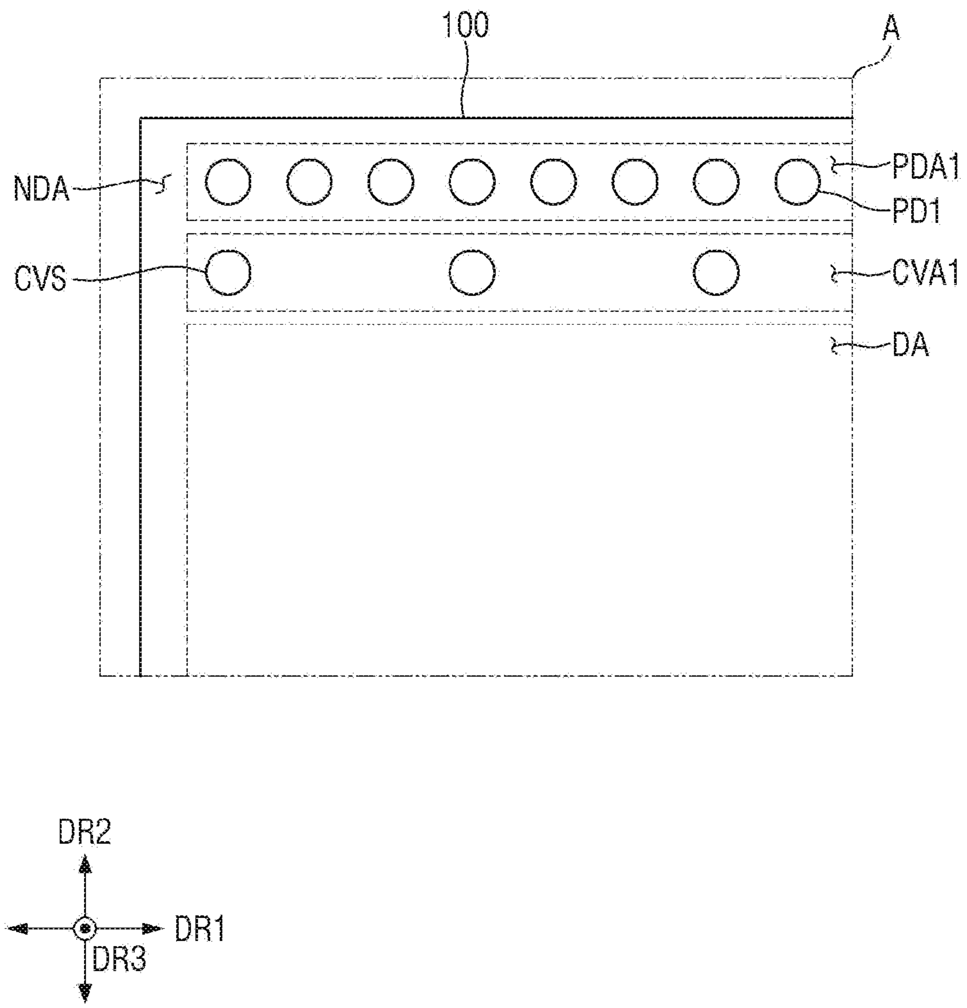
FIG. 2 is a layout view of an area A of FIG. 1.

FIG. 1 is a perspective view of a display device according to some embodiments of the present disclosure. FIG. 2 is a layout view of an area A of FIG. 1.

FIGS. 1 and 2 illustrate a display device including microscopic light-emitting diodes (microLEDs) or nano-light-emitting diodes (nanoLEDs), but the present disclosure is not limited thereto.

FIGS. 1 and 2 also illustrate a light-emitting diode-on-silicon (LEDoS) display device in which light-emitting diodes (LEDs) are located on a semiconductor circuit board 110 obtained by semiconductor processes using a silicon wafer, but the present disclosure is not limited thereto.

Referring to FIGS. 1 and 2, a first direction DR1 may refer to the horizontal direction of a display panel 100, a second direction DR2 may refer to the vertical direction of the display panel 100, and a third direction DR3 may refer to the thickness direction of the display panel 100 or the semiconductor circuit board 110. In this case, the terms "left", "right", "upper", and "lower" may refer to a first side in the first direction DR1, a second side in the first direction DR1, a first side in the second direction DR2, and a second side in the second direction DR2, respectively. Also, the terms "upper" and "lower" may refer to a first side in the third direction DR3 and a second side in the third direction DR3, respectively.

A display device 10 includes the display panel 100, which includes a display area DA and a non-display area NDA.

In a plan view, the display panel 100 may have a rectangular shape having long sides in the first direction DR1 and short sides in the second direction DR2, but the planar shape of the display panel 100 is not particularly limited. That is, the display panel 100 may have various other shapes, such as a non-tetragonal polygonal shape, a circular shape, an elliptical shape, or an atypical shape in a plan view.

The display area DA may be an area where an image is displayed, and the non-display area NDA may be an area where an image is not displayed. The planar shape of the display area DA may conform to the planar shape of the display panel 100. FIG. 1 illustrates that the display area DA has a rectangular shape in a plan view. The display area DA may be located in the middle of the display panel 100. The non-display area NDA may be located around the display area DA. The non-display area NDA may be located to surround the display area DA.

Figure 3A:
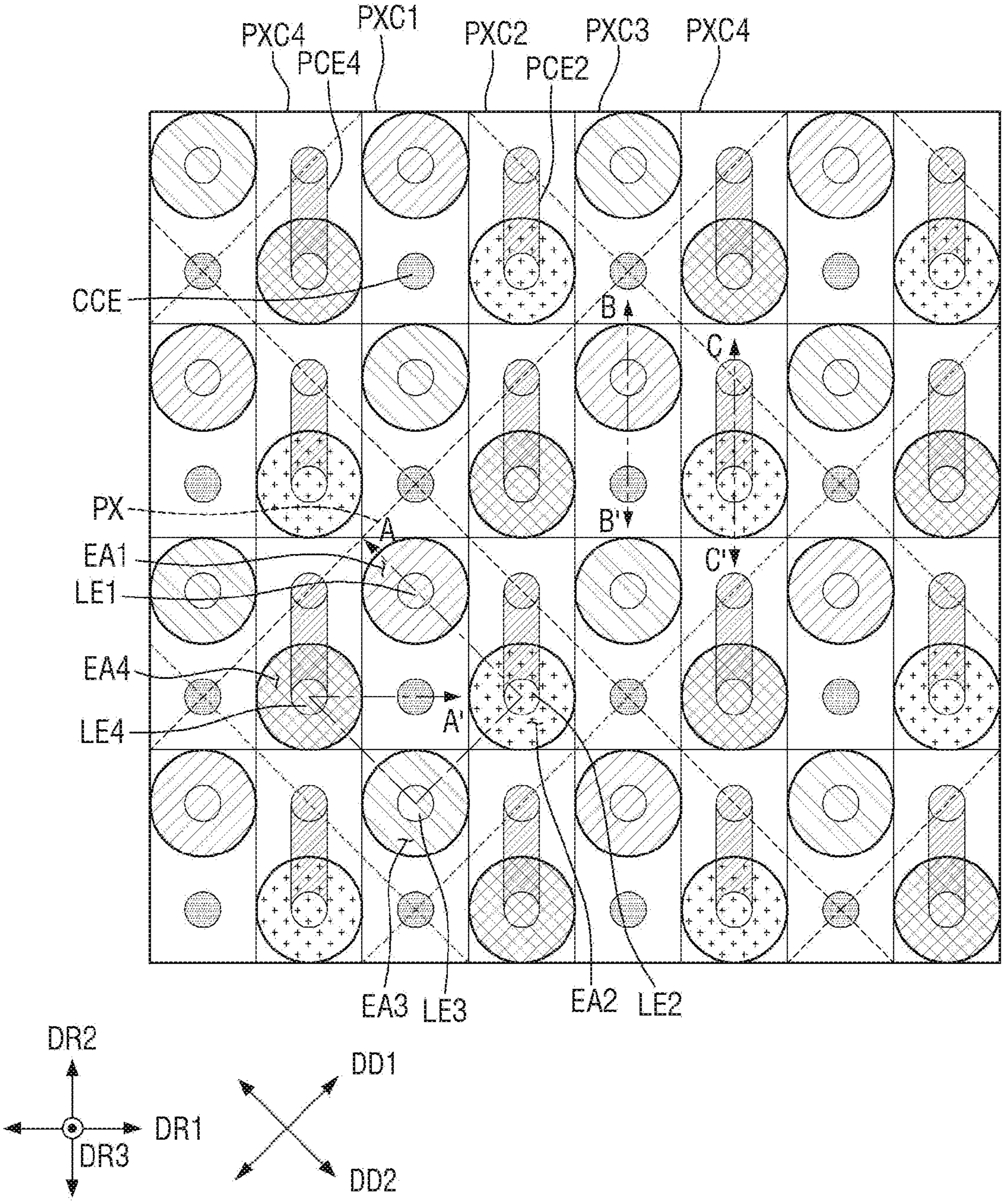
FIGS. 3A and 3B are layout views of a display area of a display panel according to some embodiments of the present disclosure.
Figure 3B:
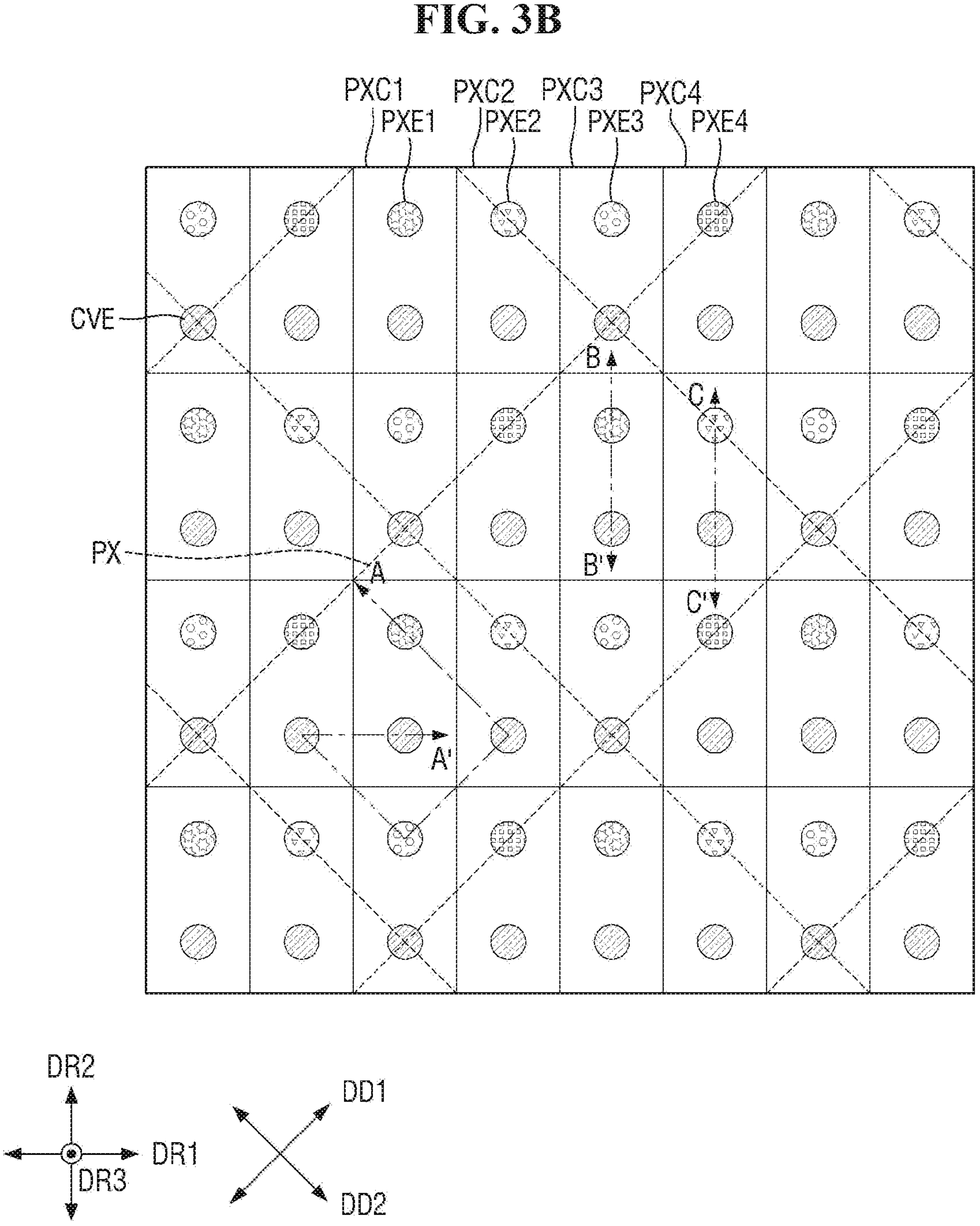

The display area DA of the display panel 100 may include a plurality of pixels (PX of FIGS. 3A and 3B). The pixels may be defined as minimum emission units capable of displaying white light. The pixels will be described later with reference to FIGS. 3A and 3B.

The non-display area NDA may include a first common voltage supply area CVA1, a second common voltage supply area CVA2, a first pad area PDA1, and a second pad area PDA2.

The first common voltage supply area CVA1 may be located between the first pad area PDA1 and the display area DA. The second common voltage supply area CVA2 may be located between the second pad area PDA2 and the display area DA. Each of the first and second common voltage supply areas CVA1 and CVA2 may include a plurality of common voltage supply units CVS. A common voltage may be supplied to a common electrode layer (CEL of FIG. 8) through the common voltage supply units CVS.

The common voltage supply units CVS of the first common voltage supply area CVA1 may be electrically connected to one of first pads of the first pad area PDA1. That is, the common voltage supply units CVS of the first common voltage supply area CVA1 may receive the common voltage from one of the first pads of the first pad area PDA1.

The common voltage supply units CVS of the second common voltage supply area CVA2 may be electrically connected to one of second pads of the second pad area PDA2. That is, the common voltage supply units CVS of the second common voltage supply area CVA2 may receive the common voltage from one of the second pads of the second pad area PDA2.

The first pad area PDA1 may be located in an upper portion of the display panel 100. The first pad area PDA1 may include first pads, which are connected to an external circuit board.

The second pad area PDA2 may be located in a lower portion of the display panel 100. The second pad area PDA2 may include second pads, which are to be connected to the external circuit board. The second pad area PDA2 may be omitted in some embodiments.

FIGS. 3A and 3B are layout views of a display area of a display panel according to some embodiments of the present disclosure.

For convenience, FIG. 3A only illustrates a plurality of light-emitting elements (LE1, LE2, LE3, and LE4), a plurality of emission areas (EA1, EA2, EA3, and EA4), common connecting electrodes CCE, second pixel connecting electrodes PCE2, and fourth pixel connecting electrodes PCE4, and FIG. 3B only illustrates common voltage electrodes CVE and a plurality of pixel electrodes (PXE1, PXE2, PXE3, and PXE4).

Referring to FIGS. 3A and 3B, a display area DA may include a plurality of pixels PX. Each of the pixels PX may include a plurality of pixel circuit units (PXC1, PXC2, PXC3, and PXC4) and a plurality of light-emitting elements (LE1, LE2, LE3, and LE4). FIGS. 3A and 3B illustrate that each of the pixels PX includes four pixel circuit units and four light-emitting elements, but the numbers of pixel circuit units and light-emitting elements included in each of the pixels PX are not particularly limited.

First pixel circuit units PXC1, second pixel circuit units PXC2, third pixel circuit units PXC3, and fourth pixel circuit units PXC4 may be alternately arranged in the first direction DR1. For example, the first pixel circuit units PXC1, the second pixel circuit units PXC2, the third pixel circuit units PXC3, and the fourth pixel circuit units PXC4 may be arranged repeatedly in the first direction DR1 in the order of first, second, third and fourth pixel units PXC1, PXC2, PXC3, and PXC4.

Each of the first, second, third, and fourth pixel circuit units PXC1, PXC2, PXC3, and PXC4 may have a rectangular shape having two sides in the first direction DR1 and two sides in the second direction DR2, in a plan view. The length in the first direction DR1 of the first, second, third, and fourth pixel circuit units PXC1, PXC2, PXC3, and PXC4 may be smaller than the length thereof in the second direction DR2.

Each of the first, second, third, and fourth pixel circuit units PXC1, PXC2, PXC3, and PXC4 may include a complementary metal-oxide semiconductor (CMOS) circuit formed by a semiconductor process. Alternatively, Each of the first, second, third, and fourth pixel circuit units PXC1, PXC2, PXC3, and PXC4 may include a thin-film transistor (TFT) circuit formed by a TFT process.

Each of the first, second, third, and fourth pixel circuit units PXC1, PXC2, PXC3, and PXC4 may include at least one transistor. Each of the first, second, third, and fourth pixel circuit units PXC1, PXC2, PXC3, and PXC4 may further include at least one capacitor.

Figure 4:
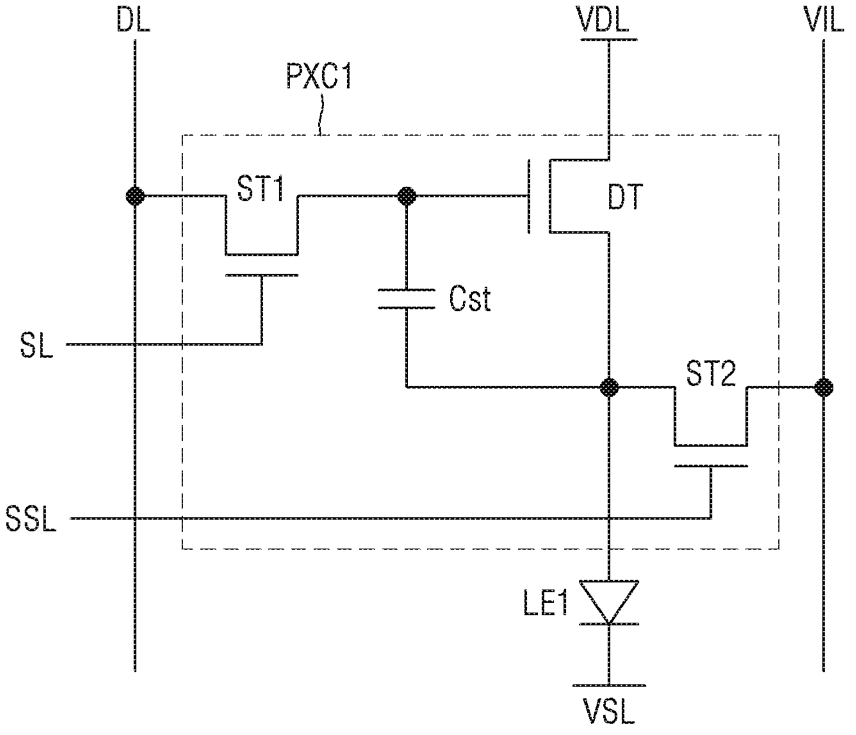
FIG. 4 is a circuit diagram illustrating an first pixel circuit unit and an first light-emitting element of FIG. 3A.

Referring to FIG. 4, in one example, each of the first pixel circuit units PXC1 may include a driving transistor DT, a first transistor ST1, a second transistor ST2, and a capacitor Cst.

A first light-emitting element LE1 emits light in accordance with a driving current, and the amount of light emitted by the first light-emitting element LE1 may be proportional to the driving current. The first light-emitting element LE1 may be a light-emitting diode (LED). In this case, the anode of the first light-emitting element LE1 may be connected to the source electrode of the driving transistor DT, and the cathode of the first light-emitting element LE1 may be connected to a second power supply line VSL, to which a low-potential voltage, which is lower than a high-potential voltage, is supplied.

The driving transistor DT may control a current flowing from a first power supply line VDL, to which a first power supply voltage is supplied, to the first light-emitting element LE1, in accordance with the difference in voltage between the gate electrode and the source electrode of the driving transistor DT. The gate electrode of the driving transistor DT may be connected to the first electrode of the first transistor ST1, the source electrode of the driving transistor DT may be connected to the anode of the first light-emitting element LE1, and the drain electrode of the driving transistor DT may be connected to the first power supply line VDL.

The first transistor ST1 may be turned on by a scan signal from a scan line SL to connect the data line DL to the gate electrode of the driving transistor DT. The gate electrode of the first transistor ST1 may be connected to the scan line SL, the first electrode of the first transistor ST1 may be connected to the gate electrode of the driving transistor DT, and the second electrode of the first transistor ST1 may be connected to the data line DL.

The second transistor ST2 may be turned on by a sensing signal from a sensing signal line SSL to connect an initialization voltage line VIL to the source electrode of the driving transistor DT. The gate electrode of the second transistor ST2 may be connected to the sensing signal line SSL, the first electrode of the second transistor ST2 may be connected to the initialization voltage line VIL, and the second electrode of the second transistor ST2 may be connected to the source electrode of the driving transistor DT.

The first electrodes of the first and second transistors ST1 and ST2 may be, but are not limited to, source electrodes, and the second electrodes of the first and second transistors ST1 and ST2 may be, but are not limited to, drain electrodes. Alternatively, the first electrodes of the first and second transistors ST1 and ST2 may be drain electrodes, and the second electrodes of the first and second transistors ST1 and ST2 may be source electrodes.

The capacitor Cst is formed between the gate electrode and the source electrode of the driving transistor DT. The capacitor Cst stores a differential voltage between the voltage at the gate electrode of the driving transistor DT and the voltage at the source electrode of the driving transistor DT.

FIG. 4 illustrates that the driving transistor DT and the first and second transistors ST1 and ST2 are formed as N-type metal-oxide semiconductor field-effect transistors (MOSFETs), but the present disclosure is not limited thereto. Alternatively, the driving transistor DT and the first and second transistors ST1 and ST2 may be formed as P-type MOSFETs.

Figure 5:
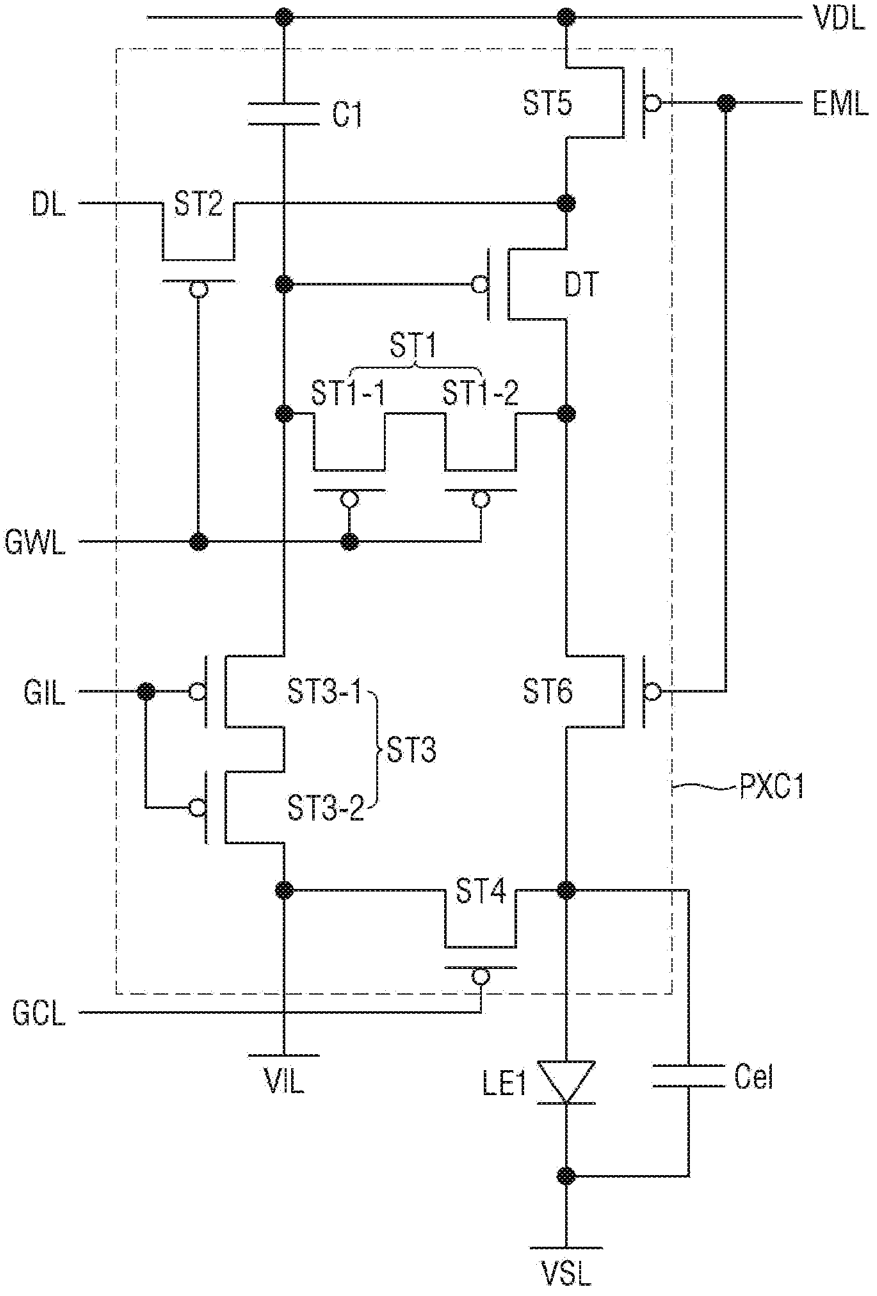
FIG. 5 is a circuit diagram illustrating another first pixel circuit unit and another first light-emitting element of FIG. 3A.

Referring to FIG. 5, in another example, each of the first pixel circuit units PXC1 may include a driving transistor DT, switching elements, and a capacitor C1. The switching elements may include first through sixth transistors ST1 through ST6.

The driving transistor DT includes a gate electrode, a first electrode, and a second electrode. The driving transistor DT controls a drain-source current flowing between the first and second electrodes, in accordance with a data voltage applied to the gate electrode.

The capacitor C1 is formed between the gate electrode and the second electrode of the driving transistor DT. The first electrode of the capacitor C1 may be connected to the second electrode of the driving transistor DT, and the second electrode of the capacitor C1 may be connected to the gate electrode of the driving transistor DT.

In a case where the first electrodes of the first through sixth transistors ST1 through ST6 and the driving transistor DT are source electrodes, the second electrodes of the first through sixth transistors ST1 through ST6 and the driving transistor DT are drain electrodes. Alternatively, in a case where the first electrodes of the first through sixth transistors ST1 through ST6 and the driving transistor DT are drain electrodes, the second electrodes of the first through sixth transistors ST1 through ST6 and the driving transistor DT are source electrodes.

Active layers of the first through sixth transistors ST1 through ST6 and the driving transistor DT may be formed of one of polysilicon, amorphous silicon, and an oxide semiconductor. The active layers of the first through sixth transistors ST1 through ST6 and the driving transistor DT may be formed of polysilicon by a low-temperature polysilicon (LTPS) process.

FIG. 5 illustrates that the first through sixth transistors ST1 through ST6 and the driving transistor DT are formed as P-type MOSFETs, but the present disclosure is not limited thereto. Alternatively, the first through sixth transistors ST1 through ST6 and the driving transistor DT may be formed as N-type MOSFETs.

Figure 6:
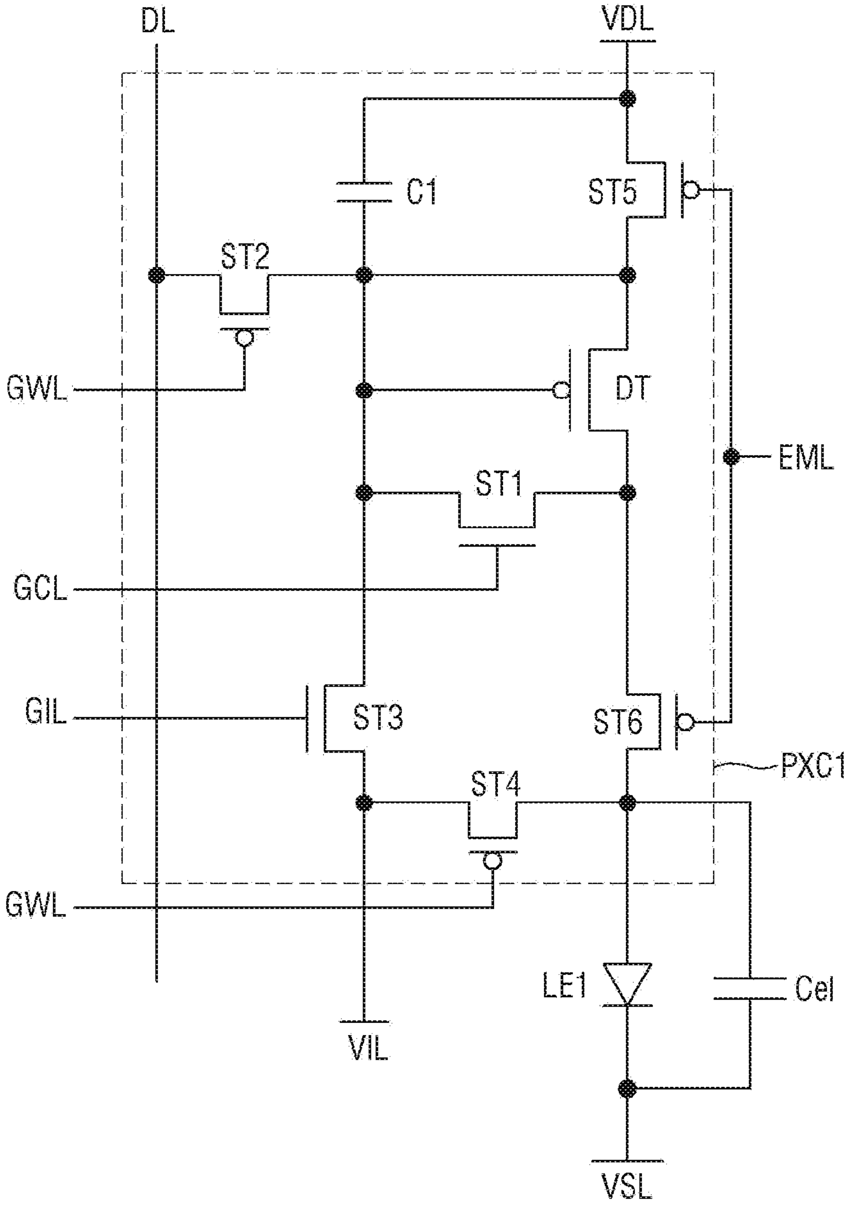
FIG. 6 is a circuit diagram illustrating another first pixel circuit unit and another first light-emitting element of FIG. 3A.

Yet alternatively, referring to FIG. 6, the driving transistor DT and the second, fourth, fifth, and sixth transistors ST2, ST4, ST5, and ST6 may be formed as P-type MOSFETs, and the first and third transistors ST1 and ST3 may be formed as N-type MOSFETs.

Here, the active layers of the driving transistor DT and the second, fourth, fifth, and sixth transistors ST2, ST4, ST5, and ST6, which are formed as P-type MOSFETs, may be formed of polysilicon, and the active layers of the first and third transistors ST1 and ST3, which are formed as N-type MOSFETs, may be formed of an oxide semiconductor.

The embodiments corresponding to FIG. 6 differ from the embodiments corresponding to FIG. 5 in that the gate electrodes of the second and fourth transistors ST2 and ST4 may be connected to a write scan line GWL, and that the gate electrode of the first transistor ST1 is connected to a control scan line GCL. In the embodiments corresponding to FIG. 6, as the first and third transistors ST1 and ST3 are formed as N-type MOSFETs, a scan signal having a gate-high voltage may be applied to the control scan line GCL and an initialization scan line GIL. On the contrary, as the second, fourth, fifth, and sixth transistors ST2, ST4, ST5, and ST6 are formed as P-type MOSFETs, a scan signal having a gate-low voltage may be applied to the write scan line GWL and an emission line EML.

The first pixel circuit units PXC1 are not particularly limited to what is illustrated in FIGS. 4 through 6. That is, the first pixel circuit units PXC1 may be formed to have various other structures.

The second pixel circuit units PXC2, the third pixel circuit units PXC3, and the fourth pixel circuit units PXC4 may be substantially the same as the first pixel circuit units PXC1 described above with reference to FIGS. 4 through 6, and thus, detailed descriptions thereof will be omitted.

Referring to FIGS. 3A and 3B, the first light-emitting elements EL1 may emit first light. The first light may be light of a red wavelength range. For example, the first light may have a main peak wavelength of about 600 nm to about 750 nm, but the present disclosure is not limited thereto.

Second light-emitting elements LE2 and fourth light-emitting elements LE4 may emit second light. The second light may be light of a green wavelength range. For example, the second light may have a main peak wavelength of about 480 nm to about 560 nm, but the present disclosure is not limited thereto.

Third light-emitting elements LE3 may emit third light. The third light may be light of a blue wavelength range. For example, the third light may have a main peak wavelength of about 370 nm to about 460 nm, but the present disclosure is not limited thereto.

FIGS. 3A and 3B illustrate that first emission areas EA1 emit first light, second emission areas EA2 and fourth emission areas EA4 emit second light, and third emission areas EA3 emit third light, but the present disclosure is not limited thereto. Alternatively, the first emission areas EA1 may emit the first light, the second emission areas EA2 and the fourth emission areas EA4 may emit the third light, and the third emission areas EA3 may emit the second light. Alternatively, the first emission areas EA1 may emit the second light, the second emission areas EA2 and the fourth emission areas EA4 may emit the first light, and the third emission areas EA3 may emit the third light. Alternatively, the first emission areas EA1 may emit the first light, the second emission areas EA2 may emit the second light, the third emission areas EA3 may emit the third light, and the fourth emission areas EA4 may emit fourth light, in which case, the fourth light may be light of a yellow wavelength range. That is, the main peak wavelength of the fourth light may range from about 550 nm to about 600 nm, but the present disclosure is not limited thereto.

First light-emitting elements LE1 may be located to correspond one-to-one to the first pixel circuit units PXC1. That is, the first light-emitting elements LE1 may be located on their respective first pixel circuit units PXC1. The first light-emitting elements LE1 may receive a first driving current from their respective first pixel circuit units PXC1. The first light-emitting elements LE1 may emit the first light at a luminance (e.g., a predetermined luminance) in accordance with the first driving current.

The second light-emitting elements LE2 may be located to correspond one-to-one to the second pixel circuit units PXC2. That is, the second light-emitting elements LE2 may be located on their respective second pixel circuit units PXC2. The second light-emitting elements LE2 may receive a second driving current from their respective second pixel circuit units PXC2. The second light-emitting elements LE2 may emit the second light at a luminance (e.g., a predetermined luminance) in accordance with the second driving current.

The third light-emitting elements LE3 may be located to correspond one-to-one to the third pixel circuit units PXC3. That is, the third light-emitting elements LE3 may be located on their respective third pixel circuit units PXC3. The third light-emitting elements LE3 may receive a third driving current from their respective third pixel circuit units PXC3. The third light-emitting elements LE3 may emit the third light at a luminance (e.g., a predetermined luminance) in accordance with the third driving current.

The fourth light-emitting elements LE4 may be located to correspond one-to-one to the fourth pixel circuit units PXE4. That is, the fourth light-emitting elements LE4 may be located on their respective fourth pixel circuit units PXE4. The fourth light-emitting elements LE4 may receive a fourth driving current from their respective fourth pixel circuit units PXC4. The fourth light-emitting elements LE4 may emit the fourth light at a luminance (e.g., a predetermined luminance) in accordance with the fourth driving current.

The first light-emitting elements LE1 and the third light-emitting elements LE3 may be alternately arranged in the first and second directions D1 and D2. The second light-emitting elements LE2 and the fourth light-emitting elements LE3 may be alternately arranged in the first and second direction DR1 and DR2.

The first light-emitting elements LE1 and the fourth light-emitting elements LE4 may be alternately arranged in a first diagonal direction DD1. The second light-emitting elements LE2 and the third light-emitting elements LE3 may be alternately arranged in the first diagonal direction DD1. The first diagonal direction DD1 may be a direction between the first and second directions DR1 and DR2, and may be inclined at an angle of 45 degrees with respect to each of the first and second directions DR1 and DR2.

The first light-emitting elements LE1 and the second light-emitting elements LE2 may be alternately arranged in a second diagonal direction DD2. The third light-emitting elements LE3 and the fourth light-emitting elements LE4 may be alternately arranged in the second diagonal direction DD2. The second diagonal direction DD2 may be orthogonal to the first diagonal direction DD1.

Each of the pixels PX may include first, second, third, and fourth light-emitting elements LE1, LE2, LE3, and LE4, which are arranged in a diamond or rhombus shape. That is, in each of the pixels PX, the first, second, third, and fourth light-emitting elements LE1, LE2, LE3, and LE4 may be arranged in a PENTILE™/PenTile™ scheme (e.g., an RGBG matrix structure, a PENTILE™ matrix structure, a PENTILE™ structure, or an RGBG structure). PENTILE™ is a registered trademark of Samsung Display Co., Ltd., Republic of Korea.

In each of the pixels PX, the distance, in the first diagonal direction DD1, between the first and fourth light-emitting elements LE4, the distance, in the first diagonal direction DD1, between the second and third light-emitting elements LE2 and LE3, the distance, in a second diagonal direction DD2, between the first and second light-emitting elements LE1 and LE2, and the distance, in the second diagonal direction DD2, between the third and fourth light-emitting elements LE3 and LE4 may be substantially the same. Also, in each of the pixels PX, the distance, in the first direction DR1, between the first and third light-emitting elements LE1 and LE3 and the distance, in the second direction DR2, between the second and fourth light-emitting elements LE2 and LE4 may be substantially the same.

FIGS. 3A and 3B illustrate that the first, second, third, and fourth light-emitting elements LE1, LE2, LE3, and LE4 all have substantially the same size, but the present disclosure is not limited thereto. For example, the internal quantum efficiency of the first light-emitting elements LE1 may be considerably lowered in a case where the current density in the first light-emitting elements LE1 increases. Thus, alternatively, the size of the first light-emitting elements LE1 may be greater than the sizes of the second light-emitting elements LE2, the third light-emitting elements LE3, and the fourth light-emitting elements LE4 to lower the current density in the first light-emitting elements LE1.

Figure 7:
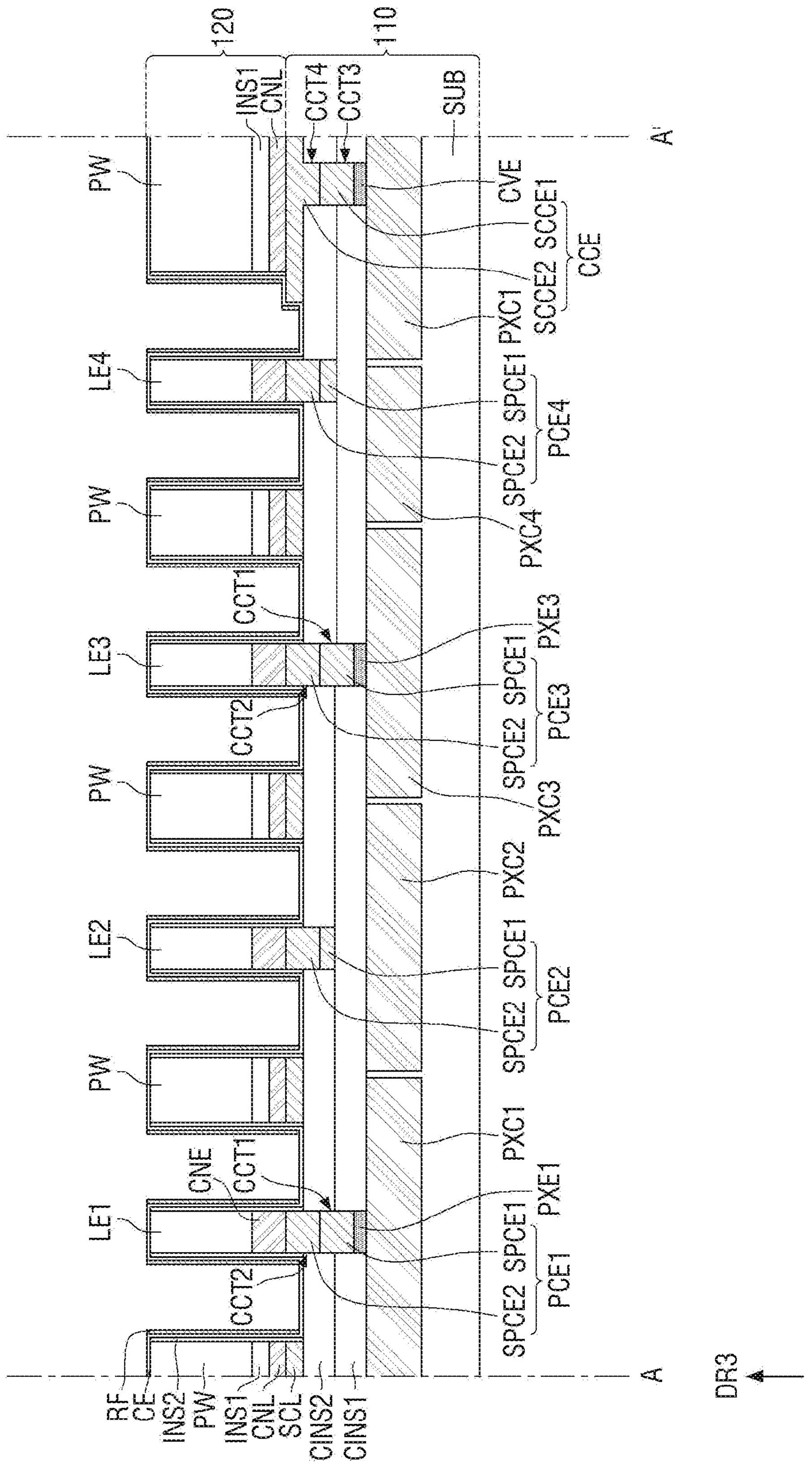
FIG. 7 is a cross-sectional view taken along the line A-A' of FIGS. 3A and 3B.

The first light-emitting elements LE1 may be located in the first emission areas EA1 defined by the partition walls PW (e.g., see FIG. 7). The second light-emitting elements LE2 may be located in the second emission areas EA2 defined by the partition walls PW. The third light-emitting elements LE3 may be located in the third emission areas EA3 defined by the partition walls PW. The fourth light-emitting elements LE4 may be located in the fourth emission areas EA4 defined by the partition walls PW.

FIGS. 3A and 3B illustrate that the first, second, third, and fourth emission areas EA1, EA2, EA3, and EA4 have a circular shape in a plan view, but the present disclosure is not limited thereto. Alternatively, the first, second, third, and fourth emission areas EA1, EA2, EA3, and EA4 may have a polygonal shape, an elliptical shape, or an amorphous shape in a plan view.

Also, FIGS. 3A and 3B illustrate that the first, second, third, and fourth light-emitting elements LE1, LE2, LE3, and LE4 have a circular shape in a plan view, but the present disclosure is not limited thereto. Alternatively, the first, second, third, and fourth light-emitting elements LE1, LE2, LE3, and LE4 may have a polygonal shape, an elliptical shape, or an amorphous shape in a plan view.

Also, FIGS. 3A and 3B illustrate that the first, second, third, and fourth light-emitting elements LE1, LE2, LE3, and LE4 have substantially the same shape as the first, second, third, and fourth emission areas EA1, EA2, EA3, and EA4 in a plan view, but the present disclosure is not limited thereto. Alternatively, the first, second, third, and fourth light-emitting elements LE1, LE2, LE3, and LE4 may have a different shape from the first, second, third, and fourth emission areas EA1, EA2, EA3, and EA4 in a plan view.

The display area DA may include the pixel electrodes (PXE1, PXE2, PXE3, and PXE4), the pixel connecting electrodes (PCE1, PCE2, PCE3, and PCE4), and the common connecting electrodes CCE. The pixel electrodes (PXE1, PXE2, PXE3, and PXE4) may include first pixel electrodes PXE1, second pixel electrodes PXE2, third pixel electrodes PXE3, and fourth pixel electrodes PXE4, and the pixel connecting electrodes (PCE1, PCE2, PCE3, and PCE4) may include first pixel connecting electrodes PCE1, second pixel connecting electrodes PCE2, third pixel connecting electrodes PCE3, and fourth pixel connecting electrodes PCE4.

The first pixel connecting electrodes PCE1 may be located between the first light-emitting elements LE1 and the first pixel electrodes PXE1 to connect the first light-emitting elements LE1 to the first pixel electrodes PXE1. The second pixel connecting electrodes PCE2 may be located between the second light-emitting elements LE2 and the second pixel electrodes PXE2 to connect the second light-emitting elements LE2 and the second pixel electrodes PXE2. The third pixel connecting electrodes PCE3 may be located between the third light-emitting elements LE3 and the third pixel electrodes PXE3 to connect the third light-emitting elements LE3 and the third pixel electrodes PXE3. The fourth pixel connecting electrodes PCE4 may be located between the fourth light-emitting elements LE4 and the fourth pixel electrodes PXE4 to connect the fourth light-emitting elements LE4 and the fourth pixel electrodes PXE4.

Figure 8A:
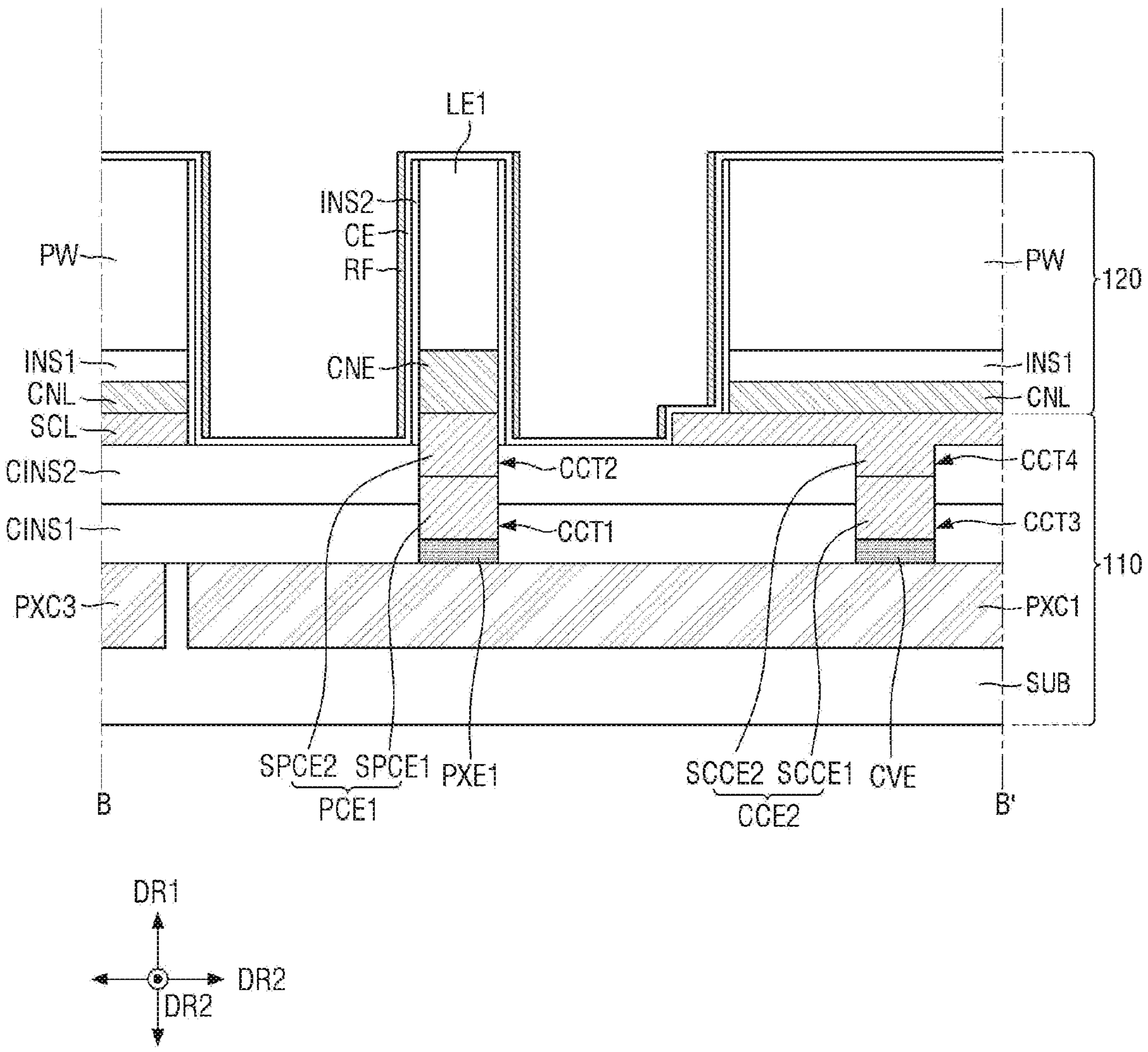
FIG. 8A is a cross-sectional view taken along the line B-B' of FIGS. 3A and 3B.

As the first pixel connecting electrodes PCE1 completely overlap with the first light-emitting elements LE1 in the third direction DR3, as illustrated in FIG. 8A, and the third pixel connecting electrodes PXC3 completely overlap with the third light-emitting elements LE3 in the third direction DR3, the first pixel connecting electrodes PCE1 and the third pixel connecting electrodes PCE3 are not illustrated in FIG. 3A.

The first pixel electrodes PXE1 may be located in upper parts of the first pixel circuit units PXC1, the second pixel electrodes PXE2 may be located in upper parts of the second pixel circuit units PXC2, the third pixel electrodes PXE3 may be located in upper parts of the third pixel circuit units PXC3, and the fourth pixel electrodes PXE4 may be located in upper parts of the fourth pixel circuit units PXC4. In each of the pixels PX, first, second, third, and fourth light-emitting elements LE1, LE2, LE3, and LE4 may be arranged into a PENTILE™/PenTile™ layout having a diamond or rhombus shape (e.g., an RGBG matrix layout, a PENTILE™ matrix layout, a PENTILE™ layout, or an RGBG layout). PENTILE™ is a registered trademark of Samsung Display Co., Ltd., Republic of Korea. Thus, the first light-emitting elements LE1 may be located in the upper parts of the first pixel circuit units PXC1, the second light-emitting elements LE2 may be located in lower parts in the second pixel circuit units PXC2, the third light-emitting elements LE3 may be located in the upper parts of the third pixel circuit units PXC3, and the fourth light-emitting elements LE4 may be located in lower parts of the fourth pixel circuit units PXC4.

The second pixel connecting electrodes PXC2 may connect the second pixel electrodes PXE2, which are located in the upper parts of the second pixel circuit units PXC2, and the second light-emitting elements LE2, which are located in the lower parts of the second pixel circuit units PXC2. Thus, the second pixel connecting electrodes PCE2 may extend in the second direction DR2 in the second pixel circuit units PXC2.

The fourth pixel connecting electrodes PXC4 may connect the fourth pixel electrodes PXE4, which are located in the upper parts of the fourth pixel circuit units PXC4, and the fourth light-emitting elements LE4, which are located in the lower parts of the fourth pixel circuit units PXC4. Thus, the fourth pixel connecting electrodes PCE4 may extend in the second direction DR2 in the fourth pixel circuit units PXC4.

On the contrary, as illustrated in FIG. 8A, the first pixel connecting electrodes PCE1 may connect the first pixel electrodes PXE1, which are located in the upper parts of the first pixel circuit units PXC1, and the first light-emitting elements LE1, which overlap with the first pixel electrodes PXE1 in the third direction DR3, and the third pixel connecting electrodes PCE3 may connect the third pixel electrodes PXE3, which are located in the upper parts of the third pixel circuit units PXC3, and the third light-emitting elements LE3, which overlap with the third pixel electrodes PXE3 in the third direction DR3. Thus, the first pixel connect electrodes PCE1 and the third pixel connecting electrodes PCE3 do not need to extend in the first or second direction DR1 or DR2. Accordingly, the length (e.g., maximum length), in the second direction DR2, of the second pixel connecting electrodes PCE2 or the fourth pixel connecting electrodes PCE4 may be greater than the length (e.g., maximum length), in the second direction DR2, of the first pixel connecting electrodes PCE1 or the third pixel connecting electrodes PCE3.

The common voltage electrodes CVE may be located in the lower parts of the first, second, third, and fourth pixel circuit units PXC1, PXC2, PXC3, and PXC4. The common voltage electrodes CVE may receive a common voltage from the first, second, third, and fourth pixel circuit units PXC1, PXC2, PXC3, and PXC4. The common voltage electrodes CVE may overlap with the first light-emitting elements LE1, the third light-emitting elements LE3, or the common connecting electrodes CCE.

The common connecting electrodes CCE may be connected to the common voltage electrodes CVE. The common connecting electrodes CCE may be located in the first pixel circuit units PXC1 and the third pixel circuit units PXC3. The common connecting electrodes CCE may be located in the lower parts of the first pixel circuit units PXC1 and the third pixel circuit units PXC3.

The common connecting electrodes CCE may be respectively located between second and fourth light-emitting elements LE2 and LE4 that are adjacent to each other in the first direction DR1, and/or between first and third light-emitting elements LE1 and LE3 that are adjacent to each other in the second direction DR2.

As illustrated in FIGS. 3A and 3B, as the pixel connecting electrodes (PCE1, PCE2, PCE3, and PCE4), which respectively connect the light-emitting elements (LE1, LE2, LE3, and LE4) and the pixel electrodes (PXE1, PXE2, PXE3, and PXE4), are provided, the light-emitting elements (LE1, LE2, LE3, and LE4) and the pixel electrodes (PXE1, PXE2, PXE3, and PXE4) can be properly respectively connected even if the light-emitting elements (LE1, LE2, LE3, and LE4) and the pixel electrodes (PXE1, PXE2, PXE3, and PXE4) do not overlap in the third direction DR3. Accordingly, the light-emitting elements (LE1, LE2, LE3, and LE4) can be arranged without regard to the layout of the pixel electrodes (PXE1, PXE2, PXE3, and PXE4) of the semiconductor circuit board 110.

Figure 8B:
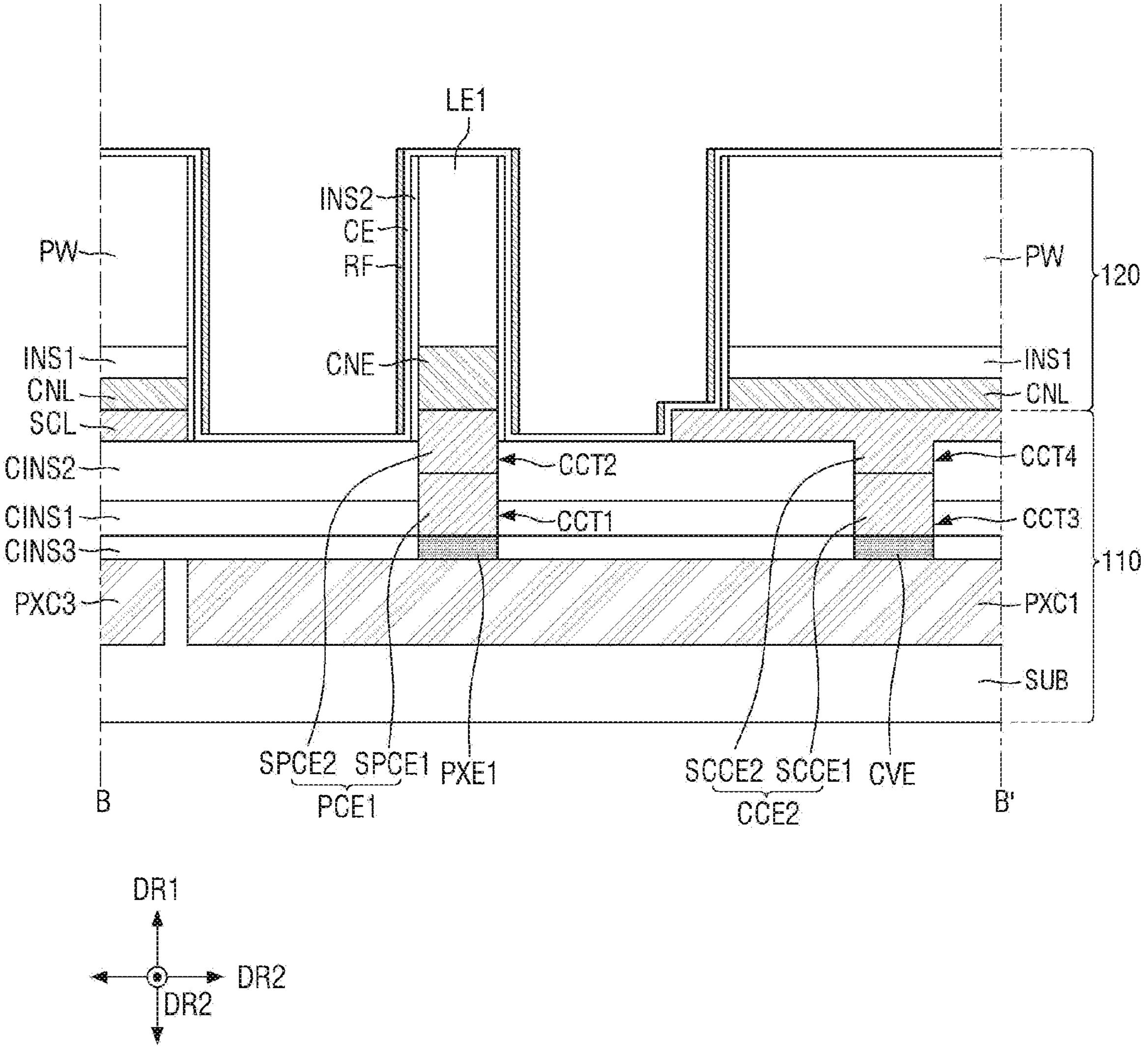
FIG. 8B is a cross-sectional view taken along the line B-B' of FIGS. 3A and 3B.
Figure 9:
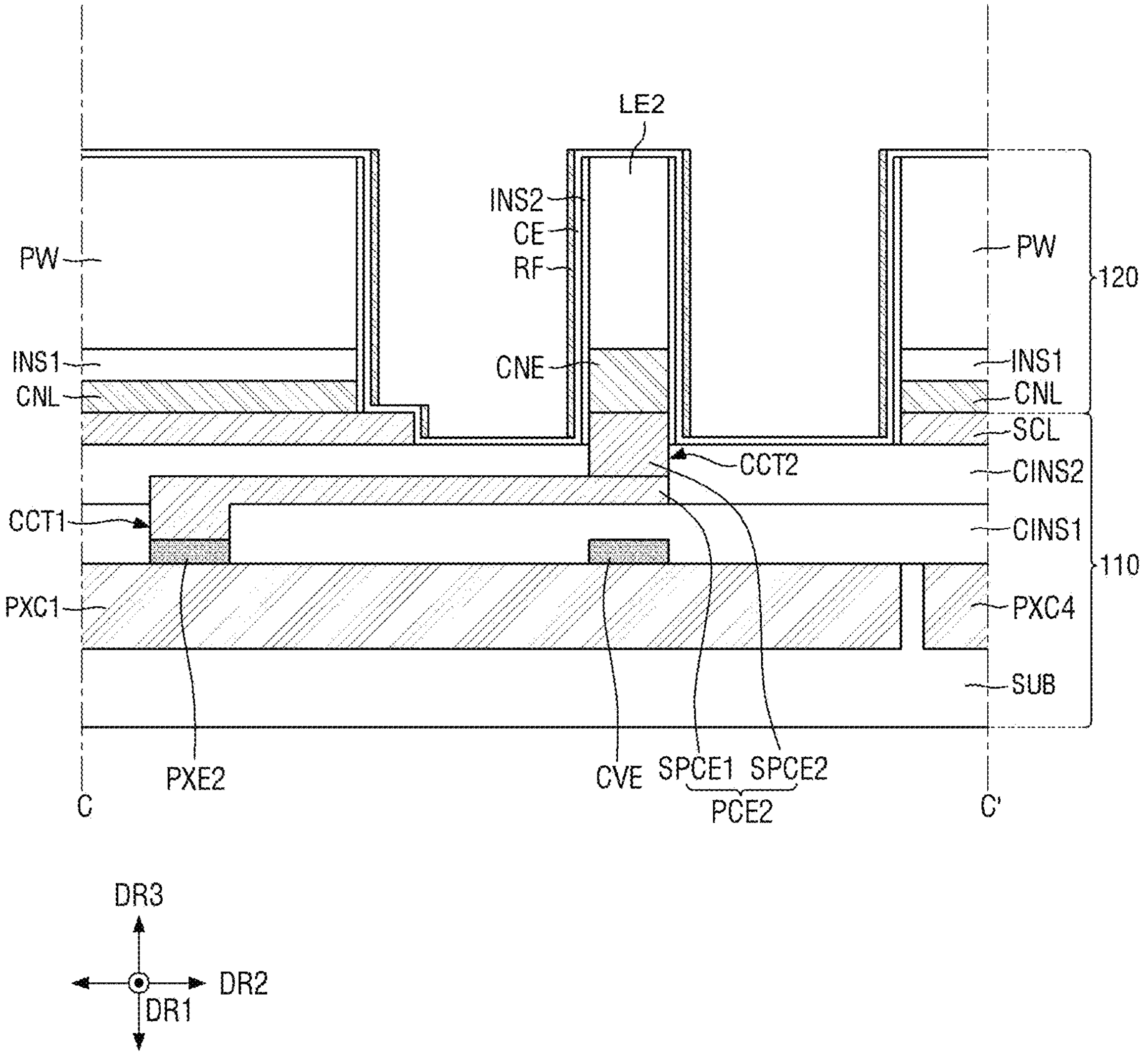
FIG. 9 is a cross-sectional view taken along the line C-C' of FIGS. 3A and 3B.

FIG. 7 is a cross-sectional view taken along the line A-A' of FIG. 3A or 3B. FIGS. 8A and 8B are cross-sectional views taken along the line B-B' of FIG. 3A or 3B. FIG. 9 is a cross-sectional view taken along the line C-C' of FIG. 3A or 3B.

Referring to FIGS. 7, 8A, and 9, the display panel 100 may include a semiconductor circuit board 110 and a light-emitting element layer 120. The semiconductor circuit board 110 may include a substrate SUB, a plurality of pixel circuit units (PXC1, PXC2, PXC3, and PXC4) a plurality of pixel electrodes (PXE1, PXE2, PXE3, and PXE4), a plurality of pixel connecting electrodes (PCE1, PCE2, PCE3, and PCE4), a plurality of common voltage electrodes CVE, and a plurality of common connecting electrodes CCE.

The substrate SUB may be a silicon wafer substrate. For example, the substrate SUB may be formed of monocrystalline silicon. Alternatively, the substrate SUB may be a TFT substrate.

Each of the pixel circuit units (PXC1, PXC2, PXC3, and PXC4) may be located on the substrate SUB. Each of the pixel circuit units (PXC1, PXC2, PXC3, and PXC4) may include a CMOS circuit formed by a semiconductor process. Alternatively, each of the pixel circuit units (PXC1, PXC2, PXC3, and PXC4) may include a TFT circuit formed by a TFT process.

The pixel circuit units (PXC1, PXC2, PXC3, and PXC4) may be located in the display area DA. The pixel circuit units (PXC1, PXC2, PXC3, and PXC4) may be connected to their respective pixel electrodes (PXE1, PXE2, PXE3, and PXE4). That is, the pixel circuit units (PXC1, PXC2, PXC3, and PXC4) may be connected one-to-one to their respective pixel electrodes (PXE1, PXE2, PXE3, and PXE4).

For example, first pixel circuit units PXC1 may supply a pixel voltage or an anode voltage to first pixel electrodes PXE1, second pixel circuit units PXC2 may supply a pixel voltage or an anode voltage to second pixel electrodes PXE2, third pixel circuit units PXC3 may supply a pixel voltage or an anode voltage to third pixel electrodes PXE3, and fourth pixel circuit units PXC4 may supply a pixel voltage or an anode voltage to fourth pixel electrodes PXE4.

The first pixel electrodes PXE1 may be located on the first pixel circuit units PXC1. The first pixel electrodes PXE1 may be electrodes exposed from the first pixel circuit units PXC1. That is, the first pixel electrodes PXE1 may protrude from the top surfaces of the first pixel circuit units PXC1. The first pixel electrodes PXE1 may be integrally formed with the first pixel circuit units PXC1.

The second pixel electrodes PXE2 may be located on the second pixel circuit units PXC2. The second pixel electrodes PXE2 may be electrodes exposed from the second pixel circuit units PXC2. That is, the second pixel electrodes PXE2 may protrude from the top surfaces of the second pixel circuit units PXC2. The second pixel electrodes PXE2 may be integrally formed with the second pixel circuit units PXC2.

The third pixel electrodes PXE3 may be located on the third pixel circuit units PXC3. The third pixel electrodes PXE3 may be electrodes exposed from the third pixel circuit units PXC3. That is, the third pixel electrodes PXE3 may protrude from the top surfaces of the third pixel circuit units PXC3. The third pixel electrodes PXE3 may be integrally formed with the third pixel circuit units PXC3.

The fourth pixel electrodes PXE4 may be located on the fourth pixel circuit units PXC4. The fourth pixel electrodes PXE4 may be electrodes exposed from the fourth pixel circuit units PXC4. That is, the fourth pixel electrodes PXE4 may protrude from the top surfaces of the fourth pixel circuit units PXC4. The fourth pixel electrodes PXE4 may be integrally formed with the fourth pixel circuit units PXC4.

The first pixel electrodes PXE1, the second pixel electrodes PXE2, the third pixel electrodes PXE3, and the fourth pixel electrodes PXE4 may include aluminum (Al), gold (Au), copper (Cu), an alloy of Au and tin (Sn), an alloy of silver (Ag) and Sn, or an alloy of Sn, Au, or Cu.

The pixel circuit units (PXC1, PXC2, PXC3, and PXC4) may be connected to their respective common voltage electrodes CVE. That is, the pixel circuit units (PXC1, PXC2, PXC3, and PXC4) may be connected one-to-one to the common voltage electrodes CVE.

The common connecting electrodes CVE may be located on the first, second, third, and fourth pixel circuit units PXC1, PXC2, PXC3, and PXC4. The common connecting electrodes CVE may be electrodes exposed from the first, second, third, and fourth pixel circuit units PXC1, PXC2, PXC3, and PXC4. That is, the common connecting electrodes CVE may protrude from the top surfaces of the first, second, third, and fourth pixel circuit units PXC1, PXC2, PXC3, and PXC4. The common connecting electrodes CVE may be integrally formed with the first, second, third, and fourth pixel circuit units PXC1, PXC2, PXC3, and PXC4.

The first pixel connecting electrodes PCE1 may be located on the first pixel electrodes PXE1. Connecting electrodes CNE of the first light-emitting elements LE1 may be located on the first pixel connecting electrodes PCE1. The first pixel connecting electrodes PCE1 may be located between the first pixel electrodes PXE1 and the connecting electrodes CNE of the first light-emitting elements EL1. That is, the first pixel connecting electrodes PCE1 may connect the first pixel electrodes PXE1 and the connecting electrodes CNE of the first light-emitting elements LE1.

The second pixel connecting electrodes PCE2 may be located on the second pixel electrodes PXE2. Connecting electrodes CNE of the second light-emitting elements LE2 may be located on the second pixel connecting electrodes PCE2. The second pixel connecting electrodes PCE2 may be located between the second pixel electrodes PXE2 and the connecting electrodes CNE of the second light-emitting elements LE2. That is, the second pixel connecting electrodes PCE2 may connect the second pixel electrodes PXE2 and the connecting electrodes CNE of the second light-emitting elements LE2.

The third pixel connecting electrodes PCE3 may be located on the third pixel electrodes PXE3. Connecting electrodes CNE of the third light-emitting elements LE3 may be located on the third pixel connecting electrodes PCE3. The third pixel connecting electrodes PCE3 may be located between the third pixel electrodes PXE3 and the connecting electrodes CNE of the third light-emitting elements LE3. That is, the third pixel connecting electrodes PCE3 may connect the third pixel electrodes PXE3 and the connecting electrodes CNE of the third light-emitting elements LE3.

The fourth pixel connecting electrodes PCE4 may be located on the fourth pixel electrodes PXE4. Connecting electrodes CNE of the fourth light-emitting elements LE4 may be located on the fourth pixel connecting electrodes PCE4. The fourth pixel connecting electrodes PCE4 may be located between the fourth pixel electrodes PXE4 and the connecting electrodes CNE of the fourth light-emitting elements LE4. That is, the fourth pixel connecting electrodes PCE4 may connect the fourth pixel electrodes PXE4 and the connecting electrodes CNE of the fourth light-emitting elements LE4.

The common connecting electrodes CCE may be located on the common voltage electrodes CVE. The common connecting electrodes CCE may connect the common voltage electrodes CVE to the common electrode CE.

A first connecting insulating film CINS1 may be located on the first pixel electrodes PXE1, the second pixel electrodes PXE2, the third pixel electrodes PXE3, the fourth pixel electrodes PXE4, and the common voltage electrodes CVE. The first connecting insulating film CINS1 may be located to cover the first, second, third, and fourth pixel electrodes PXE1, PXE2, PXE3, and PXE4, and the common voltage electrodes CVE. The first connecting insulating film CINS1 may be formed as an inorganic film such as a silicon oxide ($SiO_2$) film, an aluminum oxide ($Al_2O_3$) film, or a hafnium oxide ($HfO_x$) film.

Each of the first pixel connecting electrodes PCE1, the second pixel connecting electrodes PCE2, the third pixel connecting electrodes PCE3, and the fourth pixel connecting electrodes PCE4 may include first and second sub-pixel connecting electrodes SPCE1 and SPCE2. Each of the common connecting electrodes may include first and second sub-common connecting electrodes SCCE1 and SCCE2.

First sub-pixel connecting electrodes SPCE1 and first sub-common connecting electrodes SCCE1 may be located on the first connecting insulating film CINS1. The first sub-pixel connecting electrodes SPCE1 may be connected to the first, second, third, and/or fourth pixel electrodes PXE1, PXE2, PXE3, and/or PXE4 through respective first connecting contact holes CCT1, which penetrate the first connecting insulating film CINS1. The first sub-common connecting electrodes SCCE1 may be connected to the common voltage electrodes CVE through respective third connecting contact holes CCT3, which penetrate the first connecting insulating film CINS1. The first sub-pixel connecting electrodes SPCE1 and the first sub-common connecting electrodes SCCE1 may include Au, Cu, an alloy of Au and Sn, an alloy of Ag and Sn, or an alloy of Sn, Au, or Cu, but the present disclosure is not limited thereto.

The first sub-pixel connecting electrodes SPCE1 and the second sub-pixel connecting electrodes SPCE2 of the first pixel connecting electrodes PCE1 may overlap with the first light-emitting elements LE1 in the third direction DR3. The first sub-pixel connecting electrodes SPCE1 and the second sub-pixel connecting electrodes SPCE2 of the third pixel connecting electrodes PCE3 may overlap with the third light-emitting elements LE3 in the third direction DR3.

A portion of the first sub-pixel connecting electrodes SPCE1 of the second pixel connecting electrodes PCE2 might not overlap with the second light-emitting elements LE2 in the third direction DR3, while the second sub-pixel connecting electrodes SPCE2 of the second pixel connecting electrodes PCE2 may overlap with the second light-emitting elements LE2 in the third direction DR3. Also, a portion of the first sub-pixel connecting electrodes SPCE1 of the fourth pixel connecting electrodes PCE4 might not overlap with the fourth light-emitting elements LE4 in the third direction DR3, while the second sub-pixel connecting electrodes SPCE2 of the fourth pixel connecting electrodes PCE4 may overlap with the fourth light-emitting elements LE4 in the third direction DR3.

A second connecting insulating film CINS2 may be located on the first sub-pixel connecting electrodes SPCE1. The second connecting insulating film CINS2 may be located to cover the first sub-pixel connecting electrodes SPCE1 and the first sub-common connecting electrodes SCCE1. The second connecting insulating film CINS2 may be formed as an inorganic film such as a $SiO_2$ film, an $Al_2O_3$ film, or a $HfO_x$ film.

The second connecting insulating film CINS2 may include second connecting contact holes CCT2, which expose the first sub-pixel connecting electrodes SPCE1. The second connecting insulating film CINS2 may also include fourth connecting contact holes CCT4, which expose the first sub-common connecting electrodes SCCE1.

The second sub-pixel connecting electrodes SPCE2 may be located in the second connecting contact holes CCT2. The second sub-common connecting electrodes SCCE2 may be located in the fourth connecting contact holes CCT4.

The second sub-pixel connecting electrodes SPCE2 and the second sub-common connecting electrodes SCCE2 may include Au, Cu, an alloy of Au and Sn, an alloy of Ag and Sn, or an alloy of Sn, Au, or Cu, but the present disclosure is not limited thereto.

Step compensation layers SCL may be provided to reduce or prevent gaps between partition walls PW and the second connecting insulating film CINS2 in areas where the second sub-pixel connecting electrodes SPCE2 and the second sub-common connecting electrodes SCCE2 are not located. The step compensation layers SCL may overlap with the partition walls PW in the third direction DR3. The step compensation layers SCL may be spaced apart from the second sub-pixel connecting electrodes SPCE2 and the second sub-common connecting electrodes SCCE2.

The step compensation layers SCL may include the same material as the second sub-pixel connecting electrodes SPCE2 and the second sub-common connecting electrodes SCCE2, and may be located in the same layer as the second sub-pixel connecting electrodes SPCE2 and the second sub-common connecting electrodes SCCE2. For example, the step compensation layers SCL may be located on the second connecting insulating film CINS2. The step compensation layers SCL may include Au, Cu, an alloy of Au and Sn, an alloy of Ag and Sn, or an alloy of Sn, Au, or Cu, but the present disclosure is not limited thereto.

The light-emitting element layer 120 may be a layer for emitting light. The light-emitting element layer 120 may include the first light-emitting elements LE1, the second light-emitting elements LE2, the third light-emitting elements LE3, the fourth light-emitting elements LE4, the partition walls PW, the connecting electrodes CNE, connecting metal layers CNL, first insulating films INS1, second insulating films INS2, a common electrode CE, and reflective films RF.

The connecting electrodes CNE may be located to correspond one-to-one to the first pixel connecting electrodes PCE1, the second pixel connecting electrodes PCE2, the third pixel connecting electrodes PCE3, and the fourth pixel connecting electrodes PCE4. That is, the connecting electrodes CNE may be located on their respective first, second, third, or fourth pixel connecting electrodes PCE1, PCE2, PCE3, or PCE4. The connecting metal layers CNL may be located to correspond one-to-one to the step compensation layers SCL. That is, the connecting metal layers CNL may be located on their respective step compensation layers SCL.

During the fabrication of the display device 10, the connecting electrodes CNE may function as bonding metal layers for respectively bonding the first pixel connecting electrodes PCE1 and the first light-emitting elements LE1, the second pixel connecting electrodes PCE2 and the second light-emitting elements LE2, the third pixel connecting electrodes PCE3 and the third light-emitting elements LE3, and the fourth pixel connecting electrodes PCE4 and the fourth light-emitting elements LE4, and the connecting metal layers CNL may function as bonding metal layers for respectively bonding the step compensation layers SCL and the partition walls PW. For example, the connecting electrodes CNE and the connecting metal layers CNL may include Au, Cu, an alloy of Au and Sn, an alloy of Ag and Sn, or an alloy of Sn, Au, or Cu.

The thickness of the first light-emitting elements LE1 may be the same as the thickness of the partition walls PW. Thus, the connecting electrodes CNE may be thicker than the connecting metal layers CNL to compensate for the thickness of the first insulating films INS1.

The first, second, third, and fourth light-emitting elements LE1, LE2, LE3, and LE4 may be located on their respective connecting electrodes CNE. The first, second, third, and fourth light-emitting elements LE1, LE2, LE3, and LE4 may be connected one-to-one to the connecting electrodes CNE. The first, second, third, and fourth light-emitting elements LE1, LE2, LE3, and LE4 may be vertical LEDs extending in the third direction DR3. That is, the length of the first, second, third, and fourth light-emitting elements LE1, LE2, LE3, and LE4 in the third direction DR3 may be greater than the length thereof in a horizontal direction (e.g., a horizontal length). Here, the horizontal direction may refer to the first direction DR1 and/or the second direction DR2.

Figure 10:
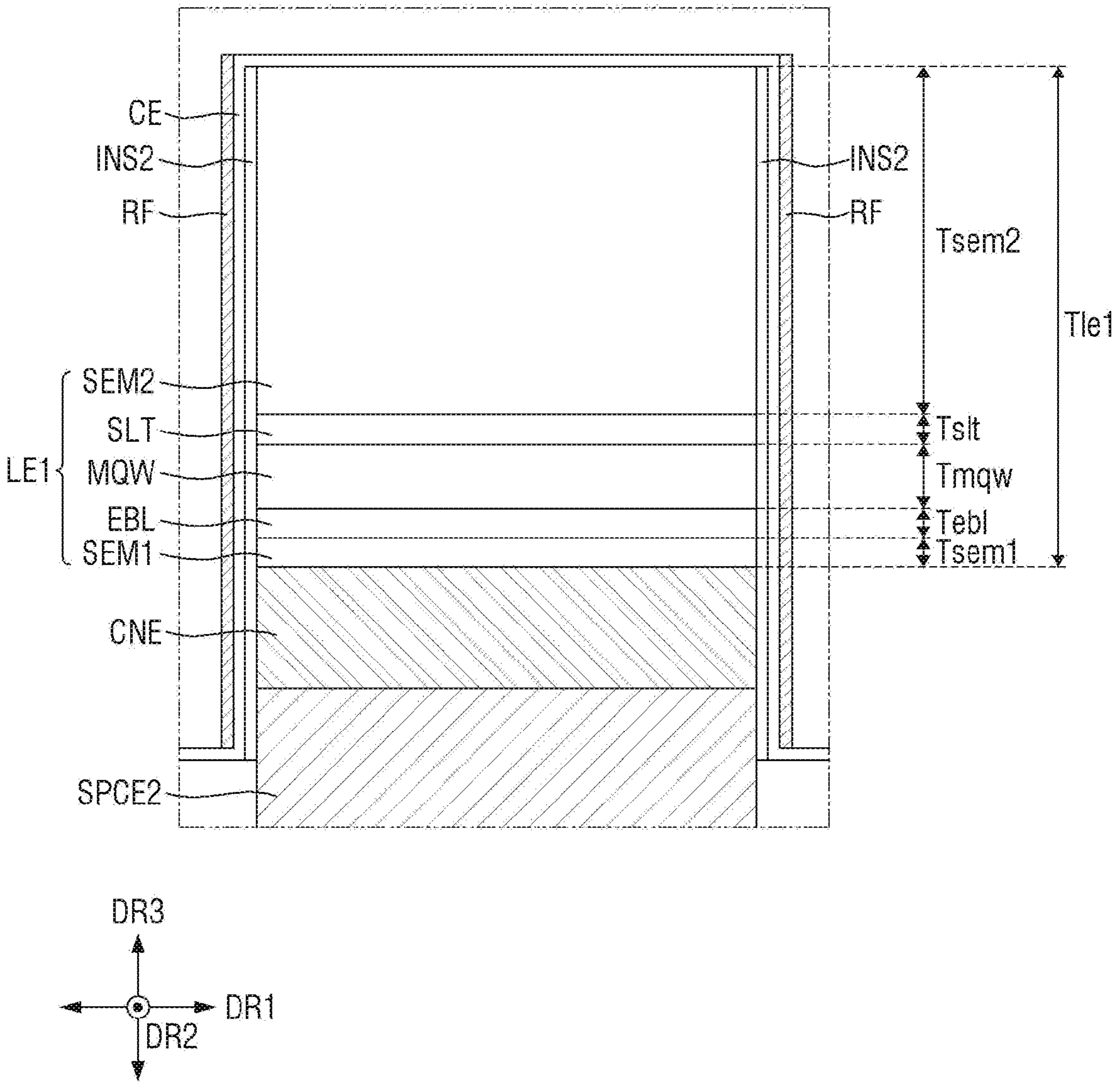
FIG. 10 is an enlarged cross-sectional view of a first light-emitting element of FIG. 7.

The first light-emitting elements LE1 may be microLEDs or nanoLEDs. Referring to FIG. 10, a first light-emitting element LE1 may include a first semiconductor layer SEM1, an electron blocking layer EBL, an active layer MQW, a superlattice layer SLT, and a second semiconductor layer SEM2 in the third direction DR3. The first semiconductor layer SEM1, the electron blocking layer EBL, the active layer MQW, the superlattice layer SLT, and the second semiconductor layer SEM2 may be sequentially stacked in the third direction DR3.

The first semiconductor layer SEM1 may be located on a connecting electrode CNE. The first semiconductor layer SEM1 may be doped with a dopant of a first conductivity type such as magnesium (Mg), zinc (Zn), calcium (Ca), selenium (Se), or barium (Ba). For example, the first semiconductor layer 31 may be p-GaN doped with Mg, which is a p-type dopant. A thickness Tsem1 of the first semiconductor layer 31 may be about 30 nm to about 200 nm.

The electron blocking layer EBL may be located on the first semiconductor layer SEM1. The electron blocking layer EBL may be a layer for suppressing or preventing the flow of too many electrons into the active layer MQW. For example, the electron blocking layer EBL may be p-AlGaN doped with Mg, which is a p-type dopant. A thickness Tebl of the electron blocking layer EBL may be about 10 nm to about 50 nm. The electron blocking layer EBL may be omitted in some embodiments.

The active layer MQW may be located on the electron blocking layer EBL. The active layer MQW may emit light through the combination of electron-hole pairs in accordance with electric signals applied thereto from the first and second semiconductor layers SEM1 and SEM2.

The active layer MQW may include a material having a single- or multi-quantum well structure. In a case where the active layer MQW includes a material having a multi-quantum well structure, the active layer MQW may have a structure in which a plurality of well layers and a plurality of barrier layers are alternately stacked. The thickness of the well layers may be about 1 nm to about 4 nm, and the thickness of the barrier layers may be about 3 nm to about 10 nm.

Alternatively, the active layer MQW may have a structure in which semiconductor materials having a large bandgap energy and semiconductor materials having a small bandgap energy are alternately stacked, or may include a group III semiconductor material or a group V semiconductor material depending on the wavelength range of light to be emitted by the active layer MQW.

In a case where the active layer MQW includes InGaN, the color of light to be emitted by the active layer MQW may vary depending on the indium (In) content of the active layer MQW. For example, as the In content of the active layer MQW increases, the wavelength of light emitted by the active layer MQW may be switched or shifted to a red wavelength range, and as the In content of the active layer MQW decreases, the wavelength of light emitted by the active layer MQW may be switched or shifted to a blue wavelength range. Thus, the In content of the active layer MQW of the first light-emitting element LE1 may be greater than the In contents of active layers MQW of second and fourth light-emitting elements LE2 and LE4, and the In contents of active layers MQW of the second and fourth light-emitting elements LE2 and LE4 may be greater than the In content of an active layer MQW of a third light-emitting element LE3. For example, the In content of the active layer MQW of the third light-emitting element LE3 may be about 15%, the In content of the active layer MQW of the second light-emitting element LE2 may be about 25%, and the In content of the active layer MQW of the first light-emitting element LE1 may be about 35% or greater. That is, by controlling the In contents of the active layers MQW of the first, second, and third light-emitting elements LE1, LE2, and LE3, the first, second, and third light-emitting elements LE1, LE2, and LE3 may be allowed to emit the first light, the second light, and the third light, respectively.

The superlattice layer SLT may be located on the active layer MQW. The superlattice layer SLT may be a layer for alleviating the stress between the second semiconductor layer SEM2 and the active layer MQW. For example, the superlattice layer SLT may be formed of InGaN or GaN. A thickness Tslt of the superlattice layer SLT may be about 50 nm to about 200 nm. The superlattice layer SLT may be omitted in some embodiments.

The second semiconductor layer SEM2 may be located on the superlattice layer SLT. The second semiconductor layer SEM2 may be doped with a dopant of a second conductivity type such as silicon (Si), germanium (Ge), or Sn. For example, the second semiconductor layer SEM2 may be n-GaN doped with Si. A thickness Tsem2 of the second semiconductor layer SEM2 may be about 500 nm to about 1 μm.

Referring back to FIGS. 7, 8A, and 9, the first insulating films INS1 may be located on the step compensation layers SCL and the common connecting electrodes CCE. The first insulating films INS1 may be formed as inorganic films such as $SiO_2$ films, $Al_2O_3$ films, or $HfO_x$ films.

The partition walls PW may be located on the first insulating films INS1. The partition walls PW may be spaced apart from the light-emitting elements (LE1, LE2, LE3, and LE4). The partition walls PW may be located to surround the light-emitting elements (LE1, LE2, LE3, and LE4).

The width, in the horizontal direction, of the connecting metal layers CNL, the width, in the horizontal direction, of the first insulating films INS1, and the width, in the horizontal direction, of the partition walls PW may be smaller than the width, in the horizontal direction, of the common connecting electrodes CCE. For example, the width, in the first or second direction DR1 or DR2, of the connecting metal layers CNL, the width, in the first or second direction DR1 or DR2, of the first insulating films INS1, and the width, in the first or second direction DR1 or DR2, of the partition walls PW may be smaller than the width, in the first or second direction DR1 or DR2, of the common connecting electrodes CCE. As a result, the top surfaces of the second sub-common connecting electrodes SCCE2 of the common connecting electrodes CCE may not be covered (e.g., not entirely covered), but may be exposed (e.g., partially exposed) by the connecting metal layers CNL, the first insulating films INS1, and the partition walls PW.

Figure 11:
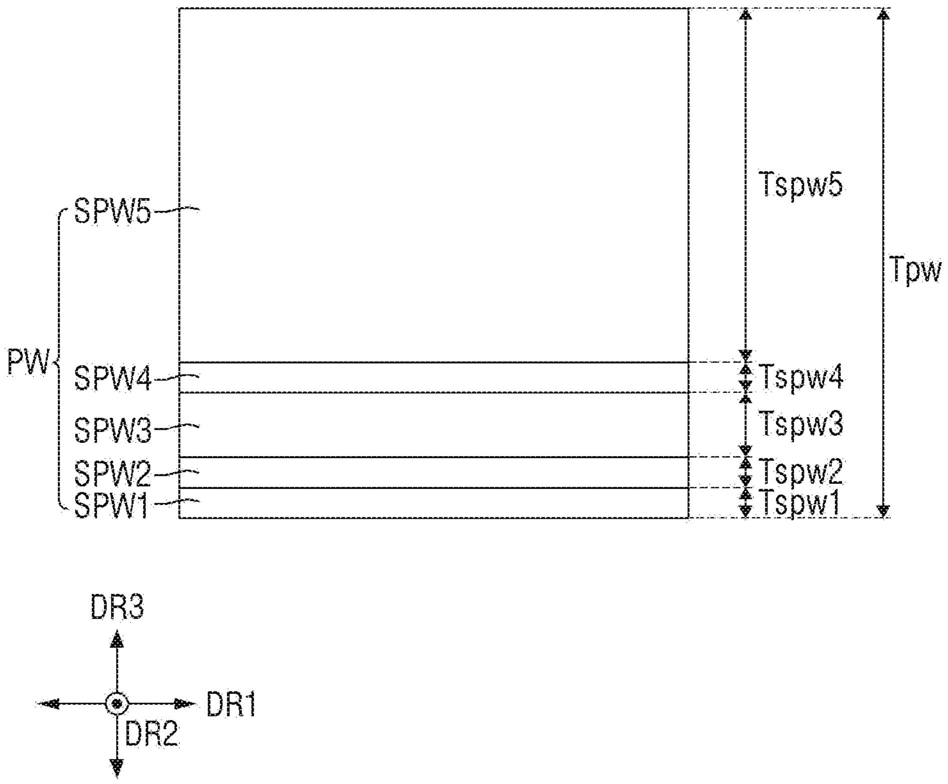
FIG. 11 is an enlarged cross-sectional view of a partition wall of FIG. 7.

Referring to FIG. 11, each of the partition walls PW may include a plurality of sub-partition walls (SPW1, SPW2, SPW3, SPW4, and SPW5), which are sequentially stacked in the third direction DR3. For example, the partition walls PW may include first sub-partition walls SPW1, second sub-partition walls SPW2, third sub-partition walls SPW3, fourth sub-partition walls SPW4, and fifth sub-partition walls SPW5.

The first sub-partition walls SPW1 may be formed of the same material as first semiconductor layers SEM1 of the light-emitting elements (LE1, LE2, LE3, and LE4). The first sub-partition walls SPW1 and the first semiconductor layers SEM1 of the light-emitting elements (LE1, LE2, LE3, and LE4) may be formed by the same process. A thickness Tspw1 of the first sub-partition walls SPW1 may be substantially the same as a thickness Tsem1 of the first semiconductor layers SEM1 of the light-emitting elements (LE1, LE2, LE3, and LE4).

The second sub-partition walls SPW2 may be formed of the same material as electron blocking layers EBL of the light-emitting elements (LE1, LE2, LE3, and LE4). The second sub-partition walls SPW2 and the electron blocking layers EBL of the light-emitting elements (LE1, LE2, LE3, and LE4) may be formed by the same process. A thickness Tspw2 of the second sub-partition walls SPW2 may be substantially the same as a thickness Tebl of the electron blocking layers EBL of the light-emitting elements (LE1, LE2, LE3, and LE4). In a case where the electron blocking layers EBL are not provided, the second sub-partition walls SPW2 may also be omitted.

The third sub-partition walls SPW3 may be formed of the same material as active layers MQW of the light-emitting elements (LE1, LE2, LE3, and LE4). The third sub-partition walls SPW3 and the active layers MQW of the light-emitting elements (LE1, LE2, LE3, and LE4) may be formed by the same process. A thickness Tspw3 of the third sub-partition walls SPW3 may be substantially the same as a thickness Tmqw of the active layers MQW of the light-emitting elements (LE1, LE2, LE3, and LE4).

The fourth sub-partition walls SPW4 may be formed of the same material as superlattice layers SLT of the light-emitting elements (LE1, LE2, LE3, and LE4). The fourth sub-partition walls SPW4 and the superlattice layers SLT of the light-emitting elements (LE1, LE2, LE3, and LE4) may be formed by the same process. A thickness Tspw4 of the fourth sub-partition walls SPW4 may be substantially the same as a thickness Tslt of the superlattice layers SLT of the light-emitting elements (LE1, LE2, LE3, and LE4).

The fifth sub-partition walls SPW5 may be formed of the same material as second semiconductor layers SEM2 of the light-emitting elements (LE1, LE2, LE3, and LE4). The fifth sub-partition walls SPW5 and the second semiconductor layers SEM2 of the light-emitting elements (LE1, LE2, LE3, and LE4) may be formed by the same process. During the fabrication of the display panel 100, the fifth sub-partition walls SPW5 are not removed, but the second semiconductor layers SEM2 of the light-emitting elements (LE1, LE2, LE3, and LE4) may be partially removed. Thus, a thickness Tspw5 of the fifth sub-partition walls SPW5 may be greater than a thickness Tsem2 of the second semiconductor layers SEM2 of the light-emitting elements (LE1, LE2, LE3, and LE4).

Referring back to FIGS. 7, 8A, and 9, the second insulating films INS2 may be located on side surfaces of the second sub-common connecting electrodes SCCE2, side surfaces of the step compensation layers SCL, side surfaces of the connecting metal layers CNL, side surfaces of the first insulating films INS1, side surfaces of the partition walls PW, side surfaces of the second sub-pixel connecting electrodes SPCE2, side surfaces of the connecting electrodes CNE, and side surfaces of the light-emitting elements (LE1, LE2, LE3, and LE4). The second insulating films INS2 may be formed as inorganic films such as $SiO_2$ films, $Al_2O_3$ films, or $HfO_x$ films. The thickness of the second insulating films INS2 may be about 0.1 μm.

The common electrode CE may be located on the top surfaces of the light-emitting elements (LE1, LE2, LE3, and LE4), the top surfaces of the partition walls PW, the top surfaces of the second sub-common connecting electrodes SCCE2, and the second insulating films INS2. The common electrode CE may be in contact with the top surfaces of the light-emitting elements (LE1, LE2, LE3, and LE4) and the top surfaces of the partition walls PW. The common electrode CE may also be in contact with the second insulating films INS2, on the side surfaces of the second sub-common connecting electrodes SCCE2, the side surfaces of the step compensation layers SCL, the side surfaces of the connecting metal layers CNL, the side surfaces of the first insulating films INS1, the side surfaces of the partition walls PW, the side surfaces of the second sub-pixel connecting electrodes SPCE2, the side surfaces of the connecting electrodes CNE, and the side surfaces of the light-emitting elements (LE1, LE2, LE3, and LE4). The common electrode CE may be in contact with parts of the top surfaces of the second sub-common connecting electrodes SCCE that are not covered by the first insulating films INS1 and the partition walls PW.

The common electrode CE may include a transparent conductive material. The common electrode CE may be formed of a transparent conductive oxide (TCO), such as indium tin oxide (ITO) or indium zinc oxide (IZO). The thickness of the common electrode CE may be about 0.1 μm.

The reflective films RF reflect light traveling sideways (e.g., generally to the side), rather than in an upward direction, among beams of light emitted from the light-emitting elements (LE1, LE2, LE3, and LE4). The reflective films RF may be located on the side surfaces of the second sub-common connecting electrodes SCCE2, the side surfaces of the step compensation layers SCL, the side surfaces of the connecting metal layers CNL, the side surfaces of the first insulating films INS1, the side surfaces of the partition walls PW, the side surfaces of the second sub-pixel connecting electrodes SPCE2, the side surfaces of the connecting electrodes CNE, and the side surfaces of the light-emitting elements (LE1, LE2, LE3, and LE4). That is, the reflective films RF may be in contact with the common electrode CE on the side surfaces of the second sub-common connecting electrodes SCCE2, the side surfaces of the step compensation layers SCL, the side surfaces of the connecting metal layers CNL, the side surfaces of the first insulating films INS1, the side surfaces of the partition walls PW, the side surfaces of the second sub-pixel connecting electrodes SPCE2, the side surfaces of the connecting electrodes CNE, and the side surfaces of the light-emitting elements (LE1, LE2, LE3, and LE4).

The reflective films RF may include a metallic material with high reflectance, such as Al or Ag. In this case, the thickness of the reflective films RF may be about 0.1 μm, but the present disclosure is not limited thereto.

Alternatively, the reflective films RF may be distributed Bragg reflectors. In this case, each of the reflective films RF may have a structure in which a plurality of high refractive index layers and a plurality of low refractive index layers are alternately stacked.

As illustrated in FIGS. 7 through 9, as the pixel connecting electrodes (PCE1, PCE2, PCE3, and PCE4), which connect the light-emitting elements (LE1, LE2, LE3, and LE4) and the pixel electrodes (PXE1, PXE2, PXE3, and PXE4), are provided, the light-emitting elements (LE1, LE2, LE3, and LE4) and the pixel electrodes (PXE1, PXE2, PXE3, and PXE4) can be properly connected even if the light-emitting elements (LE1, LE2, LE3, and LE4) and the pixel electrodes (PXE1, PXE2, PXE3, and PXE4) do not overlap in the third direction DR3. Accordingly, the light-emitting elements (LE1, LE2, LE3, and LE4) can be arranged without regard to the layout of the pixel electrodes (PXE1, PXE2, PXE3, and PXE4) of the semiconductor circuit board 110.

Meanwhile, referring to FIG. 8B, a third connecting insulating film CINS3 may be additionally located on the pixel circuit units (PXC1, PXC2, PXC3, and PXC4). The top surface of the third connecting insulating film CINS3, like the top surfaces of the pixel circuit units (PXC1, PXC2, PXC3, and PXC4) and the top surfaces of the common voltage electrodes CVE, may be substantially flat. In this case, the third connecting insulating film CINS3 may be in contact with side surfaces of the pixel electrodes (PXE1, PXE2, PXE3, and PXE4) and side surfaces of the common voltage electrodes CVE.

Figure 12:
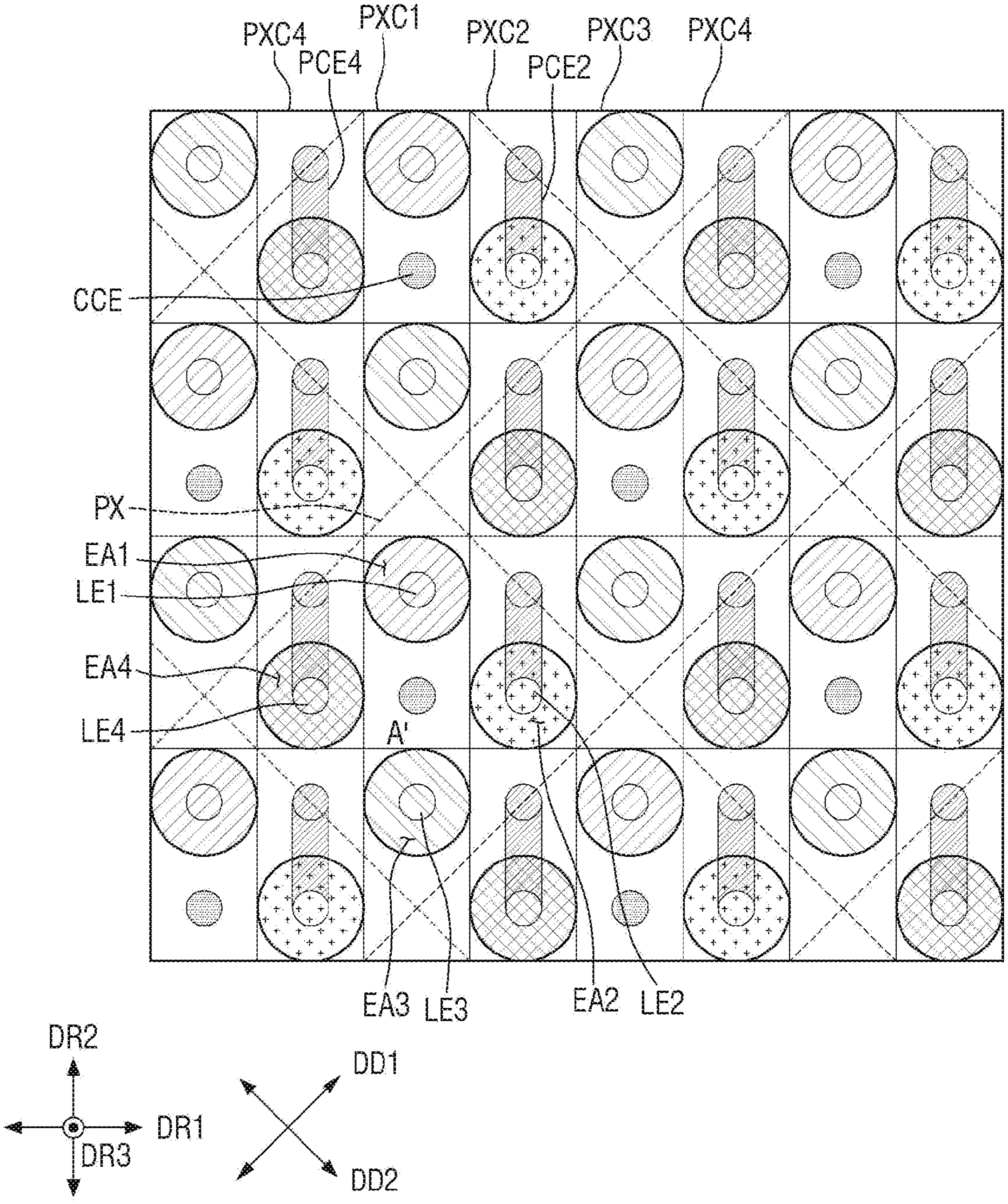
FIG. 12 is a layout view of a display area of a display panel according to other embodiments of the present disclosure.

FIG. 12 is a layout view of a display area of a display panel according to other embodiments of the present disclosure.

The embodiments corresponding to FIG. 12 differ from the embodiments corresponding to FIG. 3A in that one common connecting electrode CCE is provided in each pixel PX. That is, in the embodiments corresponding to FIG. 3A, a common connecting electrode CCE is located between each adjacent pair of second and fourth light-emitting elements LE2 and LE4 that are adjacent to each other in a first direction DR1, but in the embodiments corresponding to FIG. 12, only one common connecting electrode CCE may be located in each pixel PX (e.g., one common connecting electrode CCE may be located in each first pixel circuit PXC1, while being omitted from each third pixel circuit PXC3). Thus, a detailed description of the embodiments corresponding to FIG. 12 will be omitted.

Figure 13A:
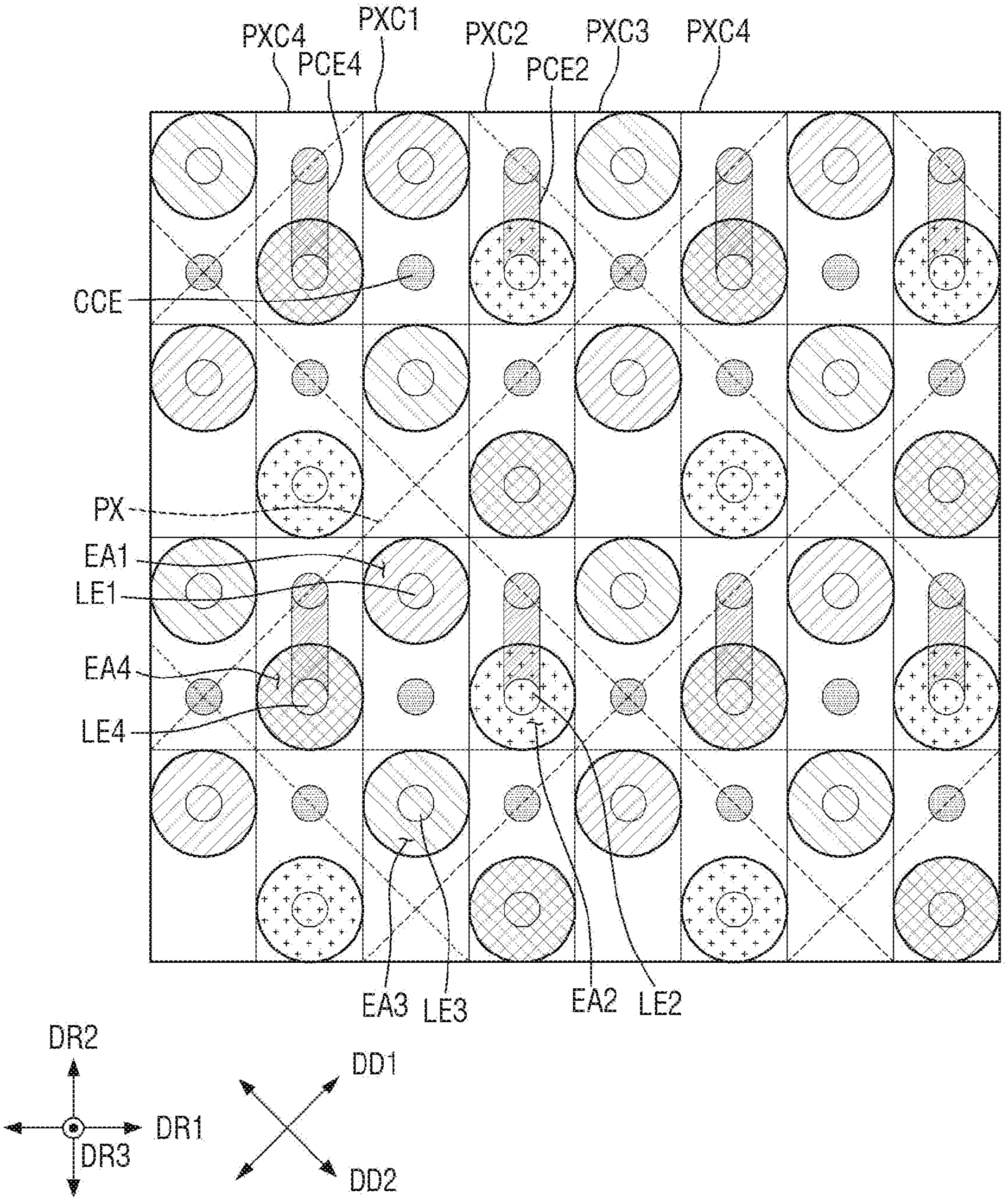
FIGS. 13A and 13B are layout views of a display area of a display panel according to other embodiments of the present disclosure.
Figure 13B:
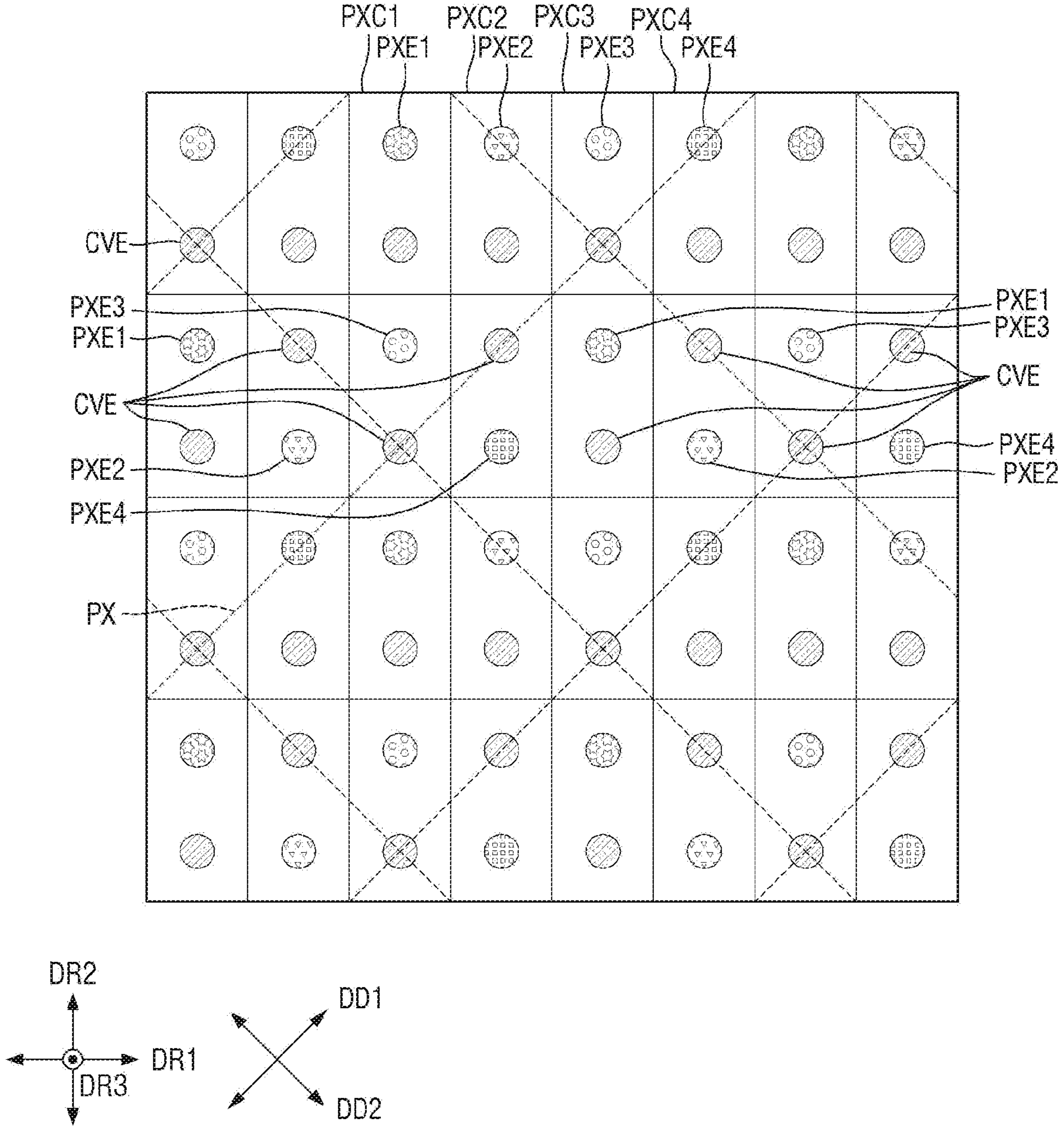

FIGS. 13A and 13B are layout views of a display area of a display panel according to other embodiments of the present disclosure.

The embodiments corresponding to FIGS. 13A and 13B differ from the embodiments corresponding to FIG. 3A in that in each of even rows, common connecting electrodes CCE and second pixel electrodes PXE2 are located in upper parts and lower parts, respectively, of second pixel circuit units PXC2, and common connecting electrodes CCE and fourth pixel electrodes PXE4 are located in upper parts and lower parts, respectively, of fourth pixel circuit units PXC4 (e.g., the common connecting electrodes CCE may be omitted from the first and third pixel circuit units PXC1 and PXC3 in the even rows). Second pixel connecting electrodes PCE2 and fourth pixel connecting electrodes PCE4 are not illustrated in even rows in FIGS. 13A and 13B because in each of the even rows, the second pixel connecting electrodes PCE2 completely overlap with second light-emitting elements LE2 in a third direction DR3, and the fourth pixel connecting electrodes PCE4 completely overlap with fourth light-emitting elements LE4 in the third direction DR3.

That is, the embodiments corresponding to FIGS. 13A and 13B differ from the embodiments corresponding to FIG. 3A only in that a common connecting electrode CCE is located between each pair of light-emitting elements that are adjacent in a second direction DR2, and thus, a detailed description thereof will be omitted.

Figure 14A:
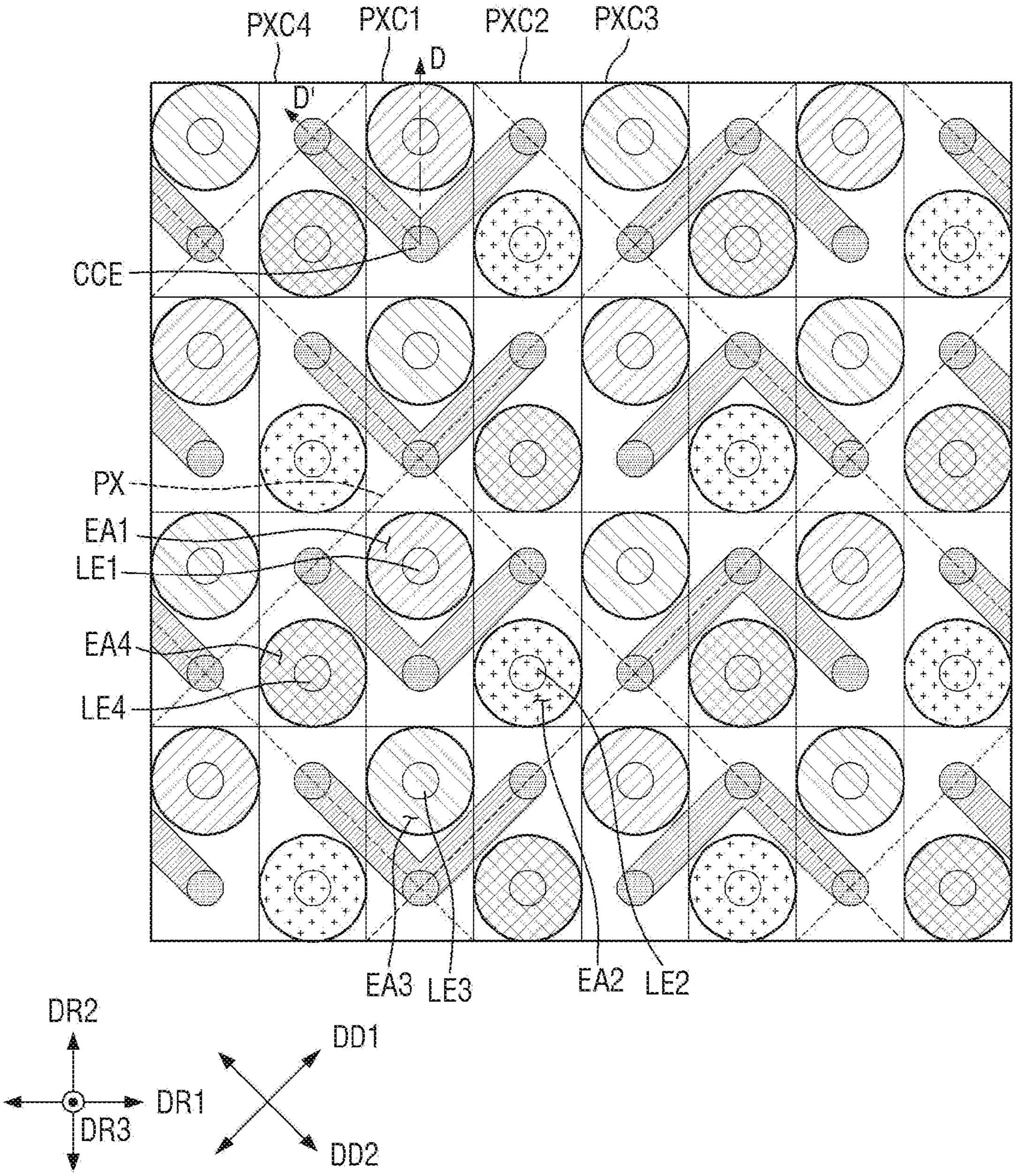
FIGS. 14A and 14B are layout views of a display area of a display panel according to other embodiments of the present disclosure.
Figure 14B:
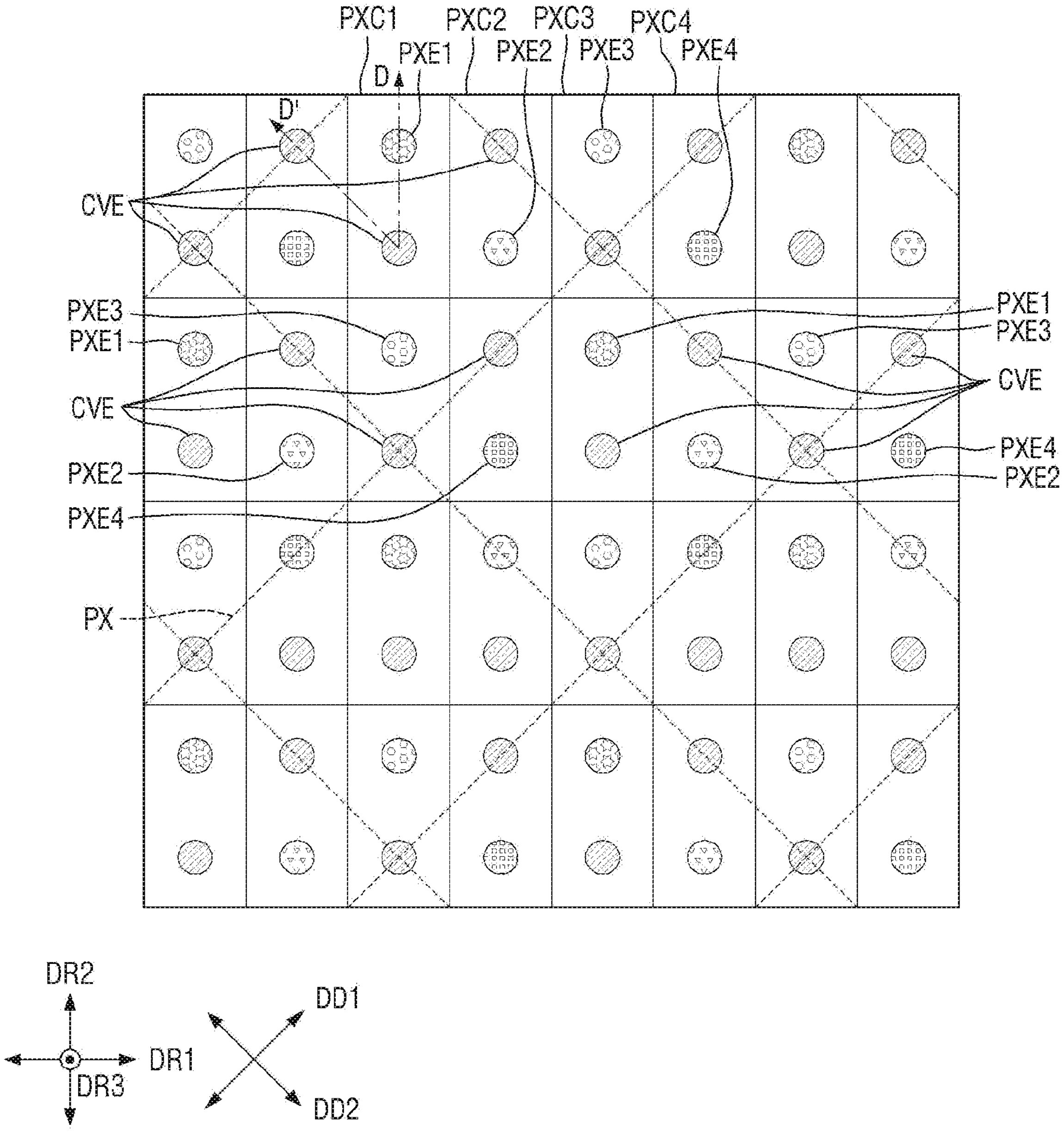
Figure 15:
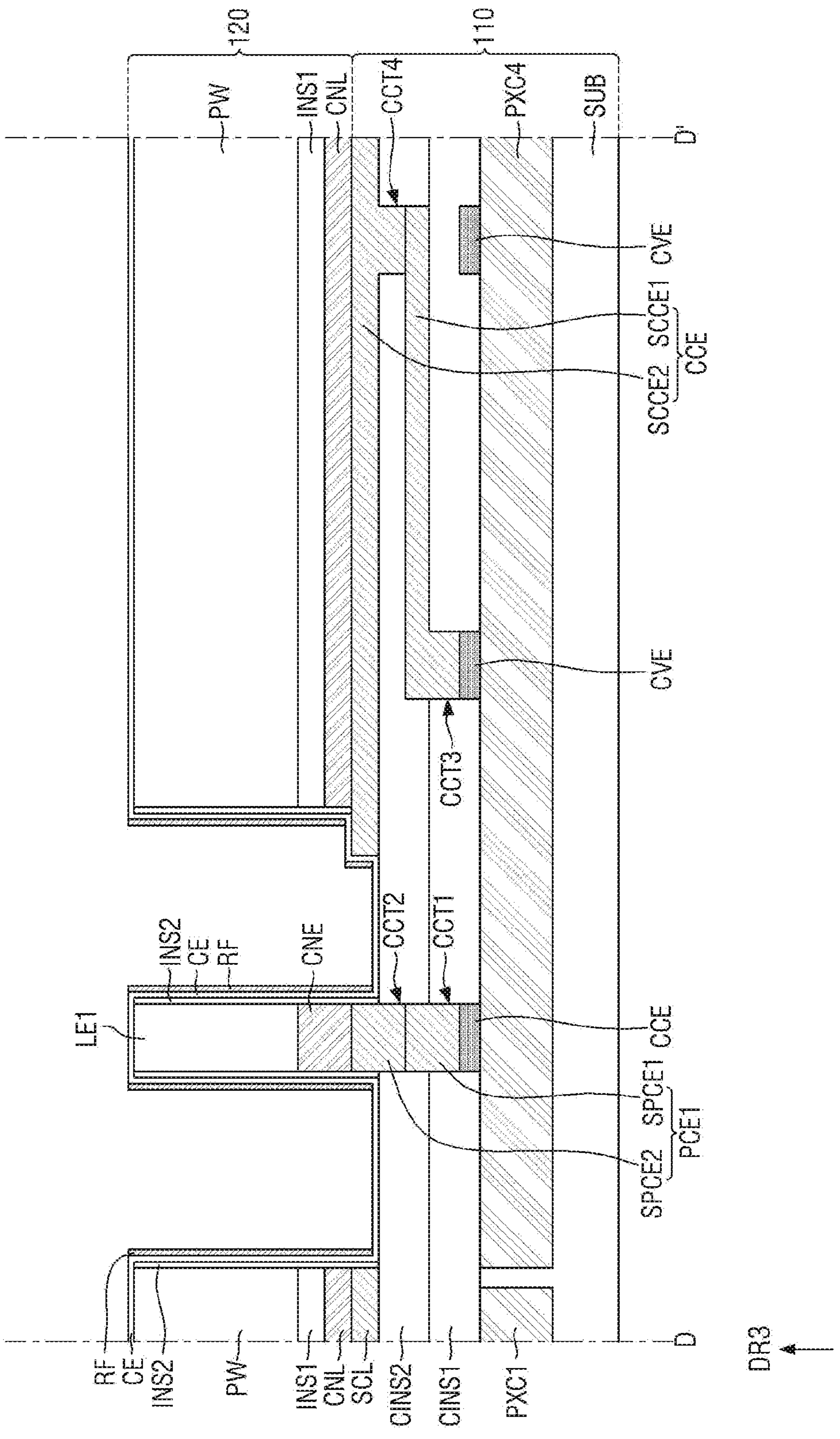
FIG. 15 is a cross-sectional view taken along the line D-D' of FIGS. 14A and 14B.

FIGS. 14A and 14B are layout views of a display area of a display panel according to other embodiments of the present disclosure. FIG. 15 is a cross-sectional view taken along the line D-D' of FIGS. 14A and 14B.

For convenience, FIG. 14A only illustrates a plurality of light-emitting elements (LE1, LE2, LE3, and LE3), a plurality of emission areas (EA1, EA2, EA3, and EA4), and common connecting electrodes CCE, and FIG. 14B only illustrates common voltage electrodes CVE and a plurality of pixel electrodes (PXE1, PXE2, PXE3, and PXE4). The embodiments corresponding to FIGS. 14A, 14B, and 15 differ from the embodiments corresponding to FIGS. 3 and 7 through 9 in that the common connecting electrodes CCE extend in first and second diagonal directions DD1 and DD2. The embodiments corresponding to FIGS. 14A, 15B, and 15 will hereinafter be described, focusing mainly on the differences with the embodiments corresponding to FIGS. 3A, 3B, and 7 through 9.

Referring to FIGS. 14A, 14B, and 15, the pixel electrodes (PXE1, PXE2, PXE3, and PXE4) may be located alternately in upper parts and lower parts of each of arrays of pixel circuit units (PXC1, PXC2, PXC3, and PXC4) that are arranged in a first direction DR1. The common voltage electrodes CVE may be located alternately in the lower parts and the upper parts of each of the arrays of pixel circuit units (PXC1, PXC2, PXC3, and PXC4) that are arranged in the first direction DR1. For example, in a case where a first pixel electrode PXE1 and a common voltage electrode CVE are located in upper and lower parts, respectively, of a first pixel circuit unit PXC1, a common voltage electrode CVE and a second pixel electrode PXE2 may be located in upper and lower parts, respectively, of a second pixel circuit unit PXC2. For example, in a case where a third pixel electrode PXE3 and a common connecting electrode CCE are located in upper and lower parts, respectively, of a third pixel circuit unit PXC3, a common connecting electrode CCE and a fourth pixel electrode PXE4 may be located in upper and lower parts, respectively, of a fourth pixel circuit unit PXC4.

Each of the common connecting electrodes CCE may extend from the upper or lower side of one of first, second, third, and fourth pixel circuit units PXC1, PXC2, PXC3, and PXC4 to the lower or upper side of one or more neighboring pixel circuit units. For example, a common connecting electrode CCE may extend from the lower side of a first pixel circuit unit PXC1 to the upper side of a fourth pixel circuit unit PXC4 adjacent to the first pixel circuit unit PXC1, and to the upper side of a second pixel circuit unit PXC2 adjacent to the first pixel circuit unit PXC1. That is, each of the common connecting electrodes CCE may be located in three pixel circuit units that are adjacent to one another in the first direction DR1. In this case, the common connecting electrodes CCE may not overlap with the light-emitting elements (LE1, LE2, LE3, and LE3) in a third direction DR3.

Figure 16A:
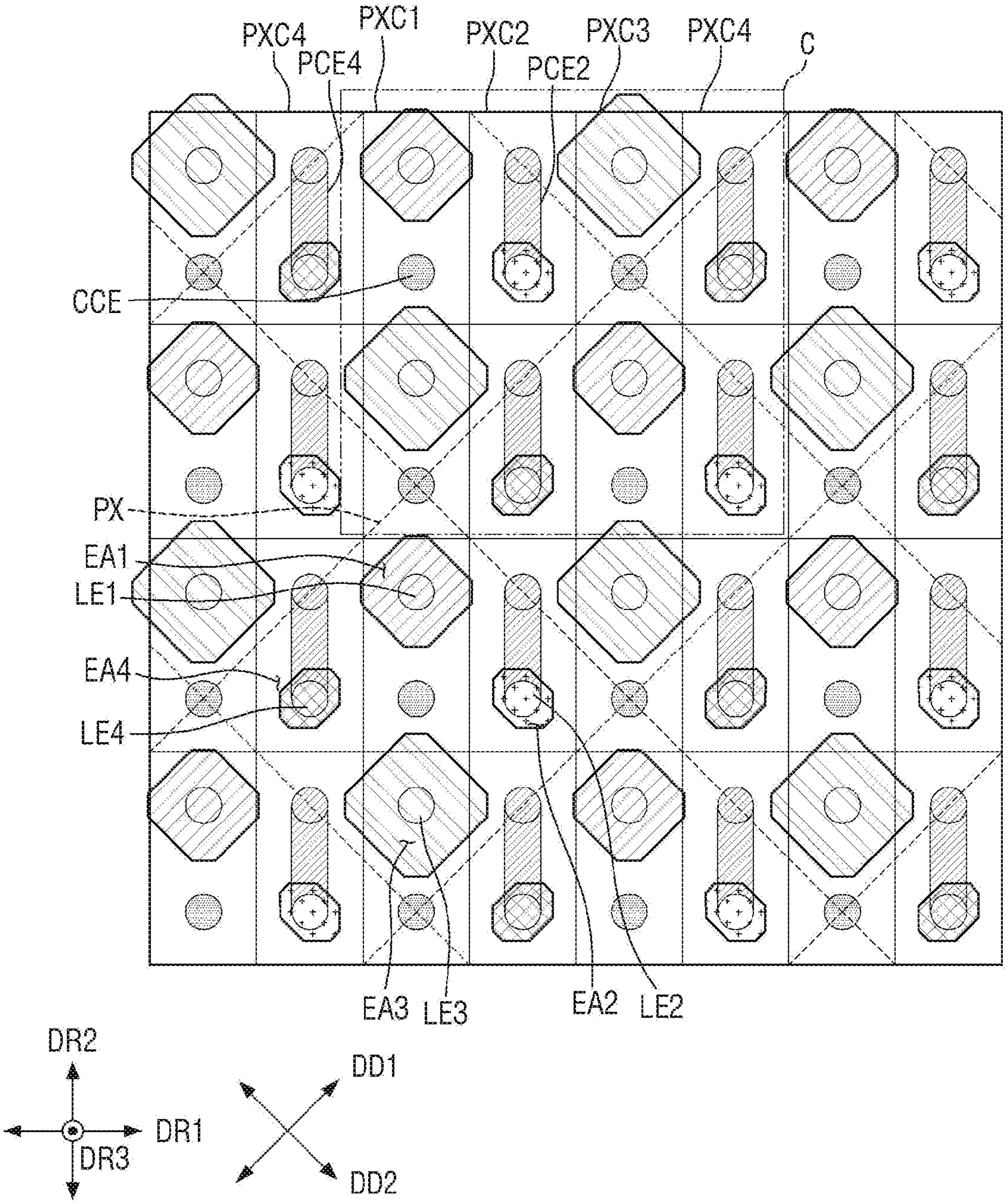
FIGS. 16A and 16B are layout views of a display area of a display panel according to other embodiments of the present disclosure.
Figure 16B:
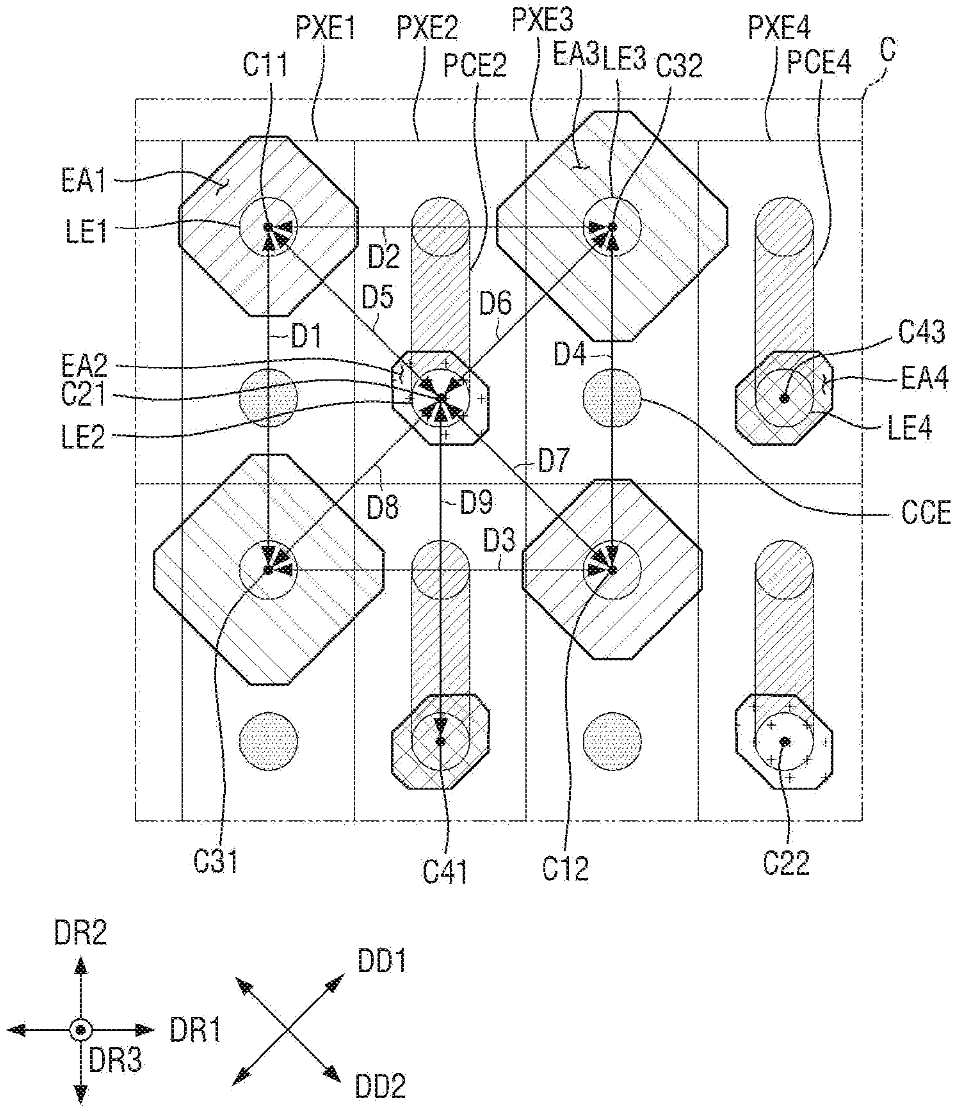

FIGS. 16A and 16B are layout views of a display area of a display panel according to other embodiments of the present disclosure.

The embodiments corresponding to FIGS. 16A and 16B differ from the embodiments corresponding to FIG. 3A in that third emission areas EA3 are largest in size while second emission areas EA2 and fourth emission areas EA4 are smallest in size. The embodiments corresponding to FIGS. 16A and 16B will hereinafter be described, focusing mainly on the differences with the embodiments corresponding to FIG. 3A.

Referring to FIGS. 16A and 16B, the first emission areas EA1 and the third emission areas EA3 may have (e.g., generally) a rectangular shape (such as a rhombus shape) or an octagonal shape in a plan view, and the second emission areas EA2 and the fourth emission areas EA4 may have an octagonal shape in a plan view. The second emission areas EA2 may extend in a second diagonal direction DD2, but the fourth emission areas EA4 may extend in a first diagonal direction DD1.

Referring to FIG. 16B, a center C31 of a third emission area EA3 on a first side, in the first diagonal direction DD1, of a second emission area EA2, a center C32 of a third emission area EA3 on a second side, in the first diagonal direction DD1, of the second emission area EA2, a center C11 of a first emission area EA1 on a first side, in the second diagonal direction DD2, of the second emission area EA2, and a center C12 of a first emission area EA1 on a second side, in the second diagonal direction DD2, of the second emission area EA2 may form a square shape in a plan view.

That is, a distance D1 from the center C11 of the first emission area EA1 on the first side, in the second diagonal direction DD2, of the second emission area EA2 to the center C31 of the third emission area EA3 on the first side, in the first diagonal direction DD1, of the second emission area EA2, may be substantially equal to a distance D2 from the center C11 to the center C32 of the third emission area EA3 on the second side, in the first diagonal direction DD1, of the second emission area EA2, which may also be substantially equal to a distance D3 from the center C12 of the first emission area EA1 on the second side, in the second diagonal direction DD2, of the second emission area EA2 to the center C31, and may also be substantially equal to a distance D4 between the center C12 and the center C32.

Also, a distance D5 between a center C21 of the second emission area EA2 and the center C11, and a distance D6 between the center C21 and the center C32 may be substantially the same. Also, a distance D7 between the center C21 and the center C12, and a distance D8 between the center C21 and the center C31 may be substantially the same.

Also, the distance D5 between the center C21 and the center C11, and the distance D6 between the center C21 and the center C32, may be smaller than a distance D9 between the center C21 and a center C41 of a neighboring fourth emission area EA4. Also, the distance D7 between the center C21 and the center C12, and the distance D8 between the center C21 and the center C31, may be smaller than the distance D9 between the center C21 and the center C41.

Figure 17A:
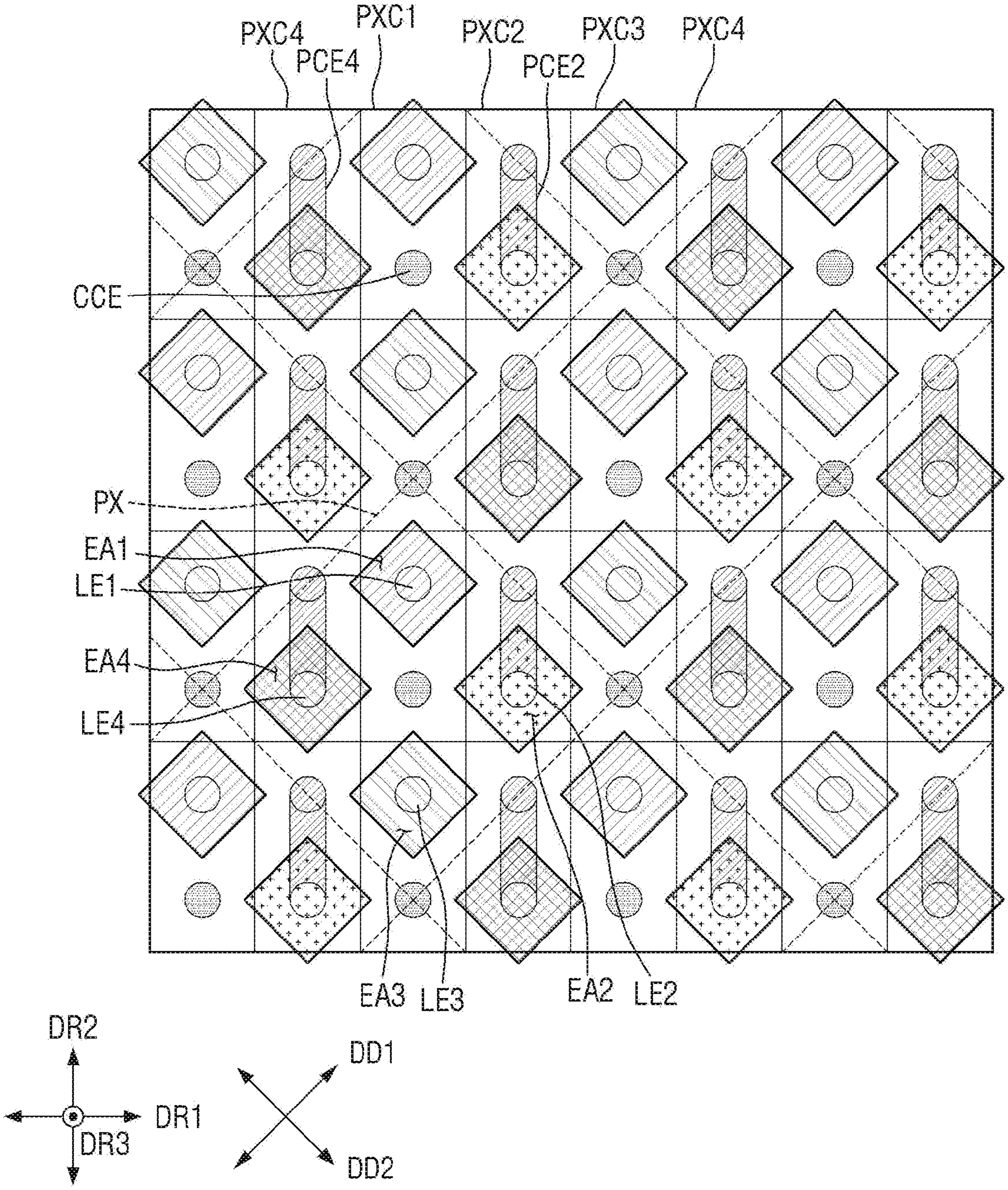
FIG. 17A is a layout view of a display area of a display panel according to other embodiments of the present disclosure.

FIG. 17A is a layout view of a display area of a display panel according to other embodiments of the present disclosure.

The embodiments corresponding to FIG. 17A differ from the embodiments corresponding to FIGS. 3A and 3B in that first emission areas EA1, second emission areas EA2, third emission areas EA3, and fourth emission areas EA4, defined by partition walls PW, have a rhombus shape in a plan view. That is, each of the first, second, third, and fourth emission areas EA1, EA2, EA3, and EA4 may have two sides extending in a first diagonal direction DD1 and two sides extending in a second diagonal direction DD2.

Figure 17B:
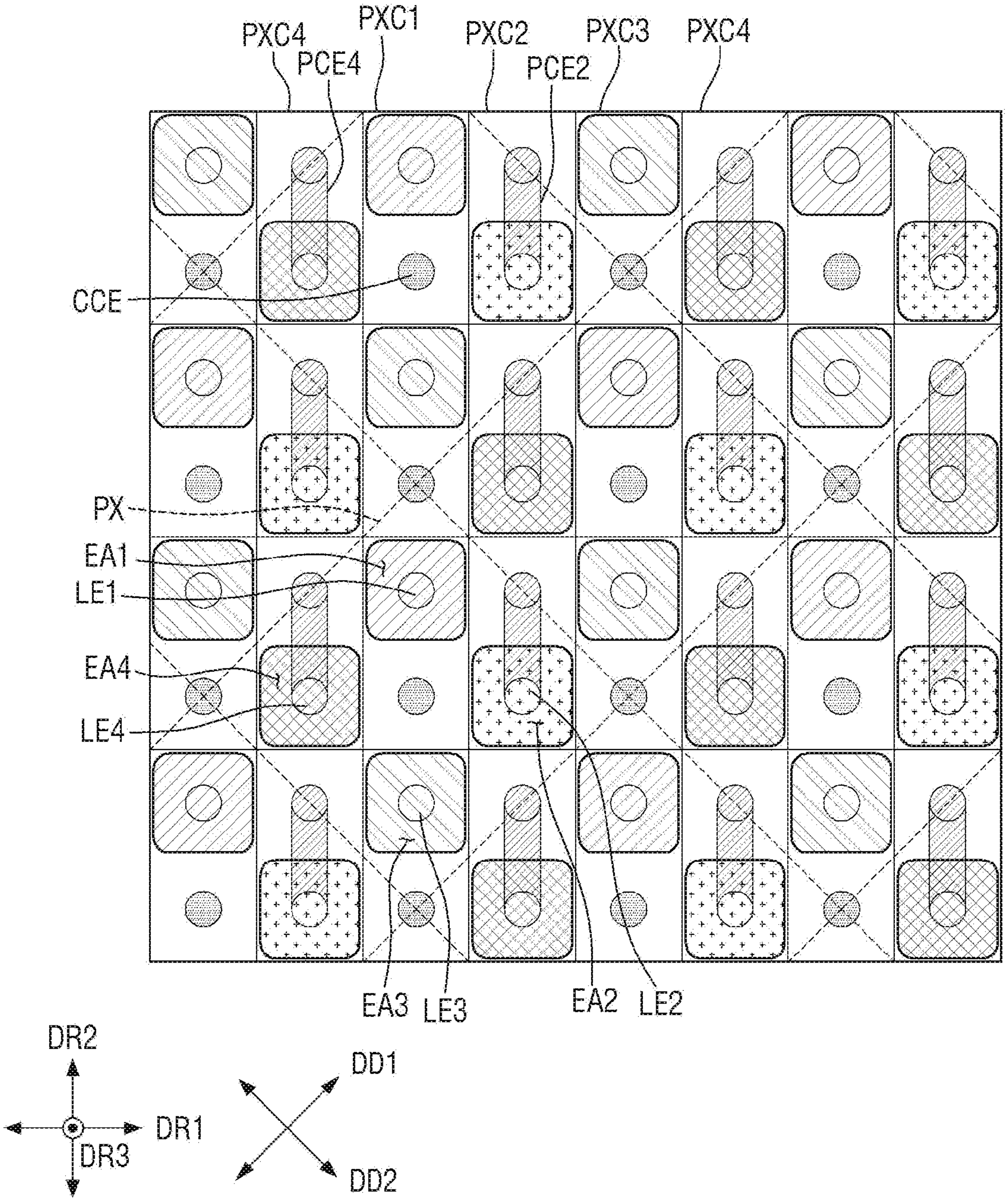
FIG. 17B is a layout view of a display area of a display panel according to other embodiments of the present disclosure.

FIG. 17B is a layout view of a display area of a display panel according to other embodiments of the present disclosure.

The embodiments corresponding to FIG. 17B differ from the embodiments corresponding to FIGS. 3A and 3B in that first, second, third, and fourth emission areas EA1, EA2, EA3, and EA4, defined by partition walls PW, have a rectangular shape with rounded corners in a plan view. That is, each of the first, second, third, and fourth emission areas EA1, EA2, EA3, and EA4 may have two sides extending in a direction DR1 and two sides extending in a second direction DR2.

Figure 18:
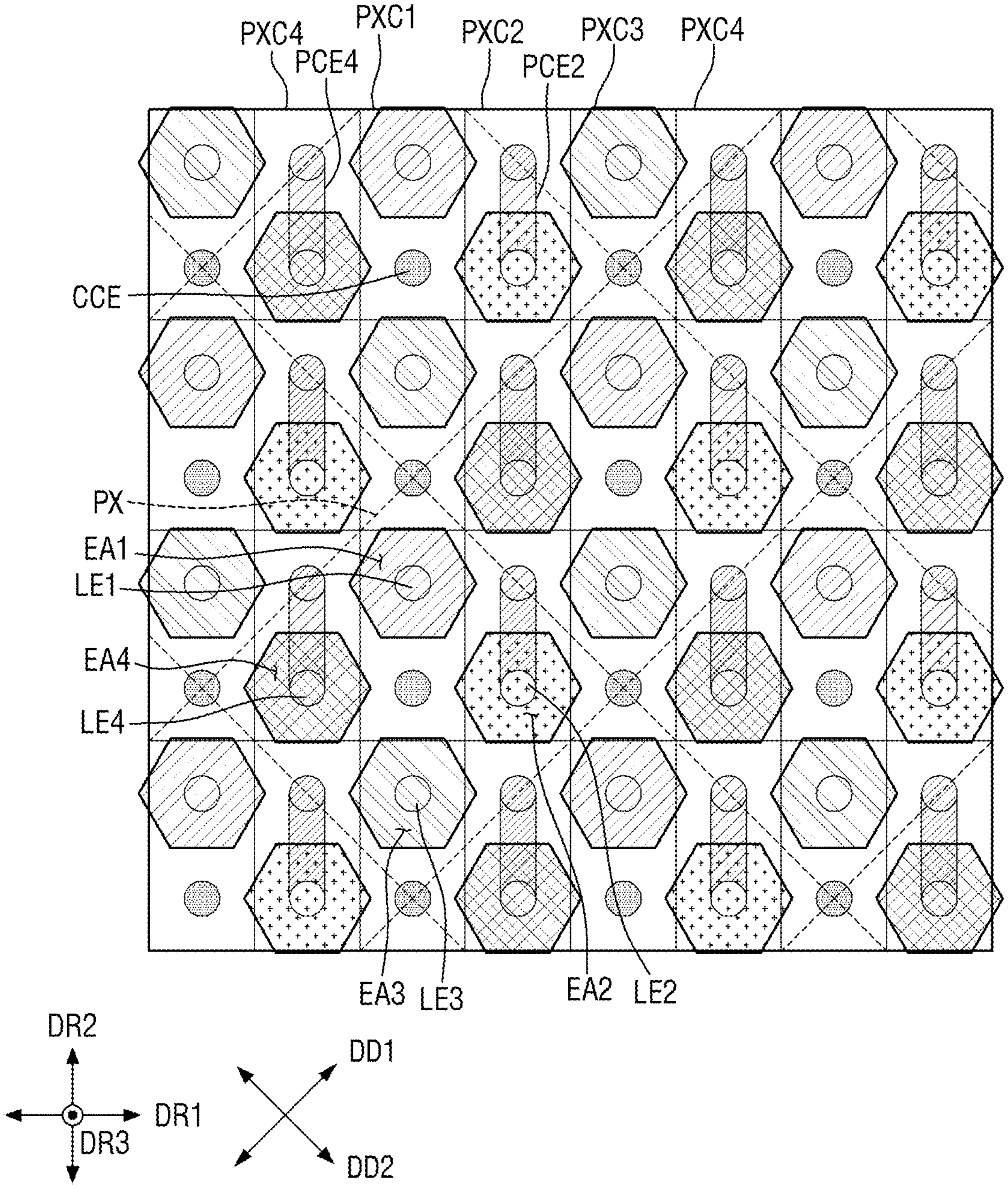
FIG. 18 is a layout view of a display area of a display panel according to other embodiments of the present disclosure.

FIG. 18 is a layout view of a display area of a display panel according to other embodiments of the present disclosure.

The embodiments corresponding to FIG. 18 differ from the embodiments corresponding to FIGS. 3A and 3B in that first, second, third, and fourth emission areas EA1, EA2, EA3, and EA4, defined by partition walls PW, have a hexagonal shape in a plan view. For example, the first, second, third, and fourth emission areas EA1, EA2, EA3, and EA4 may have a hexagonal shape having two sides extending in a first direction DR1, in a plan view.

Meanwhile, the planar shape of first, second, third, and fourth emission areas EA1, EA2, EA3, and EA4, defined by partition walls PW is not limited to those illustrated in FIGS. 3A, 3B, and 16 through 18. That is, the first, second, third, and fourth emission areas EA1, EA2, EA3, and EA4 may have various other shapes such as a circular shape, a polygonal shape, an elliptical shape, or an amorphous shape in a plan view.

Figure 19:
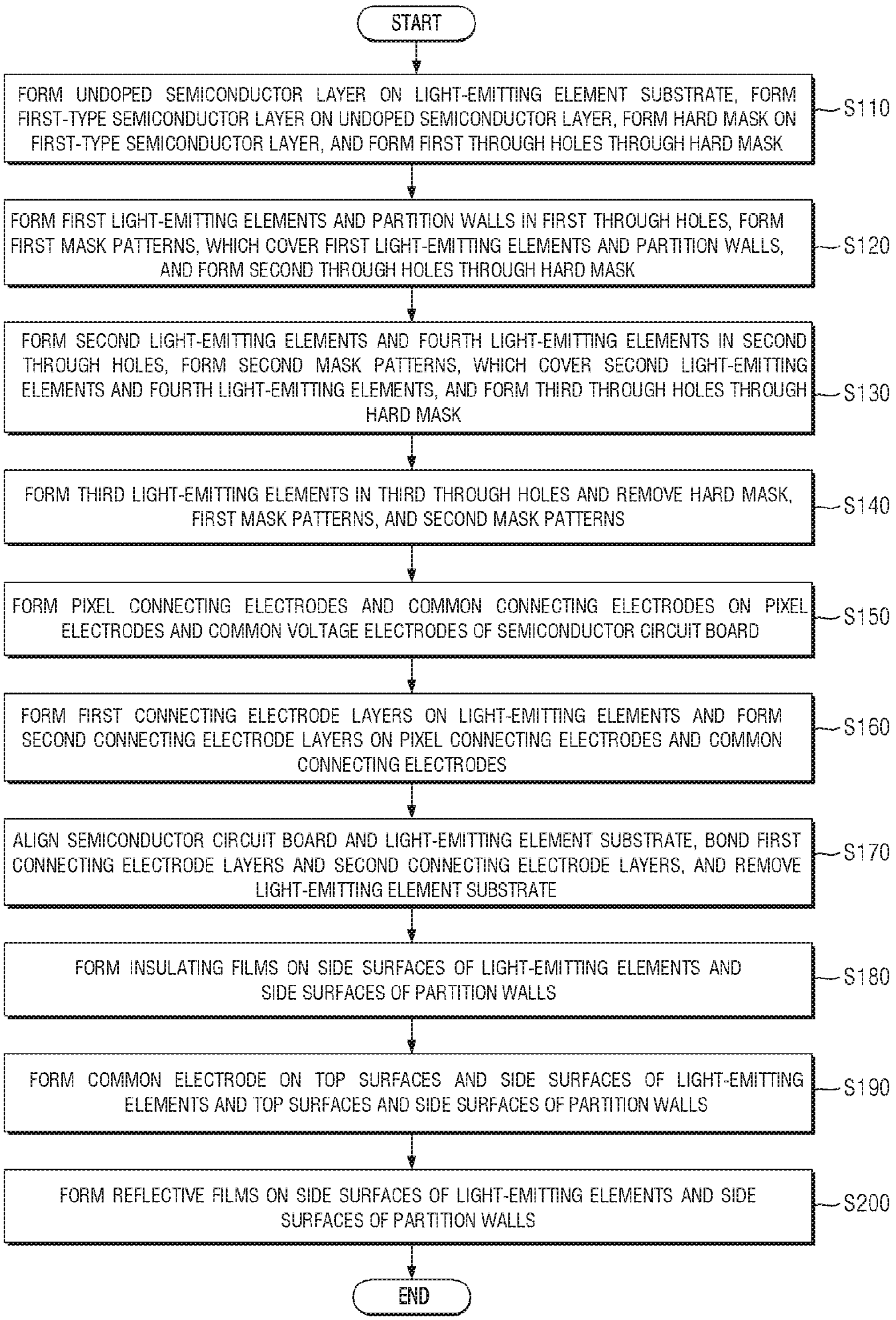
FIG. 19 is a flowchart illustrating a method of fabricating a display device according to some embodiments of the present disclosure.

FIG. 19 is a flowchart illustrating a method of fabricating a display device according to some embodiments of the present disclosure. FIGS. 20 through 29 are cross-sectional views illustrating the method of FIG. 19. FIGS. 20 through 29 are cross-sectional views, taken along the line A-A' of FIG. 3A or 3B, of a display panel obtained by the method of FIG. 19. A method of fabricating a display device according to some embodiments of the present disclosure will hereinafter be described with reference to FIGS. 19 through 29.

Figure 20:
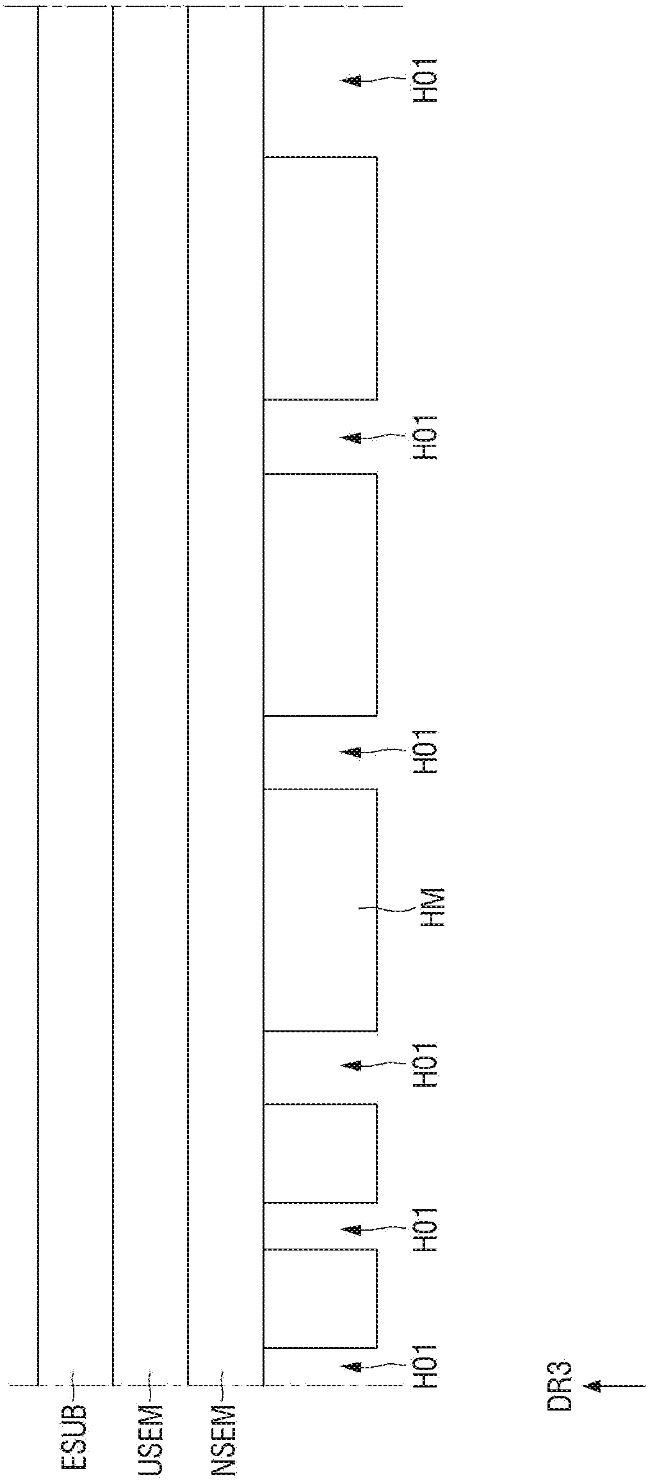
FIGS. 20 through 29 are cross-sectional views illustrating the method of FIG. 19.

First, referring to FIGS. 19 and 20, an undoped semiconductor layer USEM is formed on a light-emitting element substrate ESUB, a first-type semiconductor layer NSEM is formed on the undoped semiconductor layer USEM, and first insulating films INS1 are formed on the first-type semiconductor layer NSEM (S110).

The light-emitting element substrate ESUB may be a sapphire substrate or a silicon substrate.

The undoped semiconductor layer USEM is formed on one surface of the light-emitting element substrate ESUB. The undoped semiconductor layer USEM may be formed by growing seed crystals through epitaxial growth. For example, the undoped semiconductor layer USEM may be formed by any one of electron beam deposition, physical vapor deposition (PVD), chemical vapor deposition (CVD), plasma laser deposition (PLD), dual-type thermal evaporation, sputtering, and metal organic chemical vapor deposition (MOCVD).

The type of precursor material for forming the undoped semiconductor layer USEM is not particularly limited. For example, the precursor material may be a metal precursor including an alkyl group such as a methyl group or an ethyl group. For example, the precursor material may be a compound such as trimethyl gallium ($Ga(CH_3)_3$), trimethyl aluminum ($Al(CH_3)_3$), or triethyl phosphate ($(C_2H_5)_3PO_4$), but the present disclosure is not limited thereto.

The undoped semiconductor layer USEM may include a plurality of layers. The undoped semiconductor layer USEM may be provided to reduce the difference in lattice constant between the first-type semiconductor layer NSEM and the light-emitting element substrate ESUB. The undoped semiconductor layer USEM may include a semiconductor material not doped with an n-type or p-type dopant. For example, the undoped semiconductor layer USEM may be at least one of InAlGaN, GaN, AlGaN, InGaN, AlN, and InN that are not doped, but the present disclosure is not limited thereto.

Thereafter, the first-type semiconductor layer NSEM is formed on the surface of the undoped semiconductor layer USEM. The first-type semiconductor layer NSEM may be formed in similar manner to the undoped semiconductor layer USEM, and thus, a detailed description thereof will be omitted.

The first-type semiconductor layer NSEM may include an n-type semiconductor layer doped with an n-type dopant such as Si, Ge, or Sn. For example, the first-type semiconductor layer NSEM may be at least one of InAlGaN, GaN, AlGaN, InGaN, AlN, and InN, but the present disclosure is not limited thereto.

Thereafter, a hard mask HM is formed on the first-type semiconductor layer NSEM (S110). The hard mask HM may be formed as an inorganic film such as a $SiO_2$ film, an $Al_2O_3$ film, or a $HfO_x$ film, but the present disclosure is not limited thereto.

Thereafter, first through holes HO1, which penetrate the hard mask HM, are formed by photolithography (S110).

Figure 21:
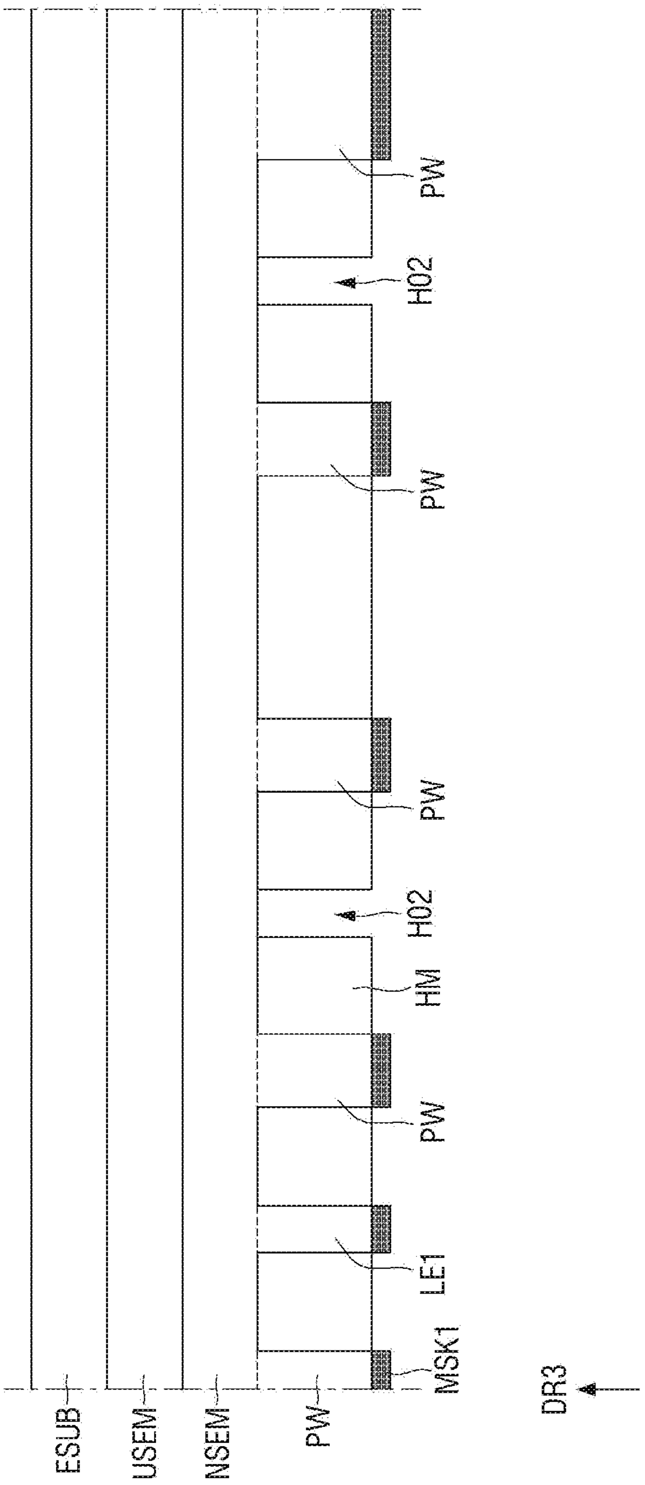

Second, referring to FIGS. 19 and 21, first light-emitting elements LE1 and partition walls PW are formed in the first through holes HO1, first mask patterns MSK1, which cover the first light-emitting elements LE1 and the partition walls PW, are formed, and second through holes HO2, which penetrate the hard mask HM, are formed (S120).

Second semiconductor layers SEM2 are formed on parts of the first-type semiconductor layer NSEM, exposed by the first through holes HO1. The second semiconductor layers SEM2 may include the same material as the first-type semiconductor layer NSEM.

Thereafter, a superlattice layer SLT, an active layer MQW, an electron blocking layer EBL, and a first semiconductor layer SEM1 are sequentially formed in each of the first through holes HO1. In a case where the active layer MQW includes InGaN, the In content of the active layer MQW may be 35% or greater. In this manner, the first light-emitting elements LE1, which emit first light, and the partition walls PW may be formed in the first through holes HO1. The maximum width, in a horizontal direction (e.g., a horizontal width), of the partition walls PW may be greater than the maximum width, in the horizontal direction, of the first light-emitting elements LE1.

Thereafter, the first mask patterns MSK1, which cover the first light-emitting elements LE1, may be formed. The first mask patterns MSK1 may be formed as inorganic films such as $SiO_2$ films, $Al_2O_3$ films, or $HfO_x$ films, but the present disclosure is not limited thereto.

Thereafter, the second through holes HO2, which penetrate the hard mask HM, are formed by photolithography.

Figure 22:
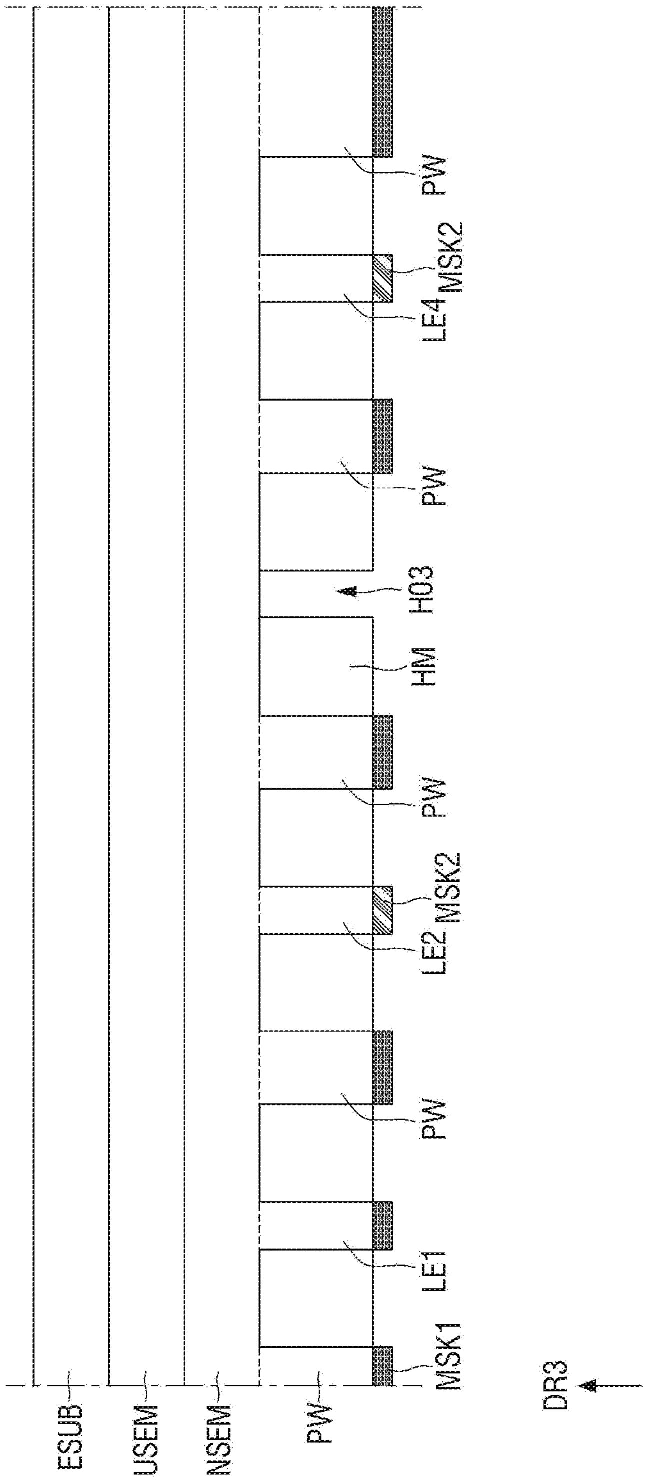

Third, referring to FIGS. 19 and 22, second light-emitting elements LE2 and fourth light-emitting elements LE4 are formed in the second through holes HO2, second mask patterns MSK2, which cover the second light-emitting elements LE2 and the fourth light-emitting elements LE4, are formed, and third through holes HO3, which penetrate the hard mask HM, are formed (S130).

The second semiconductor layers SEM2 are formed on parts of the first-type semiconductor layer NSEM, exposed by the second through holes HO2. The second semiconductor layers SEM2 may include the same material as the first-type semiconductor layer NSEM.

Thereafter, superlattice layers SLT, active layers MQW, electron blocking layers EBL, and first semiconductor layers SEM1 are sequentially formed in the second through holes HO2. In a case where the active layers MQW include InGaN, the In content of the active layers MQW may be about 25%. In this manner, the second light-emitting elements LE2, which emit second light, may be formed in the second through holes HO2.

As the first light-emitting elements LE1 and the partition walls PW are masked by the first mask patterns MSK1, the second semiconductor layers SEM2, the superlattice layers SLT, the active layers MQW, the electron blocking layers EBL, and the first semiconductor layers SEM1, formed in the second through holes HO2, may not be formed on the first light-emitting elements LE1 and the partition walls PW.

Thereafter, the second mask patterns MSK2, which cover the second light-emitting elements LE2 and the fourth light-emitting elements LE4, may be formed. The second mask patterns MSK2 may be formed as inorganic films such as $SiO_2$ films, $Al_2O_3$ films, or $HfO_x$ films.

Thereafter, the third through holes HO3, which penetrate the hard mask HM, are formed.

Figure 23:
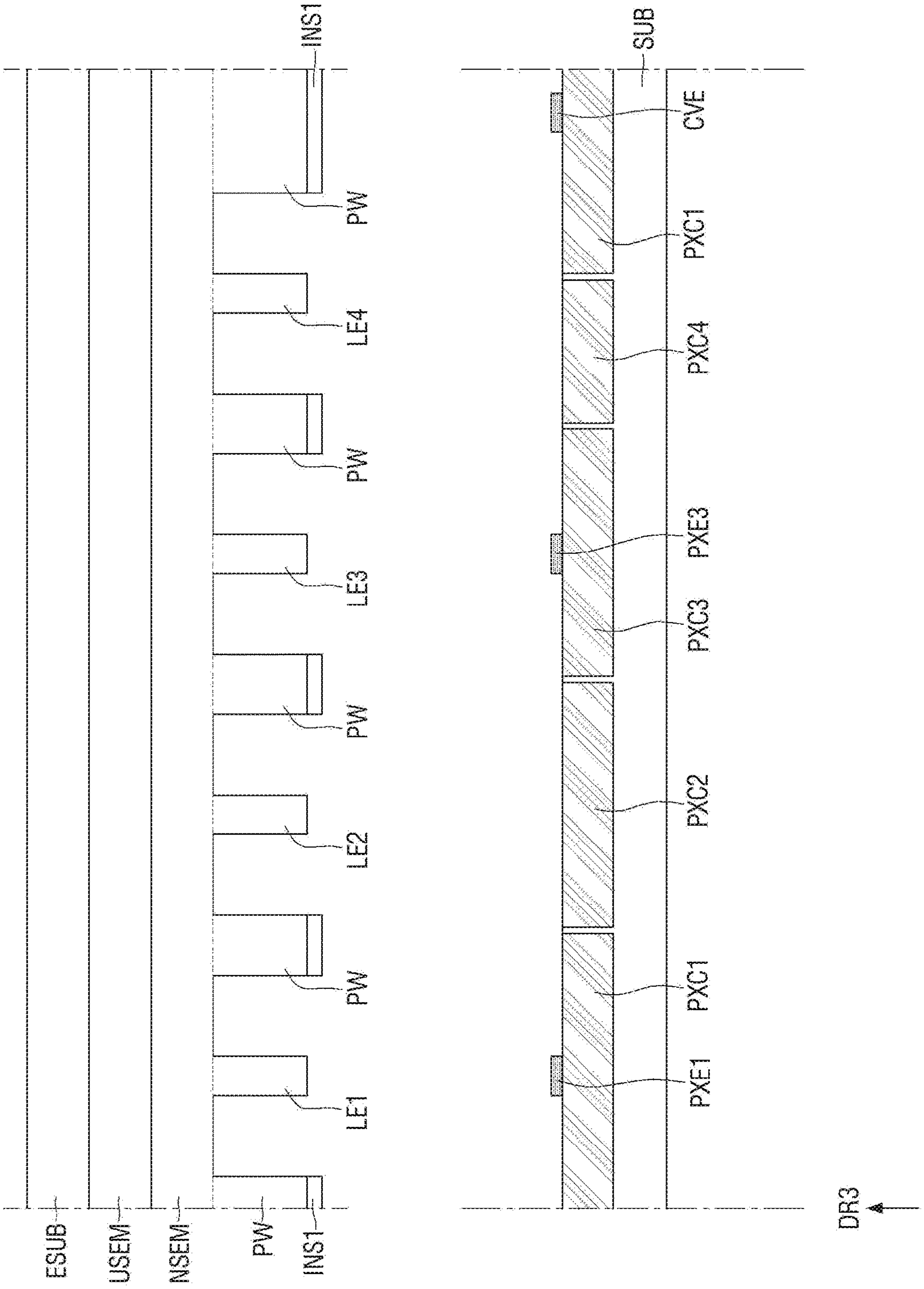

Fourth, referring to FIGS. 19 and 23, third light-emitting elements LE3 are formed in the third through holes HO3, and the hard mask HM, the first mask patterns MSK1, and the second mask patterns MSK2 are removed (S140).

Second semiconductor layers SEM2 are formed on parts of the first-type semiconductor layer NSEM, exposed by the third through holes HO3. The second semiconductor layers SEM2 may include the same material as the first-type semiconductor layer NSEM.

Thereafter, superlattice layers SLT, active layers MQW, electron blocking layers EBL, and first semiconductor layers SEM1 are sequentially formed in the third through holes HO3. In a case where the active layers MQW include InGaN, the In content of the active layers MQW may be about 15%. In this manner, the third light-emitting elements LE3, which emit third light, may be formed in the third through holes HO3.

As the first light-emitting elements LE1 and the partition walls PW are masked by the first mask patterns MSK1, and as the second light-emitting elements LE2 and the fourth light-emitting elements LE4 are masked by the second mask patterns MSK2, the second semiconductor layers SEM2, the superlattice layers SLT, the active layers MQW, the electron blocking layers EBL, and the first semiconductor layers SEM1, formed in the third through holes HO3, may not be formed on the first light-emitting elements LE1, the second light-emitting elements LE2, the fourth light-emitting elements LE4, and the partition walls PW.

Thereafter, the hard mask HM, the first mask patterns MSK1, and the second mask patterns MSK2 may be removed by etching. First mask patterns MSK1 on the partition walls PW may not be removed, but may remain as the first insulating films INS1.

Figure 24:
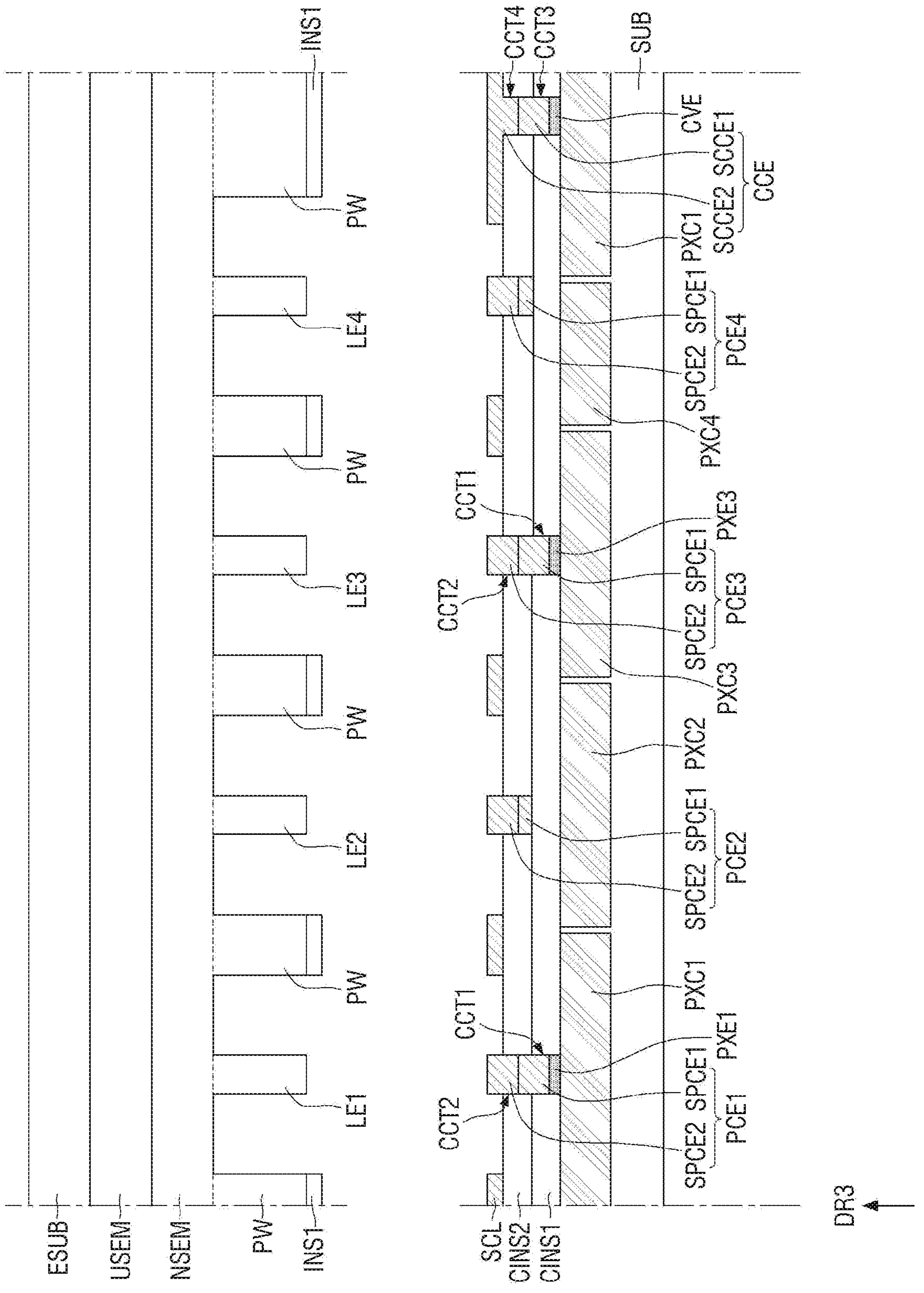

Fifth, referring to FIGS. 19 and 24, pixel connecting electrodes (PCE1, PCE2, PCE3, and PCE4) are formed on pixel electrodes (PXE1, PXE2, PXE3, and PXE4) of the semiconductor circuit board 110, and common connecting electrodes CCE are formed on common voltage electrodes CVE (S150).

A first connecting insulating film CINS1 is formed to cover first, second, third, and fourth pixel electrodes PXE1, PXE2, PXE3, and PXE4, and to cover the common voltage electrodes CVE. The first connecting insulating film CINS1 may be formed as an inorganic film such as a $SiO_2$ film, an $Al_2O_3$ film, or a $HfO_x$ film, but the present disclosure is not limited thereto.

Thereafter, first connecting contact holes CCT1, which expose first, second, third, and fourth pixel electrodes PXE1, PXE2, PXE3, and PXE4, and third connecting contact holes CCT3, which expose the common voltage electrodes CVE, may be formed through the first connecting insulating film CINS1.

Thereafter, first sub-pixel connecting electrodes SPCE1 and first sub-common connecting electrodes SCCE1 are formed on the first connecting insulating film CINS1. The first sub-pixel connecting electrodes SPCE1 may be connected to the first pixel electrodes PXE1, the second pixel electrodes PXE2, the third pixel electrodes PXE3, and the fourth pixel electrodes PXE4 through the first connecting contact holes CCT1. The first sub-common connecting electrodes SCCE1 may be connected to the common voltage electrodes CVE through the third connecting contact holes CCT3.

Thereafter, a second connecting insulating film CINS2 is formed to cover the first sub-pixel connecting electrodes SPCE1 and the first sub-common connecting electrodes SCCE1. The second connecting insulating film CINS2 may be formed as an inorganic film such as a $SiO_2$ film, an $Al_2O_3$ film, or a $HfO_x$ film, but the present disclosure is not limited thereto.

Thereafter, second connecting contact holes CCT2, which expose the first sub-pixel connecting electrodes SPCE1, and fourth connecting contact holes CCT4, which expose the first sub-common connecting electrodes SCCE1, may be formed through the second connecting insulating film CINS2.

Thereafter, second sub-pixel connecting electrodes SPCE2, which are located in the second connecting contact holes CCT2, second sub-common connecting electrodes SCCE2, which are located in the fourth connecting contact holes CCT4, and step compensation layers SCL, which are located on the second connecting insulating film CINS2, are formed. The second sub-pixel connecting electrodes SPCE2 may be connected to the first sub-pixel connecting electrodes SPCE1 through the second connecting contact holes CCT2. The second sub-common connecting electrodes SCCE2 may be connected to the first sub-common connecting electrodes SCCE1 through the fourth connecting contact holes CCT4.

Figure 25:
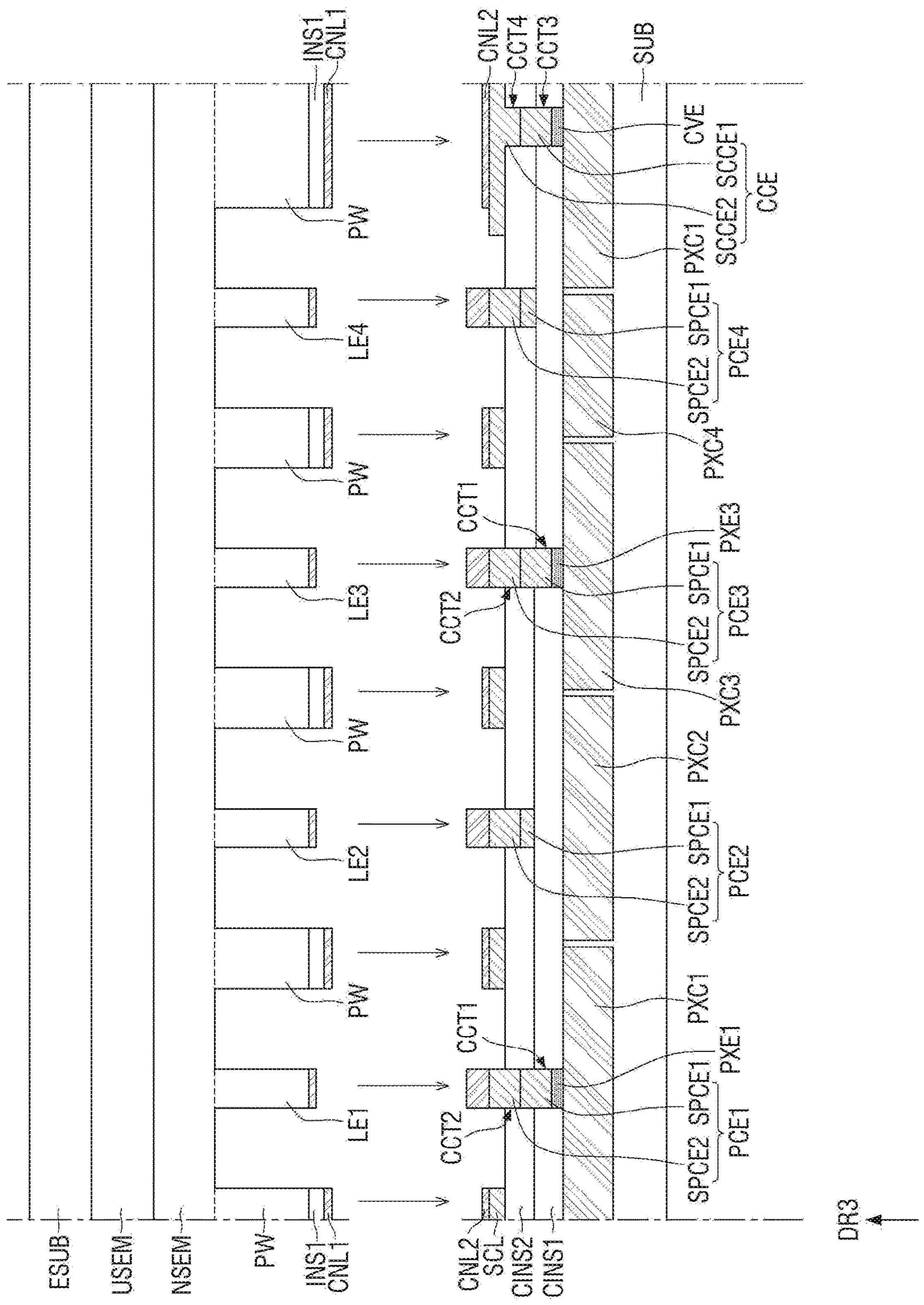

Sixth, referring to FIGS. 19 and 25, first connecting electrode layers CNL1 are formed on light-emitting elements (LE1, LE2, LE3, and LE4), and second connecting electrode layers CNL2 are formed on pixel connecting electrodes (PCE1, PCE2, PCE3, and PCE4) and common connecting electrodes (CCE) (S160).

The first connecting electrodes CNL1 and the second connecting electrode layers CNL2 may be formed by photolithography. The first pixel connecting electrodes CNE1 and the second pixel connecting electrodes CNE2 may include Au, Cu, an alloy of Au and Sn, an alloy of Ag and Sn, or an alloy of Sn, Au, or Cu.

Figure 26:
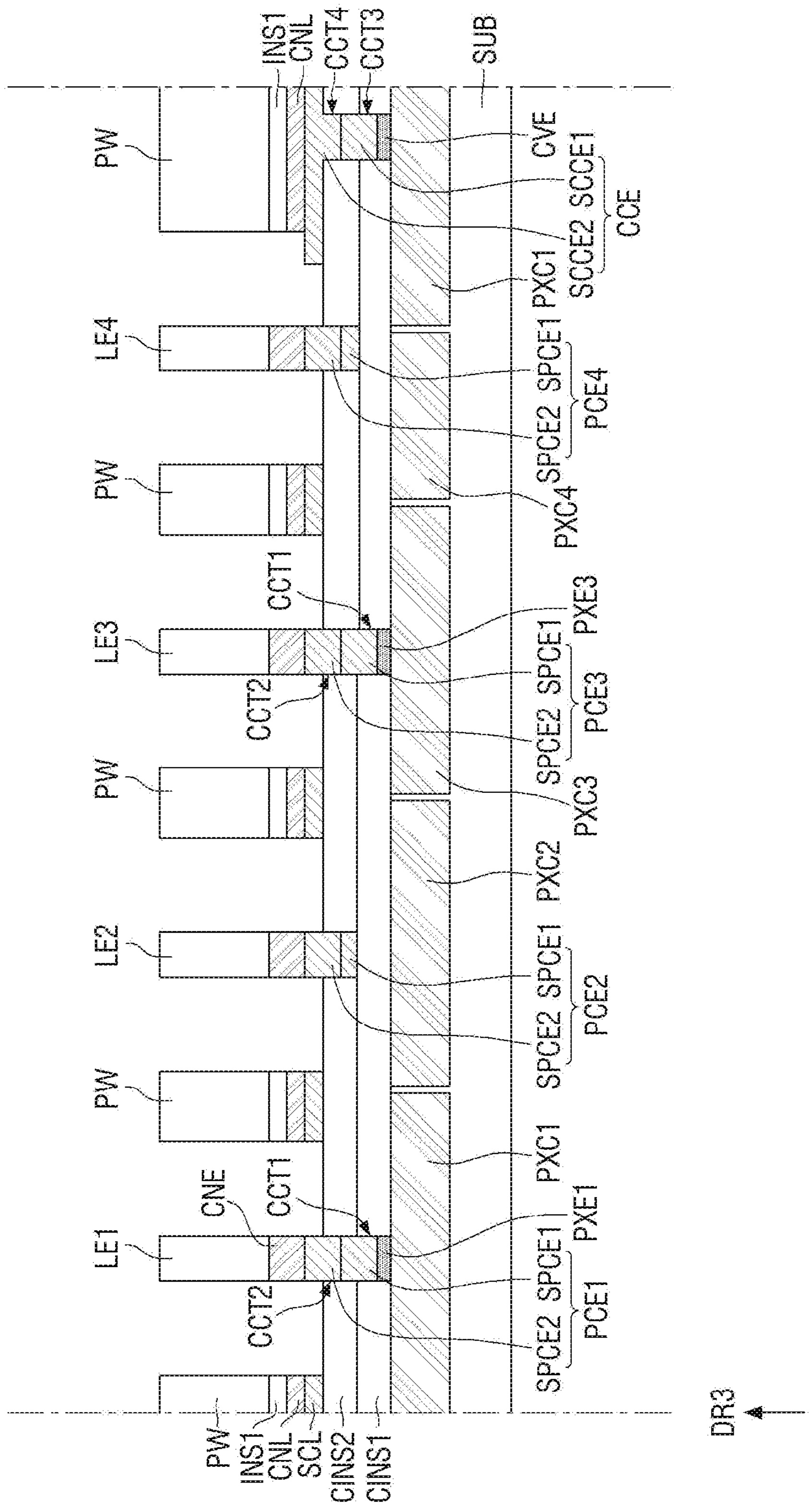

Seventh, referring to FIGS. 19 and 26, a substrate SUB and the light-emitting element substrate ESUB are aligned and are then bonded together by bonding the first connecting electrode layers CNL1 and the second connecting electrode layers CNL2 together (S170).

The first alignment marks may be located at the corners of the semiconductor circuit board 110, and the second alignment marks may be located at the corners of the light-emitting element substrate ESUB. The alignment between the first alignment marks and the second alignment marks may be identified using an alignment camera.

After the alignment of the first alignment marks with the second alignment marks with the use of the alignment camera, the first connecting electrode layers CNL1 may be placed in contact with the second connecting electrode layers CNL2. Thereafter, connecting electrodes CNE and connecting metal layers CNL, which may be formed by melting the first connecting electrode layers CNL1 placed in contact with the second connecting electrode layers CNL2 at a temperature (e.g., a predetermined temperature). That is, the connecting electrodes CNE may function as bonding metal layers for bonding the pixel connecting electrodes (PCE1, PCE2, PCE3, and PCE4) of the semiconductor circuit board 110 and the light-emitting elements (LE1, LE2, LE3, and LE4) of the light-emitting element substrate ESUB.

Thereafter, the light-emitting element substrate ESUB may be removed (S170). The light-emitting element substrate ESUB may be separated from the undoped semiconductor layer USEM by a laser lift-off (LLO) process. Also, the undoped semiconductor layer USEM and the first-type semiconductor layer NSEM may be removed by polishing (such as chemical mechanical polishing (CMP)) or etching.

Figure 27:
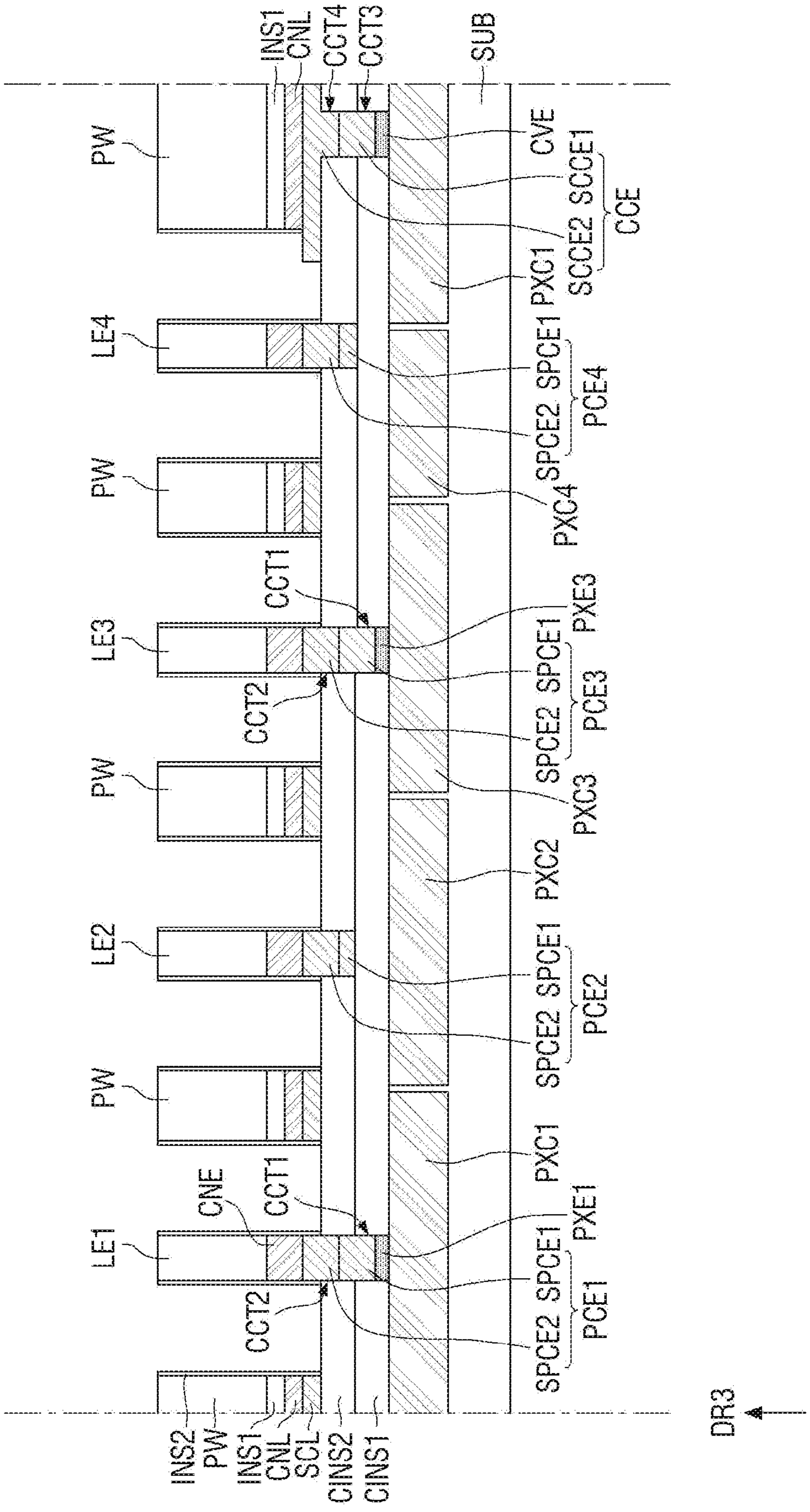

Eighth, referring to FIGS. 19 and 27, second insulating films INS2 are formed on side surfaces of the light-emitting elements (LE1, LE2, LE3, and LE4) and side surfaces of the partition walls PW (S180).

For example, a second insulating layer is deposited to cover the light-emitting elements (LE1, LE2, LE3, and LE4) and the partition walls PW, and is then etched by generating a large voltage difference in a third direction DR3 without the use of an additional mask and using a first etching material. In this case, as the first etching material moves in the third direction DR3 to etch the second insulating layer, parts of the second insulating layer, which are on a horizontal plane defined by first and second directions DR1 and DR2, may be removed, while parts of the second insulating layer that are on a vertical plane defined by the third direction DR3 might not be removed. As a result, the second insulating films INS2 may be located on side surfaces of the second sub-common connecting electrodes SCCE2, side surfaces of the step compensation layers SCL, side surfaces of the connecting metal layers CNL, side surfaces of the first insulating films INS1, side surfaces of the partition walls PW, side surfaces of the second sub-pixel connecting electrodes SPCE2, side surfaces of the connecting electrodes CNE, and side surfaces of the light-emitting elements (LE1, LE2, LE3, and LE4).

The second insulating films INS2 may be formed as inorganic films such as $SiO_2$ films, $Al_2O_3$ films, or $HfO_x$ films. The thickness of the second insulating films INS2 may be about 0.1 μm.

Figure 28:
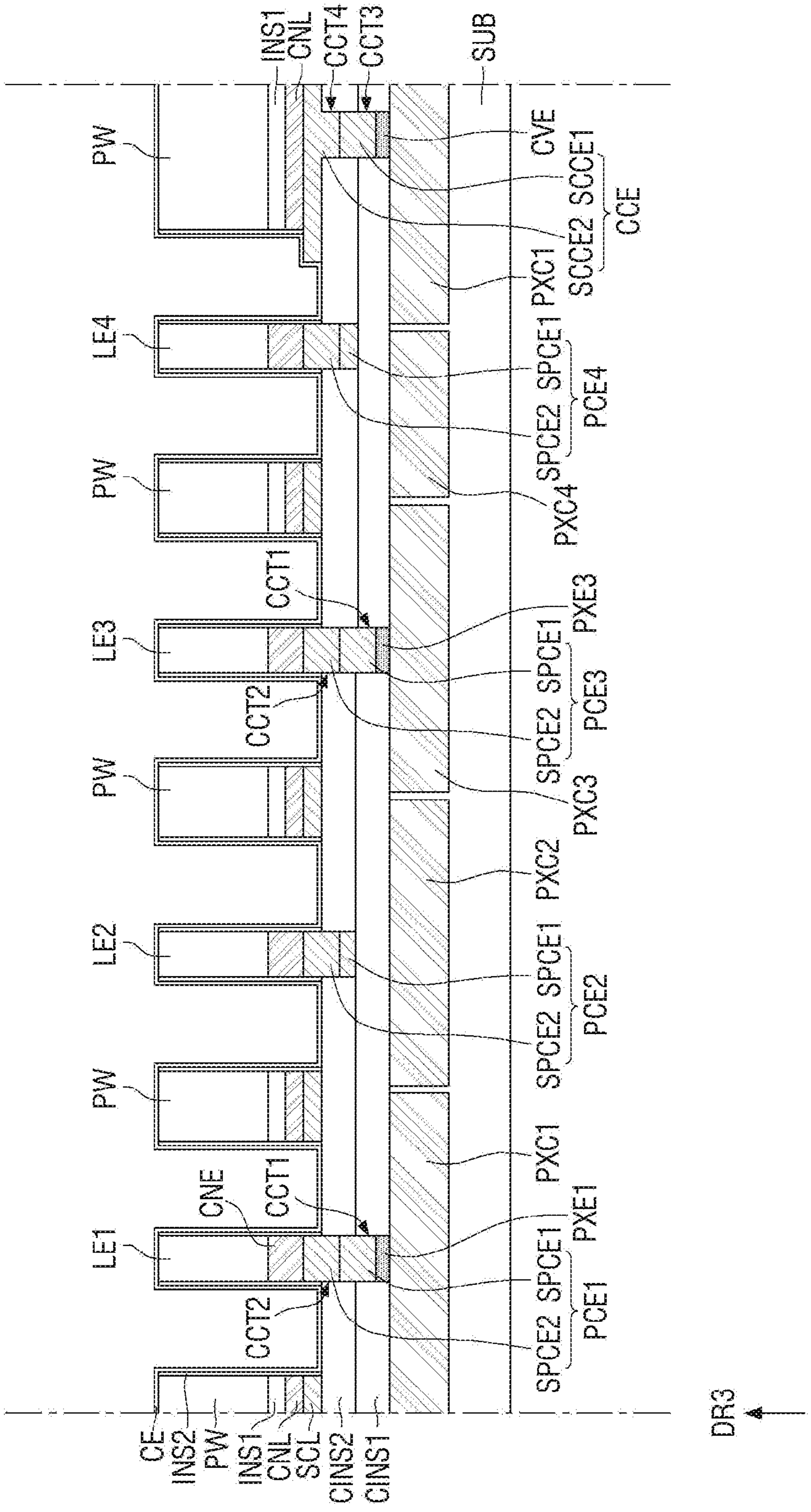

Ninth, referring to FIGS. 19 and 28, a common electrode CE is formed on the top surfaces and the side surfaces of the light-emitting elements (LE1, LE2, LE3, and LE4) and the top surfaces and the side surfaces of the partition walls PW (S190).

The common electrode CE may be located on the top surfaces of the light-emitting elements (LE1, LE2, LE3, and LE4), the top surfaces of the second sub-common connecting electrodes SCCE2, and the second insulating films INS2. The common electrode CE may be in contact with the top surfaces of the light-emitting elements (LE1, LE2, LE3, and LE4) and the top surfaces of the partition walls PW. The common electrode CE may be in contact with the second insulating films INS2, on the side surfaces of the second sub-common connecting electrodes SCCE2, the side surfaces of the step compensation layers SCL, the side surfaces of the connecting metal layers CNL, the side surfaces of the first insulating films INS1, the side surfaces of the partition walls PW, the side surfaces of the second sub-pixel connecting electrodes SPCE2, the side surfaces of the connecting electrodes CNE, and the side surfaces of the light-emitting elements (LE1, LE2, LE3, and LE4). The common electrode CE may be in contact with parts of the second sub-common connecting electrodes SCCE2, which are not covered, but exposed by the first insulating films INS1 and the partition walls PW.

The common electrode CE may include a transparent conductive material. The common electrode CE may be formed of a TCO such as ITO or IZO. The thickness of the common electrode CE may be about 0.1 μm.

Figure 29:
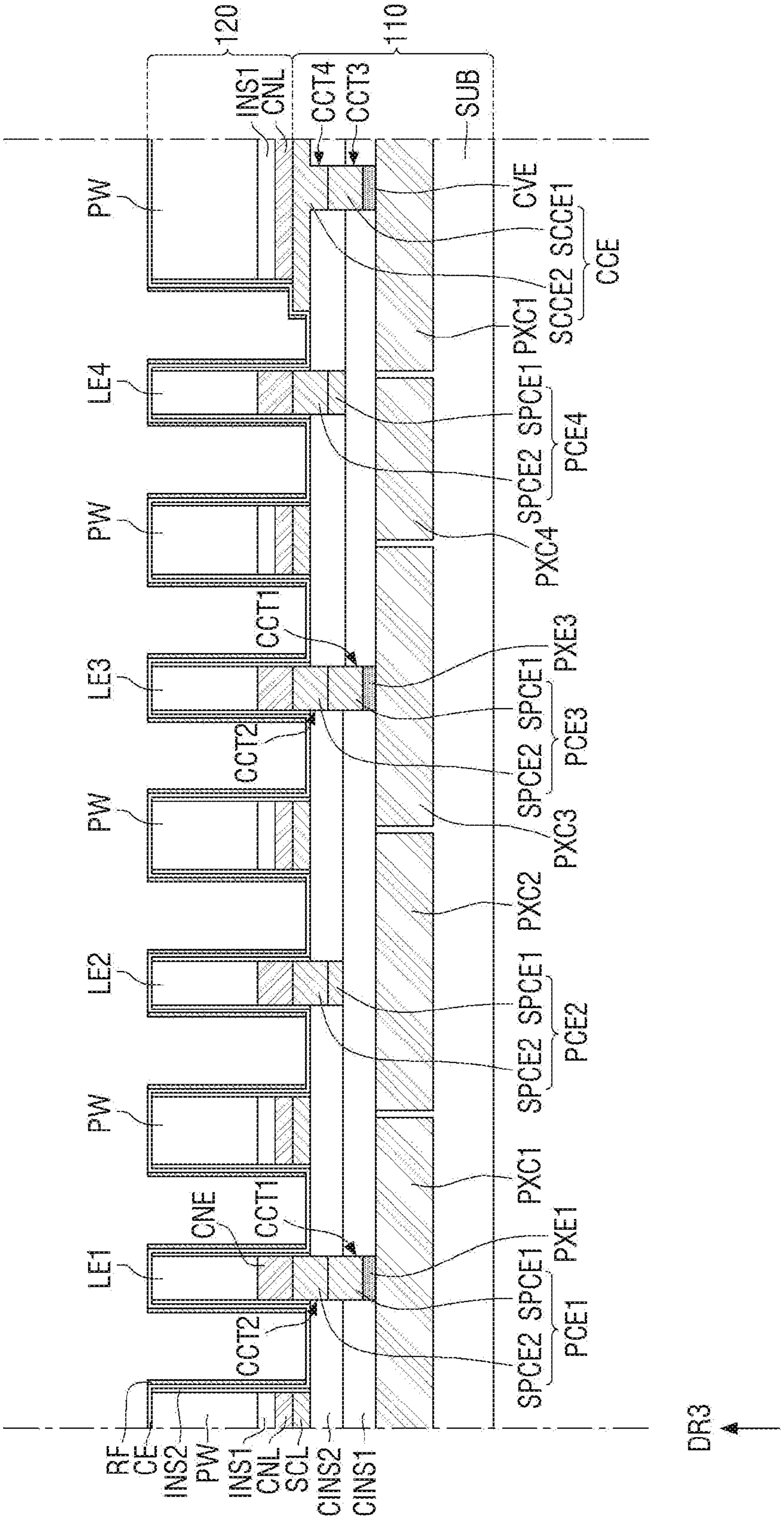

Tenth, referring to FIGS. 19 and 29, reflective films RF are formed on the side surfaces of the light-emitting elements (LE1, LE2, LE3, and LE4) and the side surfaces of the partition walls PW (S200).

A reflective layer is deposited to cover the light-emitting elements (LE1, LE2, LE3, and LE4) and the partition walls PW, and is then etched by generating a large voltage difference in the third direction DR3 without the use of an additional mask and using a second etching material. In this case, as the second etching material moves in the third direction DR3 to etch the reflective layer, parts of the reflective layer that are on the horizontal plane defined by the first and second directions DR1 and DR2 may be removed, but parts of the reflective layer that are on the vertical plane defined by the third direction DR3 may not be removed. As a result, the reflective films RF may be located on the common electrode CE, on the side surfaces of the second sub-common connecting electrodes SCCE2, the side surfaces of the step compensation layers SCL, the side surfaces of the connecting metal layers CNL, the side surfaces of the first insulating films INS1, the side surfaces of the partition walls PW, the side surfaces of the second sub-pixel connecting electrodes SPCE2, the side surfaces of the connecting electrodes CNE, and the side surfaces of the light-emitting elements (LE1, LE2, LE3, and LE4). That is, the reflective films RF may be in contact with the common electrode CE on the side surfaces of the second sub-common connecting electrodes SCCE2, the side surfaces of the step compensation layers SCL, the side surfaces of the connecting metal layers CNL, the side surfaces of the first insulating films INS1, the side surfaces of the partition walls PW, the side surfaces of the second sub-pixel connecting electrodes SPCE2, the side surfaces of the connecting electrodes CNE, and the side surfaces of the light-emitting elements (LE1, LE2, LE3, and LE4).

The reflective films RF may include a metallic material with high reflectance such as Al or Ag. In this case, the thickness of the reflective films RF may be about 0.1 μm, but the present disclosure is not limited thereto.

Figure 30:
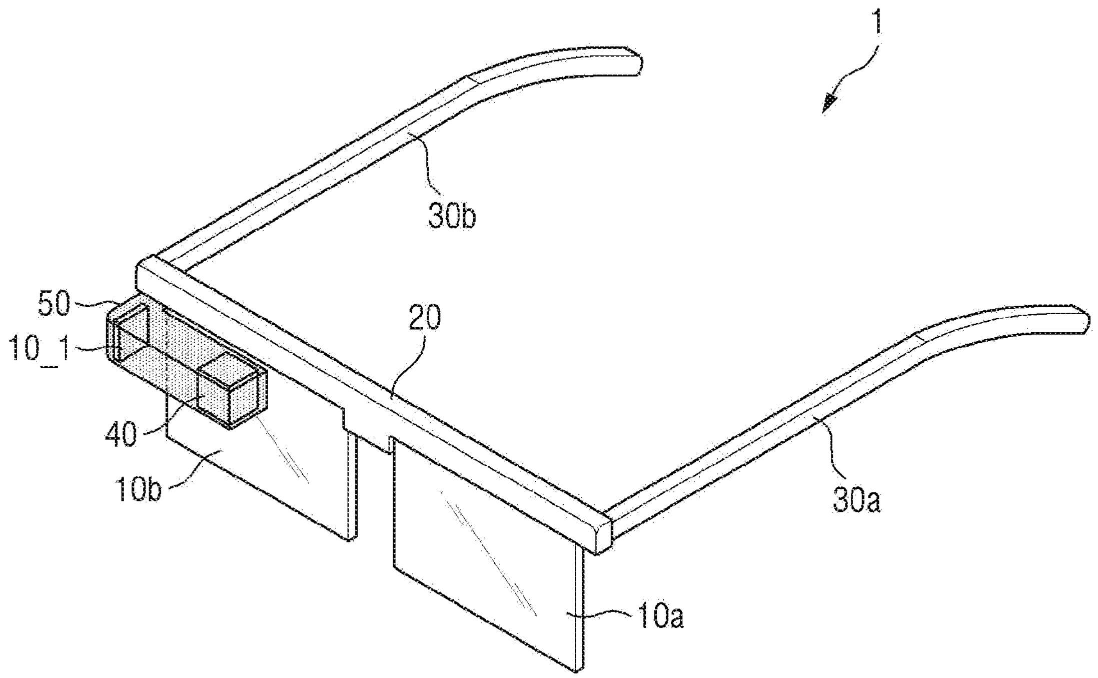
FIG. 30 is a perspective view of a virtual reality (VR) device a display device according to some embodiments of the present disclosure.

FIG. 30 is a perspective view of a virtual reality (VR) device a display device according to some embodiments of the present disclosure. FIG. 30 illustrates a VR device 1, to which a display device 10 is applied.

Referring to FIG. 30, the VR device 1 may be an eyeglass-type device. The VR device 1 may include the display device 10, a left-eye lens 10*a*, a right-eye lens 10*b*, a support frame 20, eyeglass temples 30*a* and 30*b*, a reflective member 40, and a display device storage compartment 50.

FIG. 30 illustrates the VR device 1 including the eyeglass temples 30*a* and 30*b*, but the VR device 1 may also be applicable to a head-mounted display (HMD) including a headband that can be worn on the head, instead of the eyeglass temples 30*a* and 30*b*. That is, the VR device 1 is not particularly limited to that illustrated in FIG. 30 and may be applicable to various types of electronic devices.

The display device storage compartment 50 may include the display device 10 and the reflective member 40. An image displayed by the display device 10 may be reflected by the reflective member 40 and may thus be provided to the right eye of a user through the right-eye lens 10*b*. Thus, the user may view a VR image, displayed by the display device 10, through his or her right eye.

FIG. 30 illustrates that the display device storage compartment 50 is located at the right end of the support frame 20, but the present disclosure is not limited thereto. Alternatively, the display device storage compartment 50 may be located at the left end of the support frame 20, in which case, an image displayed by the display device 10 may be reflected by the reflective member 40 and may thus be provided to the right eye of the user through the left-eye lens 10*a*. Yet alternatively, two display device storage compartments 50 may be located at both the left and right ends of the support frame 20, in which case, the user may view a VR image, displayed by the display device 10, through both his or her left and right eyes.

Figure 31:
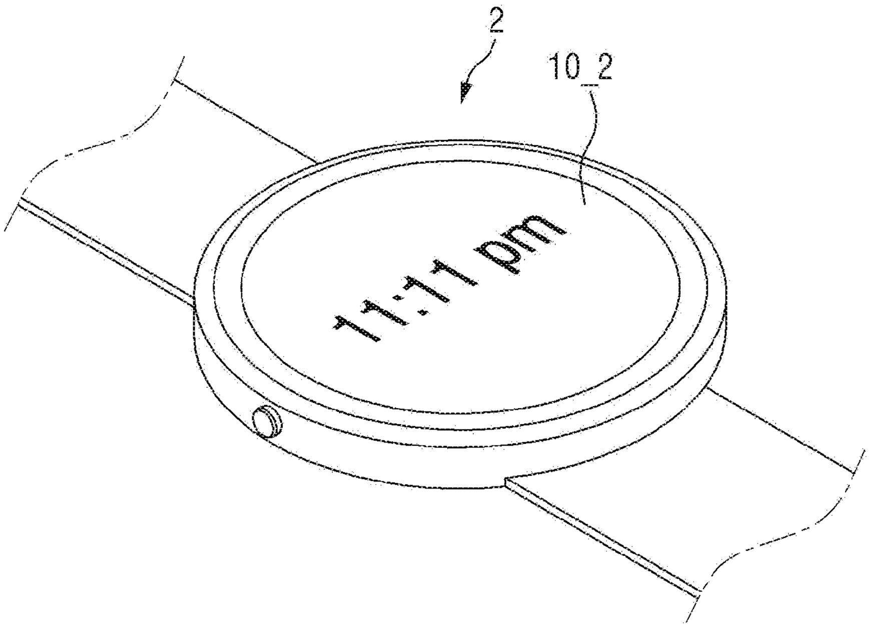
FIG. 31 is a perspective view of a smart device including a display device according to some embodiments of the present disclosure.

FIG. 31 is a perspective view of a smart device including a display device according to some embodiments of the present disclosure.

Referring to FIG. 31, a display device 10 may be applied to a smartwatch 2, which is a type of smart device.

Figure 32:
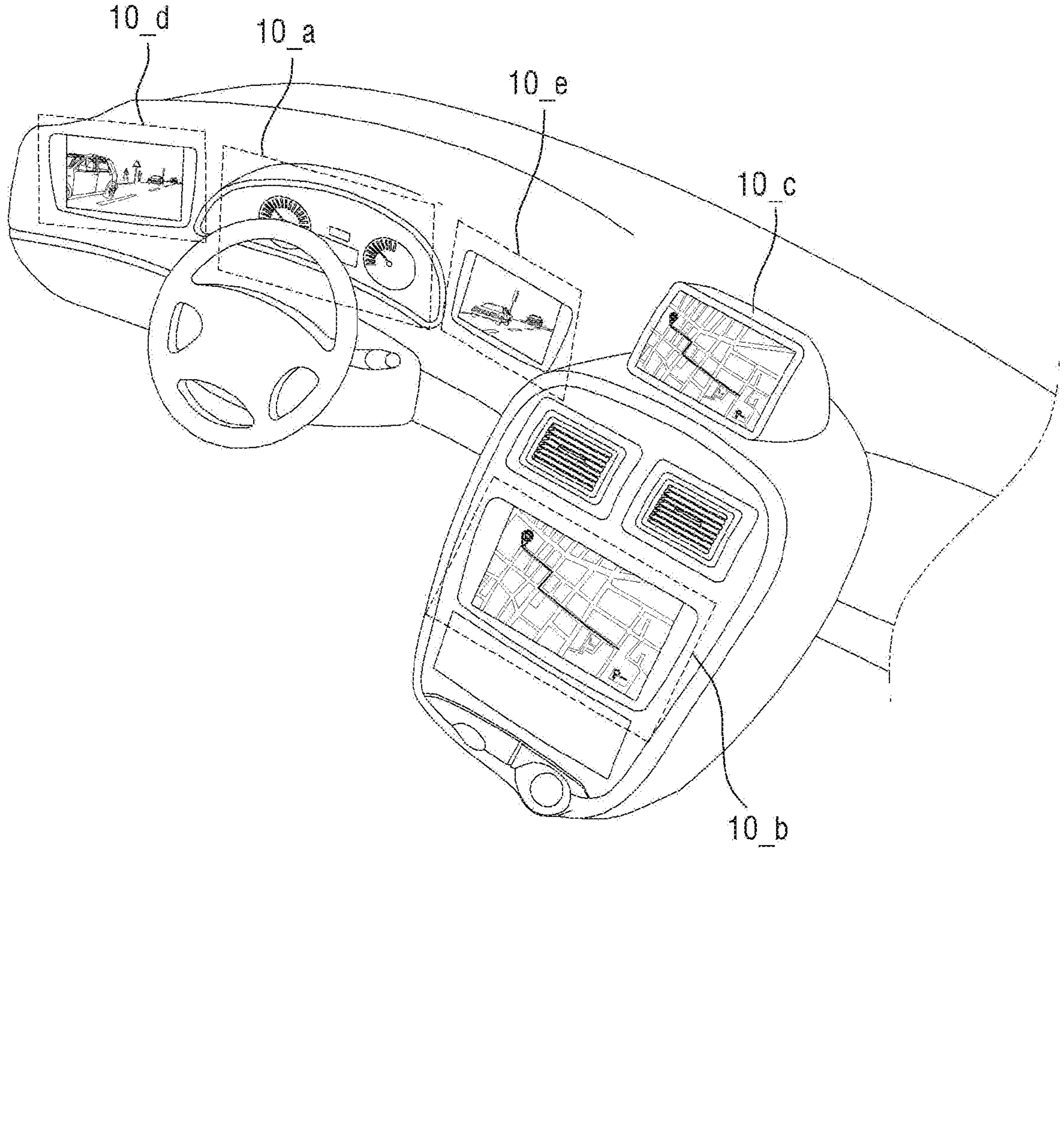
FIG. 32 is a perspective view of a dashboard and a center console of an automobile including display devices according to some embodiments of the present disclosure.

FIG. 32 is a perspective view of a dashboard and a center console of an automobile including display devices according to some embodiments of the present disclosure. FIG. 32 illustrates an automobile, to which display devices 10_*a*, 10_*b*, 10_*c*, 10_*d*, and 10_*e* are applied.

Referring to FIG. 32, the display devices 10_*a*, 10_*b*, and 10_*c* may be applied to the dashboard or center console of an automobile or to a center information display (CID) in the dashboard of an automobile. The display devices 10_*d* and 10_*e* may be applied to room mirror displays that can replace the rear view mirrors of an automobile.

Figure 33:
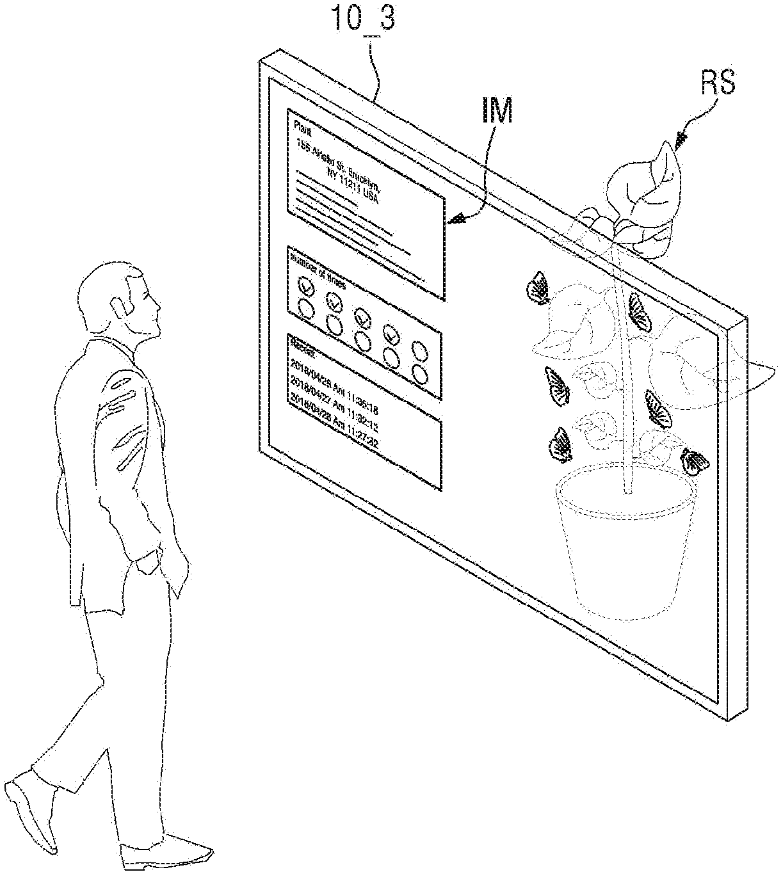
FIG. 33 is a transparent display device including a display device according to some embodiments of the present disclosure.

FIG. 33 is a transparent display device including a display device according to some embodiments of the present disclosure.

Referring to FIG. 33, a display device 10 may be applied to a transparent display device. The transparent display device may display an image IM and at the same time, transmit light therethrough. Thus, a user at the front of the transparent display device may view not only the image IM on the display device 10, but also an object RS or the background at the rear of the transparent display device. In a case where the display device 10 is applied to the transparent display device, the substrate (SUB of FIG. 5) of the display device 10 may include light-transmitting parts capable of transmitting light therethrough or may be formed of a material capable of transmitting light therethrough.

However, the aspects and features of embodiments of the present disclosure are not restricted to the one set forth herein. The above and other aspects and features of embodiments of the present disclosure will become more apparent to one of daily skill in the art to which the present disclosure pertains by referencing the claims, with functional equivalents thereof to be included therein.

What is claimed is:

1. A display device comprising:
- a first pixel circuit unit and a second pixel circuit unit spaced apart from each other;
- a first pixel electrode on the first pixel circuit unit;
- a second pixel electrode on the second pixel circuit unit;
- a first single light-emitting element electrically connected to the first pixel electrode, and for emitting first light;
- a second single light-emitting element electrically connected to the second pixel electrode, and for emitting second light;
- a first pixel connecting electrode between the first pixel electrode and the first light-emitting element;
- a second pixel connecting electrode between the second pixel electrode and the second light-emitting element;
- a common connecting electrode configured to receive a common voltage;
- a partition wall on the common connecting electrode, and at least partially defining a first emission area in which the first light-emitting element is located, and a second emission area in which the second light-emitting element is located; and
- a connecting metal layer between the partition wall and the common connecting electrode,
- wherein the first pixel electrode overlaps with the first light-emitting element,
- wherein the second pixel electrode does not overlap with the second light-emitting element,
- wherein the first pixel connecting electrode and the second pixel connecting electrode are in contact with an upper surface of a first insulating film, and
- wherein the first pixel connecting electrode is connected to the first pixel electrode via a first contact hole penetrating the first insulating film.

2. The display device of claim 1, wherein a length of the second pixel connecting electrode is greater than a length of the first pixel connecting electrode.

3. The display device of claim 1, wherein the first pixel connecting electrode comprises:
- a first sub-pixel connecting electrode in the first contact hole, and connected to the first pixel electrode; and
- a second sub-pixel connecting electrode on the first sub-pixel connecting electrode, and in a second contact hole penetrating a second insulating film on the first insulating film.

4. The display device of claim 3, wherein the first sub-pixel connecting electrode and the second sub-pixel connecting electrode overlap with the first light-emitting element.

5. The display device of claim 1, wherein the second pixel connecting electrode comprises:
- a first sub-pixel connecting electrode in the first contact hole, and connected to the second pixel electrode; and
- a second sub-pixel connecting electrode on the first sub-pixel connecting electrode, and in a second contact hole penetrating a second insulating film on the first insulating film.

6. The display device of claim 5, wherein a portion of the first sub-pixel connecting electrode does not overlap with the second light-emitting element, and
- wherein a portion of the second sub-pixel connecting electrode overlaps with the second light-emitting element.

7. The display device of claim 1, further comprising: a common electrode on the first and second light-emitting elements; and
- a common voltage electrode on at least one of the first or second pixel circuit units, and configured to transmit the common voltage to the common connecting electrode,
- wherein the common connecting electrode electrically connects the common voltage electrode to the common electrode.

8. The display device of claim 7, wherein the common connecting electrode comprises:
- a first sub-common connecting electrode in the first contact hole, and connected to the common voltage electrode; and
- a second sub-common connecting electrode on the first sub-common connecting electrode, and in a second contact hole penetrating a second insulating film on the first insulating film.

9. The display device of claim 8, wherein the partition wall is on the second sub-common connecting electrode, and
- wherein the connecting metal layer is between the partition wall and the second sub-common connecting electrode.

10. The display device of claim 9, wherein a horizontal width of the connecting metal layer is less than a horizontal width of the second sub-common connecting electrode.

11. The display device of claim 9, wherein the common electrode is in contact with part of a top surface of the second sub-common connecting electrode not covered by the connecting metal layer.

12. The display device of claim 7, wherein the common connecting electrode does not overlap with the first light-emitting element or the second light-emitting element.

13. A display device comprising:
- a first pixel circuit unit and a second pixel circuit unit spaced apart from each other;
- a first pixel electrode on the first pixel circuit unit;
- a second pixel electrode on the second pixel circuit unit;
- a first single light-emitting element electrically connected to the first pixel electrode, overlapping the first pixel electrode, and configured to emit first light;
- a second single light-emitting element electrically connected to the second pixel electrode, not overlapping the second pixel electrode, and configured to emit second light;
- a first pixel connecting electrode between the first pixel electrode and the first light-emitting element;
- a second pixel connecting electrode between the second pixel electrode and the second light-emitting element, and comprising:
  - a first sub-pixel connecting electrode in a first contact hole penetrating a first insulating film, having a portion not overlapping with the second light-emitting element, and connected to the second pixel electrode; and a second sub-pixel connecting electrode on the first sub-pixel connecting electrode, in a second contact hole penetrating a second insulating film on the first insulating film, and having a portion overlapping with the second light-emitting element; and a step compensation layer on the second insulating film, and comprising a same material as the second sub-pixel connecting electrode.

14. The display device of claim 13, further comprising a partition walls on the step compensation layer, and defining a first emission area in which the first light-emitting element is located, and a second emission area in which the second light-emitting element is located.

15. The display device of claim 14, further comprising:

a connecting metal layer between the step compensation layer and the partition walls;

an insulating film between the connecting metal layer and the partition walls; and a connecting electrode between the first light-emitting element and the second sub-pixel connecting electrode.

16. The display device of claim 15, wherein a thickness of the connecting electrode is greater than a thickness of the connecting metal layer.

17. A display device comprising:

a first pixel circuit unit and a second pixel circuit unit spaced apart from each other;

a first pixel electrode on the first pixel circuit unit;

a second pixel electrode on the second pixel circuit unit;

a first single light-emitting element electrically connected to the first pixel electrode, and configured to emit first light;

a second single light-emitting element electrically connected to the second pixel electrode, and configured to emit second light;

a common electrode on the first light-emitting element and the second light-emitting element;

a common voltage electrode on at least one of the first pixel circuit unit or the second pixel circuit unit, overlapping the second light emitting element, and configured to receive a common voltage; and a common connecting electrode between the common voltage electrode and the common electrode.

18. The display device of claim 17, wherein the common connecting electrode comprises:

a first sub-common connecting electrode in a first contact hole penetrating a first insulating film, and connected to the common voltage electrode; and a second sub-common connecting electrode on the first sub-common connecting electrode, and in a second contact hole penetrating a second insulating film on the first insulating film.

19. The display device of claim 17, wherein the common connecting electrode does not overlap with the first light-emitting element or the second light-emitting element.

* * * * *